(12) United States Patent
Fuji et al.

(10) Patent No.: US 8,057,983 B2
(45) Date of Patent: Nov. 15, 2011

(54) CHEMICALLY AMPLIFIED POSITIVE RESIST COMPOSITION

(75) Inventors: Yusuke Fuji, Ibaraki (JP); Junji Shigematsu, Ibaraki (JP); Takayuki Miyagawa, Toyonaka (JP); Nobuo Ando, Toyonaka (JP); Ichiki Takemoto, Kawanishi (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 136 days.

(21) Appl. No.: 12/425,942

(22) Filed: Apr. 17, 2009

(65) Prior Publication Data

US 2009/0269695 A1  Oct. 29, 2009

(30) Foreign Application Priority Data

Apr. 21, 2008  (JP) ................... 2008-110430

(51) Int. Cl.
*G03F 7/004* (2006.01)
(52) U.S. Cl. ............... 430/270.1; 430/907; 430/910
(58) Field of Classification Search ............... 430/270.1, 430/907, 910
See application file for complete search history.

(56) References Cited

U.S. PATENT DOCUMENTS

| 6,593,058 | B1 | 7/2003 | Feiring et al. |
| 6,790,587 | B1 | 9/2004 | Feiring et al. |
| 2003/0078352 | A1 | 4/2003 | Miyazawa et al. |
| 2003/0224283 | A1 | 12/2003 | Allen et al. |
| 2004/0175645 | A1 | 9/2004 | Sasaki et al. |
| 2007/0218401 | A1* | 9/2007 | Ando et al. ................ 430/270.1 |
| 2007/0254235 | A1 | 11/2007 | Allen et al. |
| 2009/0263742 | A1 | 10/2009 | Fuji et al. |

FOREIGN PATENT DOCUMENTS

| JP | 2005-266767 A | 9/2005 |
| JP | 2005-284238 A | 10/2005 |

OTHER PUBLICATIONS

C.V. Peski et al., "Film Pulling and Meniscus Instability as a Cause of Residual Fluid Droplets", pp. 1-45, Sep. 2005, 2nd International Symposium on Immersion Lithography, Computational Mechanics Center University of Wisconsin-Madison.
D. Gil et al., "The Role of Evaportion in Defect Formation in Immersion Lithography", pp. 1-25, Sep. 13, 2005, 2nd International Symposium on Immersion Lithography, Bruges, Belgium.
K. Nakano et al., "Defectivity Data Taken With a Full-Field Immersion Exposure Tool", pp. 1-27, Sep. 13, 2005, 2nd International Symposium on Immersion Lithography.

* cited by examiner

*Primary Examiner* — John Chu
(74) *Attorney, Agent, or Firm* — Birch, Stewart, Kolasch & Birch, LLP

(57) ABSTRACT

The present invention provides a chemically amplified resist composition comprising:
  a resin (A) which contains no fluorine atom and a structural unit (a1) having an acid-labile group in a side chain,
  a resin (B) which contains a structural unit (b2) having a fluorine-containing group in a side chain and at least one structural unit selected from the group consisting of a structural unit (b1) having an acid-labile group, a structural unit (b3) having a hydroxyl group and a structural unit (b4) having a lactone structure in a side chain, and
  an acid generator, wherein the amount of the resin (B) is 2 parts by weight or less per 100 parts by weight of the resin (A).

13 Claims, No Drawings

CHEMICALLY AMPLIFIED POSITIVE RESIST COMPOSITION

This nonprovisional application claims priority under 35 U.S.C. §119(a) on Patent Application No. 2008-110430 filed in JAPAN on Apr. 21, 2008, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication.

In semiconductor microfabrication, especially, in liquid immersion lithography process, it is desirable to suppress the formation of defect.

It has been known that one of big problems in liquid immersion lithography process is defect caused by residual fluid droplets on the resist film (e.g. C. V. Peski et al., "Film pulling and meniscus instability as a cause of residual fluid droplets", Presentation at the 2nd International Symposium on Immersion Lithography, September, 2005, and D. Gil et al., "The Role of Evaporation in Defect Formation in Immersion Lithography", Presentation at the 2nd International Symposium on Immersion Lithography, September, 2005). The defect is the specific one in liquid immersion lithography and the defect is formed by conducting post-exposure baking of the resist film on which fluid droplets was remained.

It has been known that number of the defect caused by residual fluid droplets on the resist film is associated with the receding contact angle of the resist film and it is possible to suppress the formation of the defect caused by residual fluid droplets on the resist film by using the resist composition forming the resist film having higher receding contact angle (e.g. K. Nakano et al., "Defectivity data taken with a full-field immersion exposure tool", Presentation at the 2nd International Symposium on Immersion Lithography, September, 2005).

US 2007/0218401 A1 discloses a chemically amplified resist composition comprising: a resin (A) which contains no fluorine atom and a structural unit (a1) having an acid-labile group in a side chain, a resin (B) which contains a structural unit (b2) having a fluorine-containing group in a side chain and at least one structural unit selected from the group consisting of a structural unit (b1) having an acid-labile group, a structural unit (b3) having a hydroxyl group and a structural unit (b4) having a lactone structure in a side chain, and an acid generator. US 2007/0218401 A1 also discloses that the amount of the resin (B) is 2.04 parts by weight per 100 parts by weight of the resin (A).

SUMMARY OF THE INVENTION

The present invention is to provide a novel chemically amplified positive resist composition suitable for liquid immersion lithography process, showing excellent various resist abilities, giving good pattern profile, forming the resist film having higher receding contact angle, and having good solubility in a developing solution.

The present invention relates to the followings:

<1> A chemically amplified positive resist composition comprising:

a resin (A) which contains no fluorine atom and a structural unit (a1) having an acid-labile group in a side chain, a resin (B) which contains a structural unit (b2) having a fluorine-containing group in a side chain and at least one structural unit selected from the group consisting of a structural unit (b1) having an acid-labile group, a structural unit (b3) having a hydroxyl group and a structural unit (b4) having a lactone structure in a side chain, and an acid generator, wherein the amount of the resin (B) is 2 parts by weight or less per 100 parts by weight of the resin (A);

<2> The chemically amplified positive resist composition according to <1>, wherein the amount of the resin (B) is 0.005 part by weight or more and 2 parts by weight or less per 100 parts by weight of the resin (A);

<3> The chemically amplified positive resist composition according to <1> or <2>, wherein the resin (A) contains at least one structural unit selected from the group consisting of a structural unit (a3) having a hydroxyl group and a structural unit (a4) having a lactone structure in addition to the structural unit (a1);

<4> The chemically amplified positive resist composition according to any one of <1> to <3>, wherein the resin (A) contains the structural unit (a3) and the structural unit (a4) in addition to the structural unit (a1);

<5> The chemically amplified positive resist composition according to any one of <1> to <4>, wherein the resin (B) contains the structural unit (b1) in addition to the structural unit (b2);

<6> The chemically amplified positive resist composition according to any one of <1> to <5>, wherein the structural units (a1) and (b1) independently represent a structural unit represented by the formula (Ia):

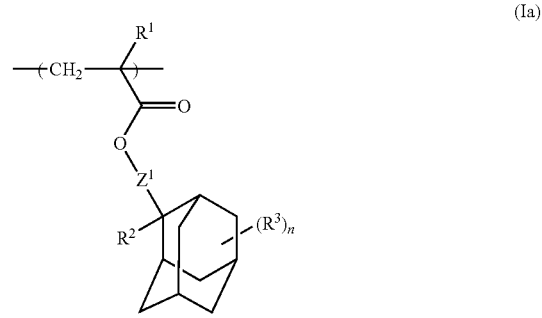

wherein $R^1$ represents a hydrogen atom or a methyl group, $R^2$ represents a C1-C8 alkyl group, $R^3$ represents a methyl group, n represents an integer of 0 to 14, $Z^1$ represents a single bond or a $—(CH_2)_k—COO—$ group, and k represents an integer of 1 to 4, or a structural unit represented by the formula (Ib):

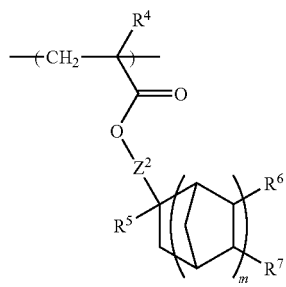
(Ib)

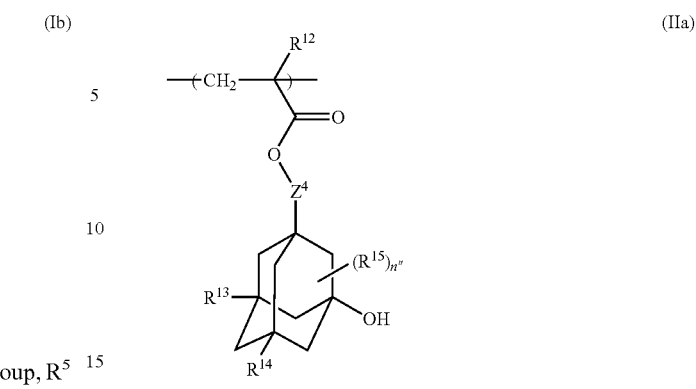
(IIa)

wherein $R^4$ represents a hydrogen atom or a methyl group, $R^5$ represents a C1-C8 alkyl group, $R^6$ and $R^7$ each independently represents a hydrogen atom or a monovalent C1-C8 hydrocarbon group which may contain at least one heteroatom, $R^6$ and $R^7$ may be bonded each other to form a ring together with the carbon atom to which $R^6$ is bonded and the carbon atom to which $R^7$ is bonded, or $R^6$ and $R^7$ may be bonded each other to form a double bond between the carbon atom to which $R^6$ is bonded and the carbon atom to which $R^7$ is bonded, m represents an integer of 1 to 3, $Z^2$ represents a single bond or a —$(CH_2)_{k'}$—COO— group, and k' represents an integer of 1 to 4;

<7> The chemically amplified positive resist composition according to any one of <1> to <6>, wherein the structural unit (b3) represents a structural unit represented by the formula (IIb):

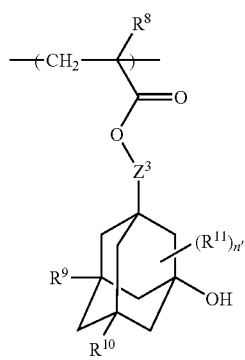
(IIb)

wherein $R^8$ represents a hydrogen atom or a methyl group, $R^9$ and $R^{10}$ each independently represents a hydrogen atom, a methyl group or a hydroxyl group, $R^{11}$ represents a methyl group, n' represents an integer of 0 to 12, $Z^3$ represents a single bond or a —$(CH_2)_q$—COO— group, and q represents an integer of 1 to 4;

<8> The chemically amplified positive resist composition according to any one of <3> to <7>, wherein the structural unit (a3) represents a structural unit represented by the formula (IIa):

wherein $R^{12}$ represents a hydrogen atom or a methyl group, $R^{13}$ and $R^{14}$ each independently represents a hydrogen atom, a methyl group or a hydroxyl group, $R^{15}$ represents a methyl group, n" represents an integer of 0 to 12, $Z^4$ represents a single bond or a —$(CH_2)_{q'}$—COO— group, and q' represents an integer of 1 to 4;

<9> The chemically amplified positive resist composition according to any one of <1> to <8>, wherein the structural unit (b4) represents a structural unit represented by the formula (IIIa), (IIIb), (IIIc), (IIId), (IIIe) or (IIIf):

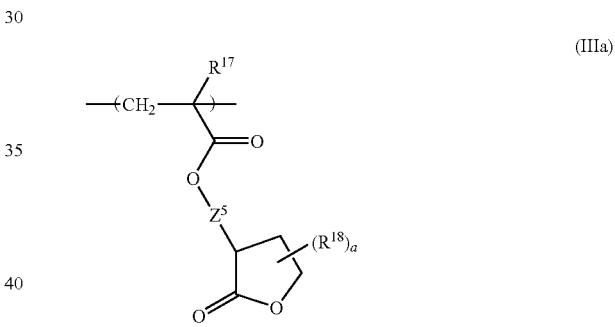
(IIIa)

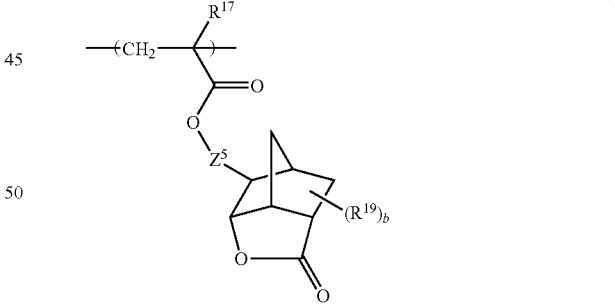
(IIIb)

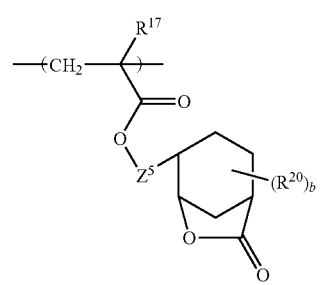
(IIIc)

-continued (IIId)
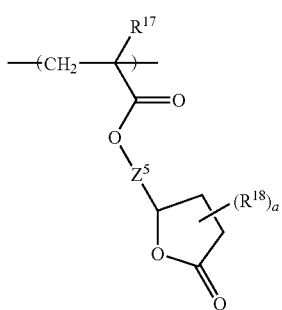

(IIIe)
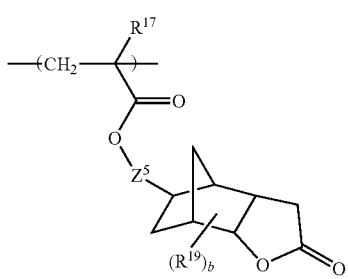

(IIIf)
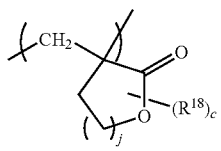

wherein R$^{17}$ represents a hydrogen atom or a methyl group, R$^{18}$ represents a methyl group, R$^{19}$ is independently in each occurrence a carboxyl group, a cyano group or a C1-C4 hydrocarbon group, R$^{20}$ is independently in each occurrence a carboxyl group, a cyano group or a C1-C4 hydrocarbon group, j represents an integer of 0 to 3, a represents an integer of 0 to 5, b represents an integer of 0 to 3, c represents an integer of 0 to (2j+2), Z$^5$ represents a single bond or a —(CH$_2$)$_{q''}$—COO— group, and q" represents an integer of 1 to 4;

<10> The chemically amplified positive resist composition according to any one of <3> to <9>, wherein the structural unit (a4) represents a structural unit represented by the formula (IIIg), (IIIh), (IIIi), (IIIj), (IIIk) or (IIIl):

(IIIg)
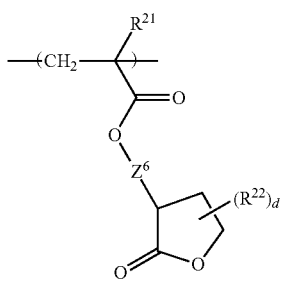

(IIIh)
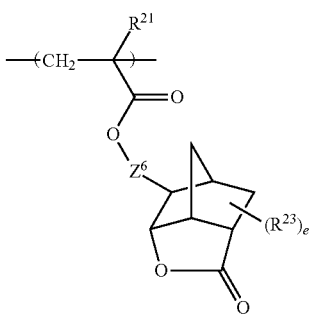

(IIIi)
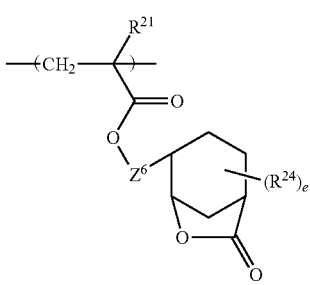

(IIIj)
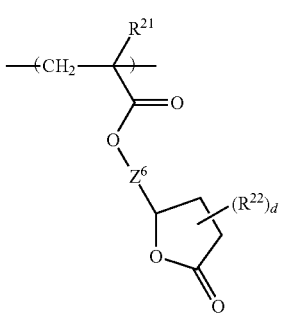

(IIIk)
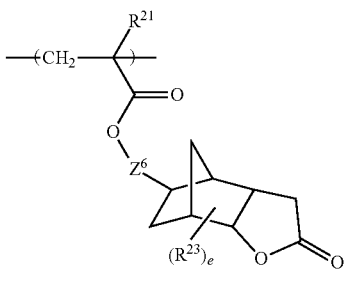

(IIIl)
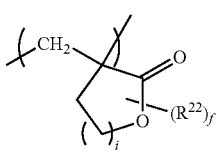

wherein R$^{21}$ represents a hydrogen atom or a methyl group, R$^{22}$ represents a methyl group, R$^{23}$ is independently in each occurrence a carboxyl group, a cyano group or a C1-C4 hydrocarbon group, R$^{24}$ is independently in each occurrence a carboxyl group, a cyano group or a C1-C4 hydrocarbon group, i represents an integer of 0 to 3, d represents an integer of 0 to 5, e represents an integer of 0 to 3, f represents an integer of 0 to (2i+2), Z$^6$ represents a single bond or a —(CH$_2$)$_{q'''}$—COO— group, and q'" represents an integer of 1 to 4;

<11> The chemically amplified positive resist composition according to any one of <1> to <10>, wherein the structural unit (b2) represents a structural unit represented by the formula (IV):

wherein $R^{25}$ represents a hydrogen atom or a methyl group, and AR represents a C1-C30 fluorine-containing alkyl group which may contain one to five hydroxyl groups and at least one heteroatom selected from the group consisting of a oxygen atom, a nitrogen atom and a sulfur atom;
<12> The chemically amplified positive resist composition according to any one of <1> to <11>, wherein the acid generator is a salt represented by the formula (V):

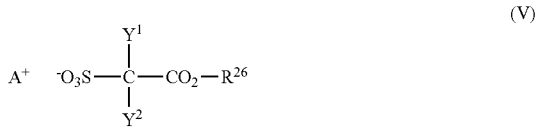

wherein $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy group, a C1-C4 perfluoroalkyl group, a C1-C6 hydroxyalkyl group, a hydroxyl group, a cyano group, a carbonyl group or an ester group, or at least one —$CH_2$— in the monocyclic or bicyclic hydrocarbon group may be replaced with —CO— or —O—; $A^+$ represents an organic counter ion; $Y^1$ and $Y^2$ each independently represents a fluorine atom or a C1-C6 perfluoroalkyl group.
<13> The chemically amplified positive resist composition according to <12>, wherein $R^{26}$ is a C3-C30 monocyclic or polycyclic hydrocarbon group having a hydroxyl group or a carbonyl group, and at least one hydrogen atom in the monocyclic or polycyclic hydrocarbon group may be replaced with a C1-C6 alkyl group, a C1-C6 alkoxy group, a C1-C4 perfluoroalkyl group, a C1-C6 hydroxyalkyl group, a hydroxyl group or a cyano group.

DESCRIPTION OF PREFERRED EMBODIMENTS

The resin (A) contains no fluorine atom. The resin (A) contains a structural unit (a1) having an acid-labile group in a side chain. The resin (A) may consist of the structural unit (a1) and may contain the other structural unit or units in addition to the structural unit (a1). The resin (A) preferably contains the other structural unit or units in addition to the structural unit (a1). As the resin (A), a resin containing at least one structural unit selected from the group consisting of a structural unit (a3) having a hydroxyl group and a structural unit (a4) having a lactone structure in addition to the structural unit (a1) is preferable, and a resin containing the structural unit (a3) and the structural unit (a4) in addition to the structural unit (a1) is more preferable.

The resin (A) may contain two or more kinds of the structural unit (a1). The resin (A) may contain two or more kinds of the structural unit (a3). The resin (A) may contain two or more kinds of the structural unit (a4).

The resin (A) generally contains the structural unit (a1) in a ratio of 10 to 80 mol % based on all structural units of the resin (A) although the ratio varies depending on the kind of radiation for patterning exposure, the kind of the acid-labile group and the like.

The resin (A) preferably contains the structural unit (a3) in a ratio of 0 to 40 mol % and more preferably 5 to 35 mol % based on all structural units of the resin (A) although the ratio varies depending on the kind of radiation for patterning exposure, the kind of the acid-labile group and the like.

The resin (A) preferably contains the structural unit (a4) in a ratio of 0 to 80 mol % and more preferably 10 to 60 mol % based on all structural units of the resin (A) although the ratio varies depending on the kind of radiation for patterning exposure, the kind of the acid-labile group, and the like.

The resin (A) has usually a weight-average molecular weight of about 1000 to 500,000, and preferably of 4,000 to 50,000 using polystyrene as a standard reference material.

The resin (B) contains a structural unit (b2) having a fluorine-containing group in a side chain and at least one structural unit selected from the group consisting of a structural unit (b1) having an acid-labile group, a structural unit (b3) having a hydroxyl group and a structural unit (b4) having a lactone structure in a side chain.

As the resin (B), a resin containing the structural unit (b1) and the structural unit (b2) is preferable.

The resin (B) may contain two or more kinds of the structural unit (b1). The resin (B) may contain two or more kinds of the structural unit (b2). The resin (B) may contain two or more kinds of the structural unit (b3). The resin (B) may contain two or more kinds of the structural unit (b4).

In the present invention, when a structural unit has a fluorine-containing group and a hydroxyl group in a side chain, the structural unit is a structural unit (b2).

The content of the structural unit (b1) based on the total units of the resin (B) is usually 0.5 to 30 mol % and preferably 5 to 30 mol %.

The resin (B) usually contains the structural unit (b2) in a ratio of 5 to 99.5 mol %, preferably of 10 to 95 mol % and more preferably of 50 to 90 mol % in all structural units of the resin (B) although the ratio varies depending on the kind of radiation for patterning exposure, the kind of the acid-labile group, and the like.

The resin (B) preferably contains the structural unit (b3) in a ratio of 0 to 20 mol %, more preferably in a ratio of 0 to 10 mol % and especially preferably in a ratio of 0 to 5 mol % in all structural units of the resin (B) although the ratio varies depending on the kind of radiation for patterning exposure, the kind of the acid-labile group and the like.

The resin (B) preferably contains the structural unit (b4) in a ratio of 0 to 30 mol %, more preferably in a ratio of 0 to 10 mol % and especially preferably in a ratio of 0 to 5 mol % in all structural units of the resin (B) although the ratio varies depending on the kind of radiation for patterning exposure, the kind of the acid-labile group and the like.

The resin (B) has usually a weight-average molecular weight of about 1000 to 500,000, and preferably of 4,000 to 50,000 using polystyrene as a standard reference material.

The amount of the resin (B) in the present invention is 2 parts by weight or less, preferably 0.005 part by weight or more and 2 parts by weight or less, more preferably 0.005 part by weight or more and 1 parts by weight or less and especially preferably 0.01 part by weight or more and 1 parts by weight or less per 100 parts by weight of the resin (A), per 100 parts by weight of the resin (A).

As the resin (B), a resin of which Log P value is 2.10 or more is preferable. Herein, the hydrophilicity/hydrophobicity parameter Log P of the resin means a common logarithm of a partition coefficient P of the resin and is a value representing how the resin is distributed at equilibrium in a two-phase system containing an oil (typically, 1-octanol) and water, which can be calculated by the following equation:

$$Log\, P = Log(C_{oil}/C_{water})$$

wherein $C_{oil}$ represents a mol concentration of the resin in oil phase and $C_{water}$ represents a mol concentration of the resin in water phase. Log P values may be empirically measured in a distribution experiment and calculated by using calculating software for estimating Log P value form structural formulae. In the present invention, Log P value of the monomer used to give the corresponding structural unit is calculated by using a Log P value estimating program incorporated into Chem Draw Ultra version 9.0.1 provided by CambridgeSoft Corporation and Log P value of the resin is calculated by the following equation:

Log P value of the resin=Σ(each calculated Log P value of the monomer used to give the corresponding structural unit in the resin×each content ratio of the corresponding structural unit in the resin).

The acid-labile group in the structural units (a1) and (b1) cleaves by an acid generated from the acid generator. The acid-labile group in the structural unit (a1) may be same as that in the structural unit (b1), and the acid-labile group in the structural unit (a1) may be different from that in the structural unit (b1).

In the present specification, "ester group" means "a structure having ester of carboxylic acid". Specifically, "tert-butyl ester group" is "a structure having tert-butyl ester of carboxylic acid", and may be described as "—COOC(CH$_3$)$_3$".

Examples of the acid-labile group include a structure having ester of carboxylic acid such as an alkyl ester group in which a carbon atom adjacent to the oxygen atom is quaternary carbon atom, an alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom such as an isobornyl ester, 1-alkylcycloalkyl ester, 2-alkyl-2-adamantyl ester, and 1-(1-adamantyl)-1-alkylalkyl ester group.

As the structural units (a1) and (b1), a structural unit derived from an optionally substituted acrylic compound is preferable.

In the present specification, "an optionally substituted acrylic compound" means an acrylate, an acrylate of which α-carbon is substituted with a substituent. Examples of the substituent include a C1-C4 alkyl group.

Examples of the optionally substituted acrylic compound include an acrylayte, a methacrylate, a 2-ethylpropenoate, a 2-n-propylpropenoate, and a 2-n-butylpropenoate.

Examples of the structural units (a1) and (b1) include a structural unit derived from tert-butyl acrylate, tert-butyl methacrylate, methoxymethyl acrylate, methoxymethyl methacrylate, ethoxymethyl acrylate, ethoxymethyl methacrylate, 1-ethoxyethyl acrylate, 1-ethoxyethyl methacrylate, 1-isobutoxyethyl acrylate, 1-isobutoxyethyl methacrylate, 1-isopropoxyethyl acrylate, 1-isopropoxyethyl methacrylate, 1-ethoxypropoxy acrylate, 1-ethoxypropoxy methacrylate, 1-(2-methoxyethoxy)ethyl acrylate, 1-(2-methoxyethoxy)ethyl methacrylate, 1-(2-acetoxyethoxy)ethyl acrylate, 1-(2-acetoxyethoxy)ethyl methacrylate, 1-[2-(1-adamantyloxy)ethoxy]ethyl acrylate, 1-[2-(1-adamantyloxy)ethoxy]ethyl methacrylate, 1-[2-(1-adamantanecarbonyloxy)ethoxy]ethyl acrylate, 1-[2-(1-adamantanecarbonyloxy)ethoxy]ethyl methacrylate, tetrahydro-2-furyl acrylate, tetrahydro-2-furyl methacrylate, tetrahydro-2-pyranyl acrylate, tetrahydro-2-pyranyl methacrylate, isobornyl acrylate, isobornyl methacrylate, 1-alkylcycloalkyl acrylate, 1-alkylcycloalkyl methacrylate, 2-alkyl-2-adamantyl acrylate, 2-alkyl-2-adamantyl methacrylate, 1-(1-adamantyl)-1-alkylalkyl acrylate and 1-(1-adamantyl)-1-alkylalkyl methacrylate.

Preferable examples of the structural units (a1) and (b1) include a structural unit represented by the formula (Ia) (hereinafter, simply referred to as the structural unit (Ia)) and a structural unit represented by the formula (Ib) (hereinafter, simply referred to as the structural unit (Ib)).

In the structural unit (Ia), $R^1$ represents a hydrogen atom or a methyl group, $R^2$ represents a C1-C8 alkyl group, $R^3$ represents a methyl group, n represents an integer of 0 to 14, $Z^1$ represents a single bond or a —(CH$_2$)$_k$—COO— group, and k represents an integer of 1 to 4. In the structural unit (Ib), $R^4$ represents a hydrogen atom or a methyl group, $R^5$ represents a C1-C8 alkyl group, $R^6$ and $R^7$ each independently represents a hydrogen atom or a monovalent C1-C8 hydrocarbon group which may contain at least one heteroatom, $R^6$ and $R^7$ may be bonded each other to form a ring together with the carbon atom to which $R^6$ is bonded and the carbon atom to which $R^7$ is bonded, or $R^6$ and $R^7$ may be bonded each other to form a double bond between the carbon atom to which $R^6$ is bonded and the carbon atom to which $R^7$ is bonded, m represents an integer of 1 to 3, $Z^2$ represents a single bond or a —(CH$_2$)$_{k'}$—COO— group, and k' represents an integer of 1 to 4.

Examples of the C1-C8 alkyl group include a methyl group, an ethyl group, a 1-propyl group, a 1-methylethyl group, a 1-butyl group, a 2-butyl group, a 2-methyl-1-propyl group, a 1-pentyl group, a 2-pentyl group, a 2-methyl-1-butyl group, a 3-pentyl group, a 2,2-dimethyl-1-propyl group, a 3-methyl-1-butyl group, a 1-hexyl group, a 2-hexyl group, a 1-heptyl group, a 4-heptyl group, a 1-octyl group, a 2-octyl group, a 5-methyl-2-heptyl group, a cyclopentyl group, a 2-methylcyclopentyl group, a cyclohexyl group, a 3-methylcyclohexyl group, a 4-methylcyclohexyl group, a 2,3-dimethylcyclohexyl group, a 4,4-dimethylclohexyl group and a 5-methyl-bicycle[2.2.1]hept-2-yl group, and a C1-C3 alkyl group such as a methyl group, an ethyl group, a 1-propyl group and a 1-methylethyl group is preferable.

Examples of the monovalent C1-C8 hydrocarbon group include a methyl group, an ethyl group, a 1-propyl group, a 1-methylethyl group, a 1-butyl group, a 2-butyl group, a 2-methyl-1-propyl group, a 1-pentyl group, a 2-pentyl group, a 2-methyl-1-butyl group, a 3-pentyl group, a 2,2-dimethyl- 1-propyl group, a 3-methyl-1-butyl group, a 1-hexyl group, a 2-hexyl group, a 1-heptyl group, a 4-heptyl group, a 1-octyl group, a 2-octyl group, a 5-methyl-2-heptyl group, a cyclopentyl group, a 2-methylcyclopentyl group, a cyclohexyl group, a 3-methylcyclohexyl group, a 4-methylcyclohexyl group, a 2,3-dimethylcyclohexyl group and a 4,4-dimethylycyclohexyl group.

Examples of the heteroatom include an oxygen, nitrogen and sulfur atom.

Examples of the ring formed by bonding $R^6$ and $R^7$ each other together with the carbon atom to which $R^6$ is bonded and the carbon atom to which $R^7$ is bonded include a cyclobutane ring, a cyclopentane ring and a cyclohexane ring.

As the structural units (a1) and (b1), the structural unit (Ia) is preferable.

The structural unit (Ia) is derived from a monomer represented by the following formula:

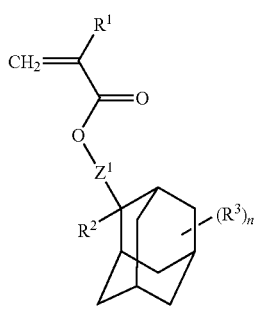

wherein $R^1$, $R^2$, $R^3$, n, and $Z^1$ are the same as defined above.

The structural unit (Ib) is derived from a monomer represented by the following formula:

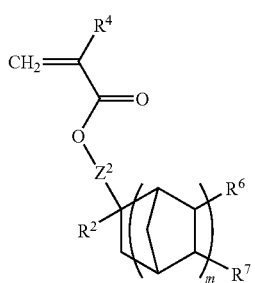

wherein $R^4$, $R^5$, $R^6$, $R^7$, m, and $Z^2$ are the same as defined above.

Examples of the monomer represented by the above-mentioned formulae include the followings:

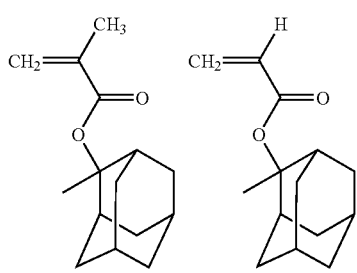

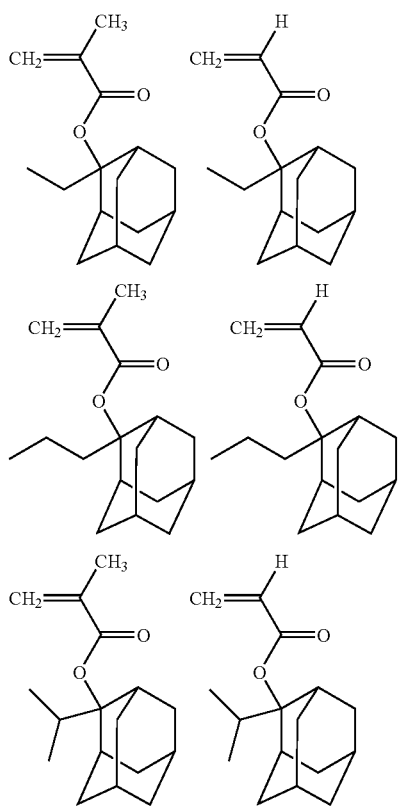

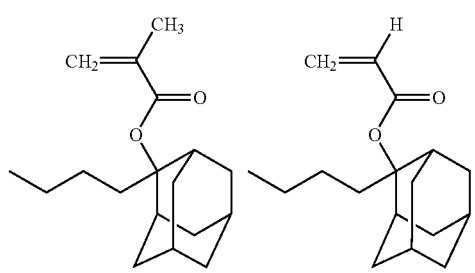

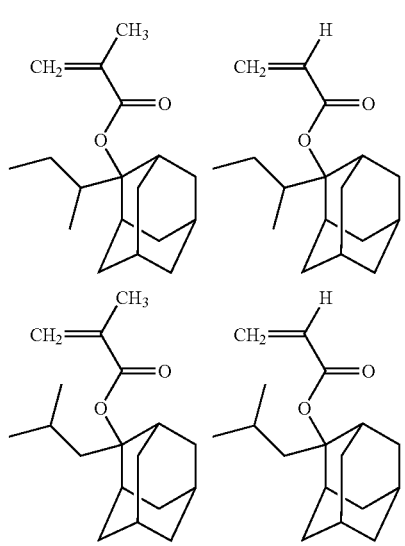

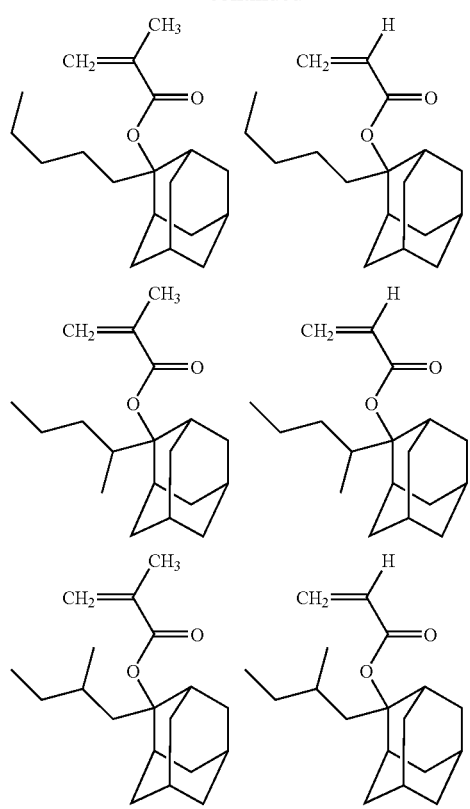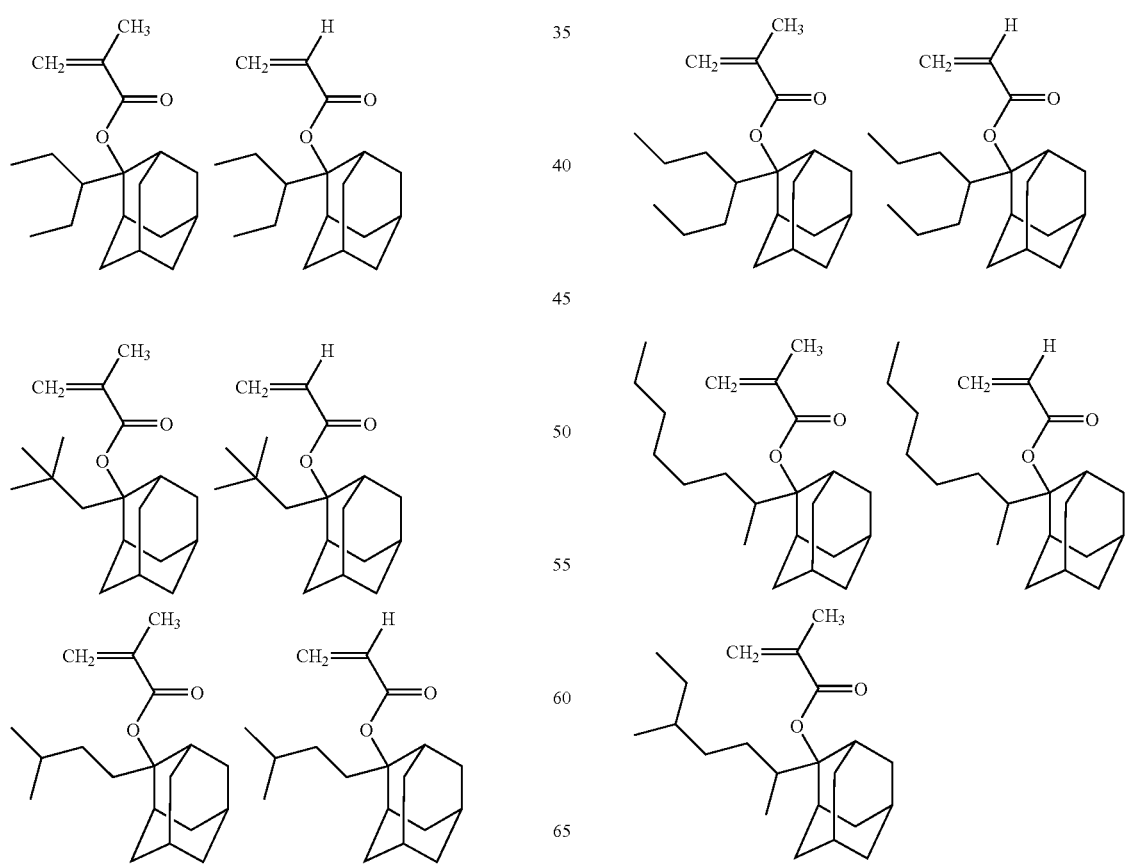

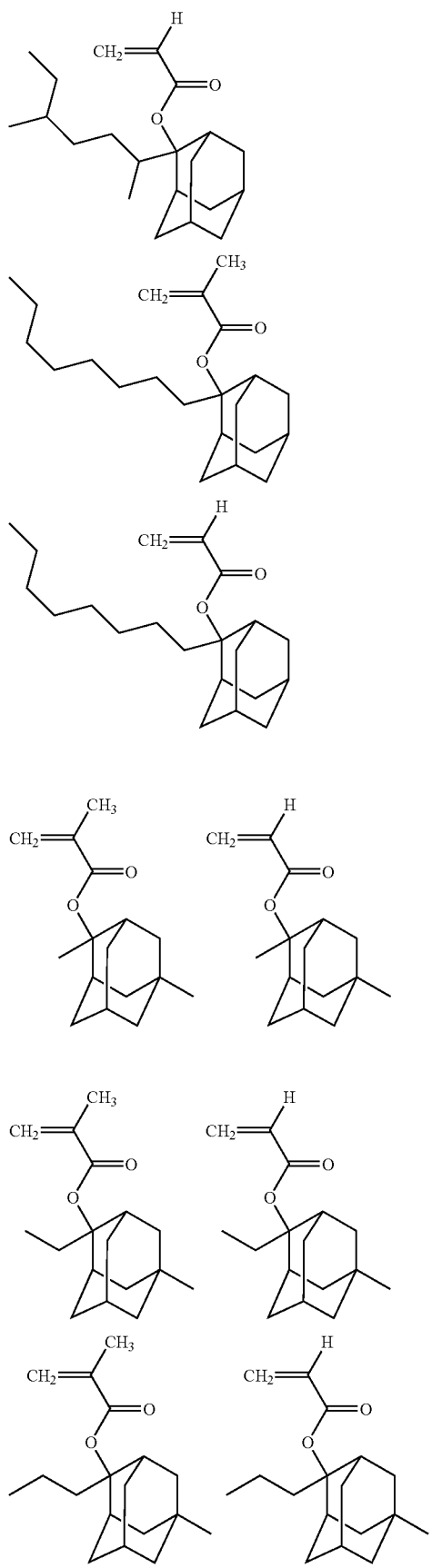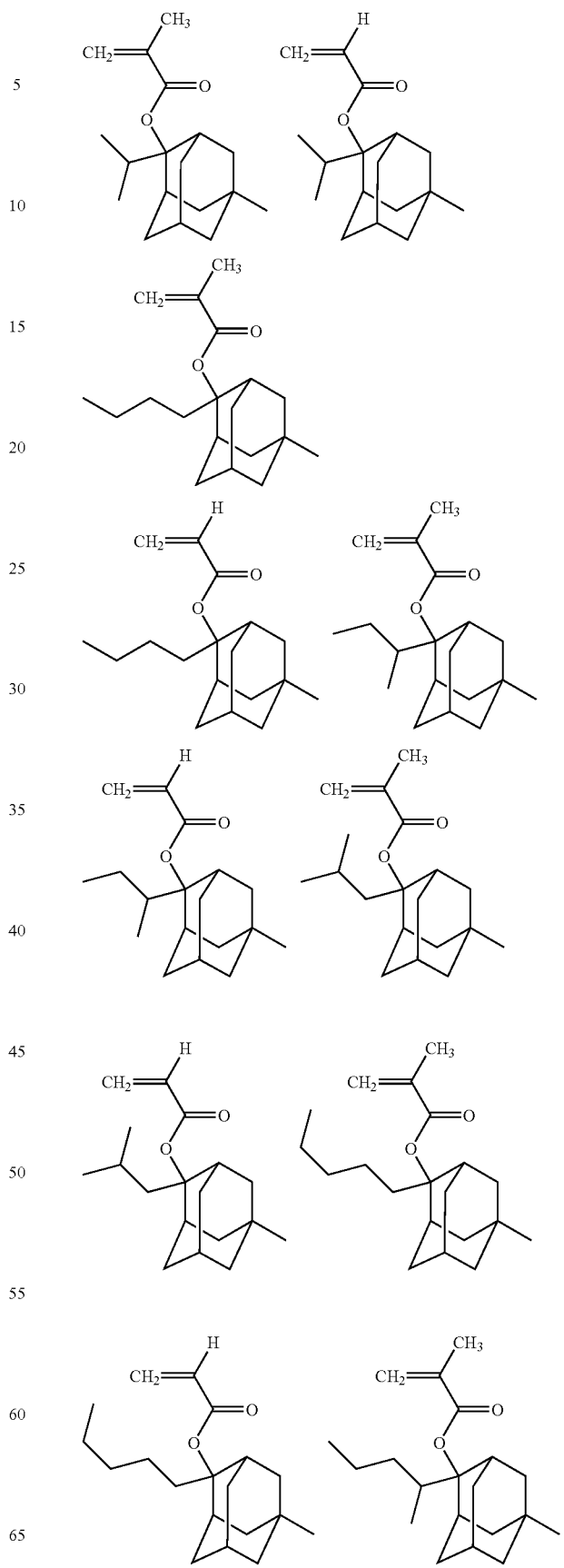

-continued
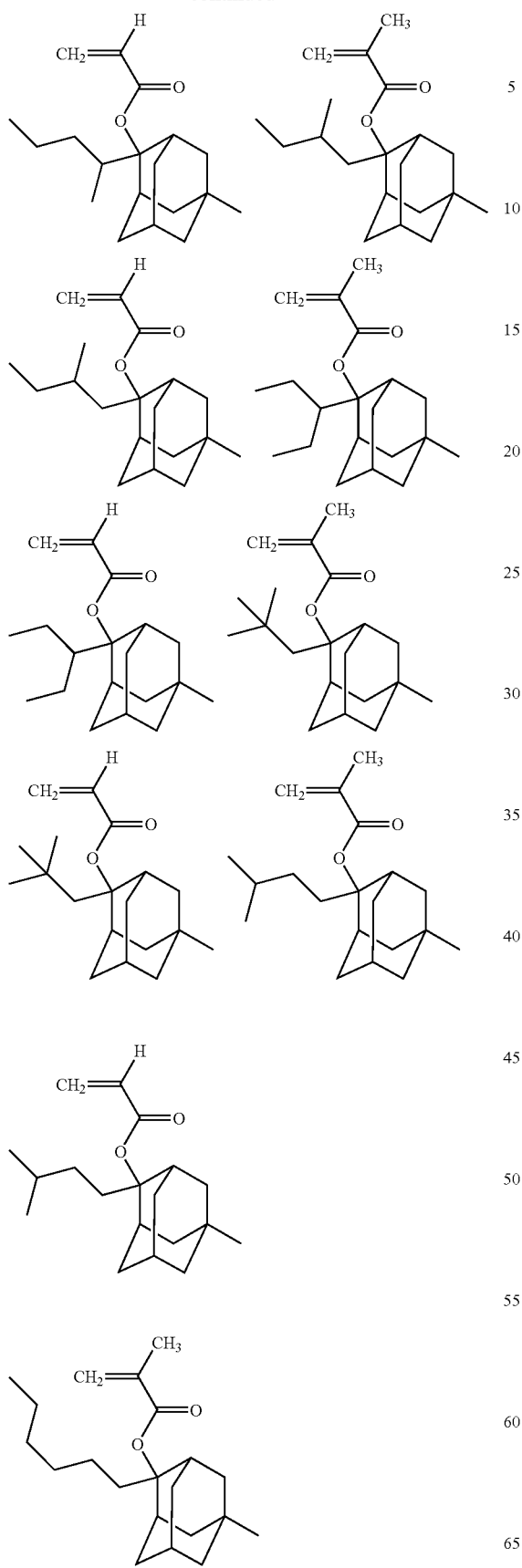
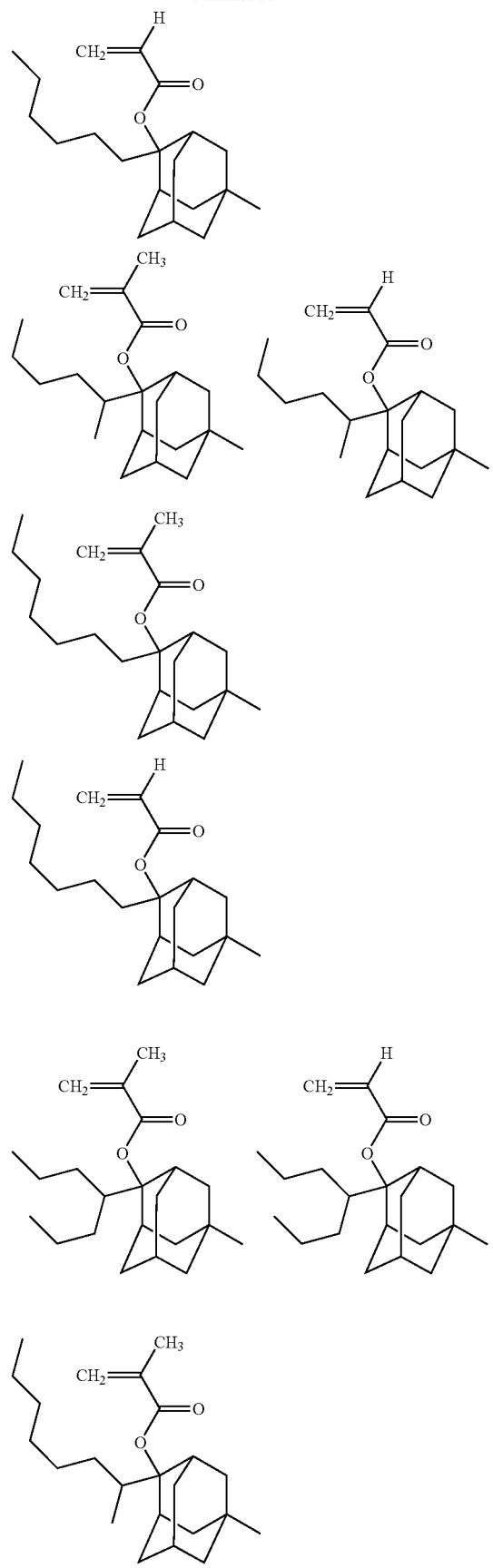

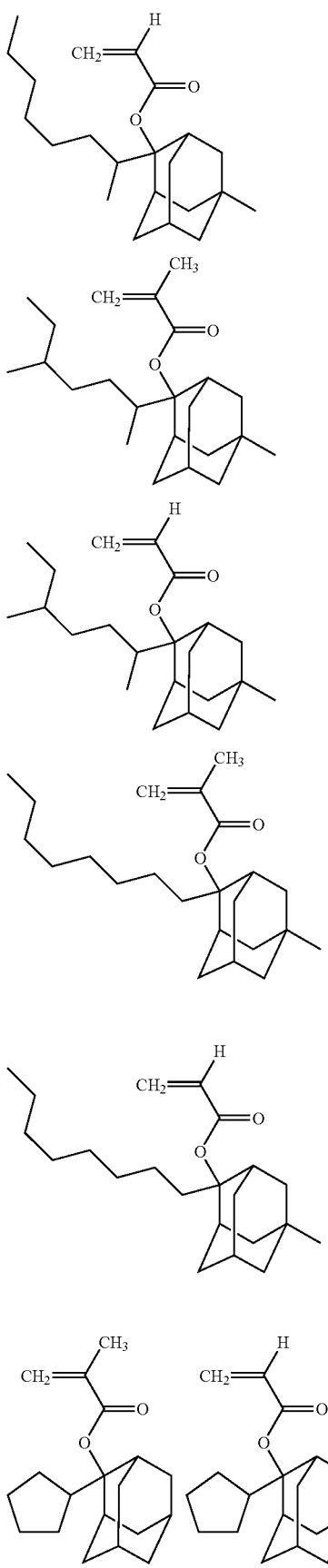
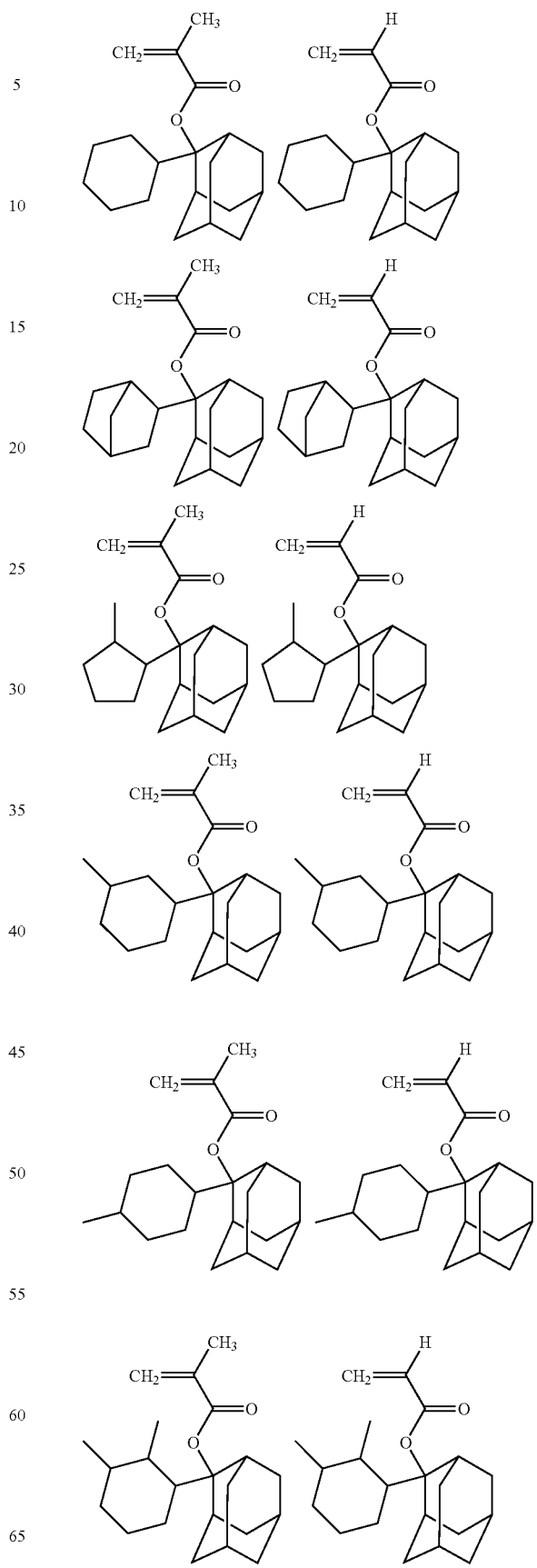

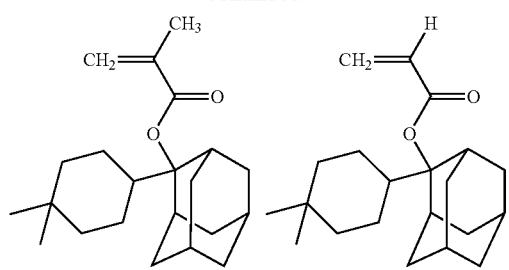
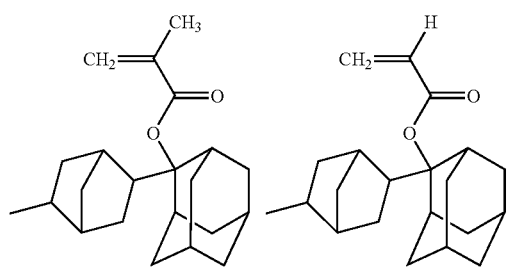
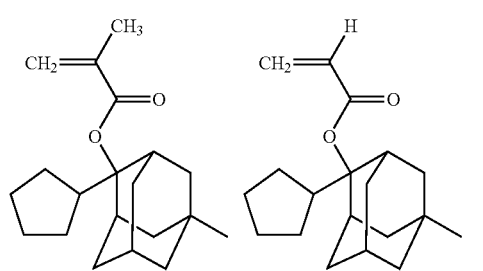
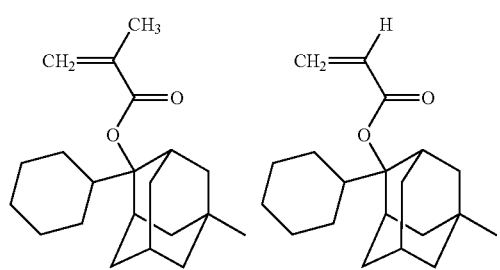
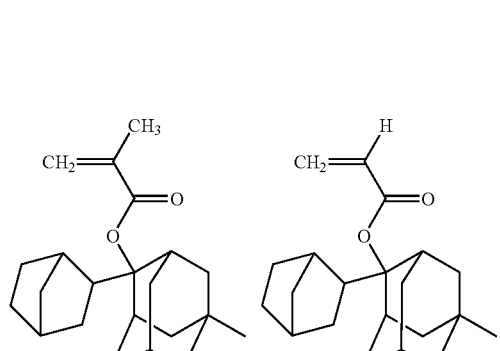
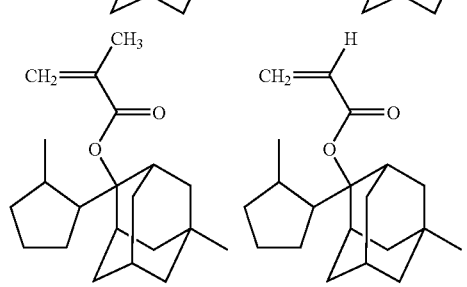
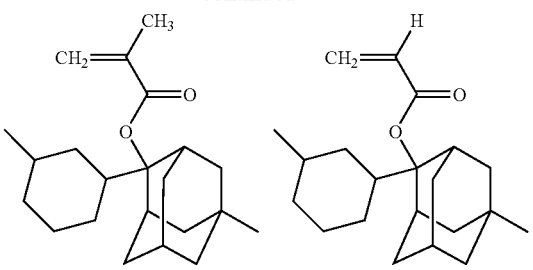
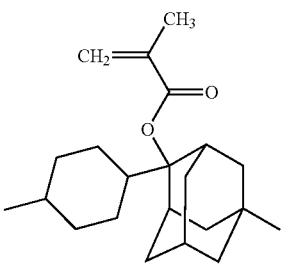
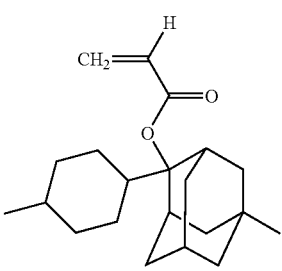
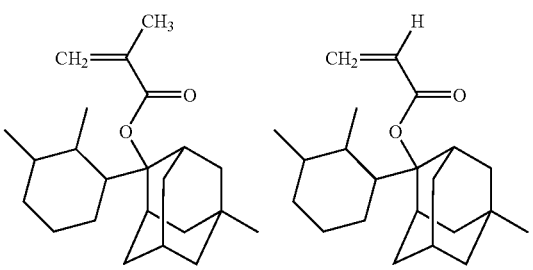
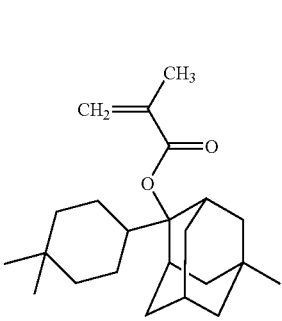
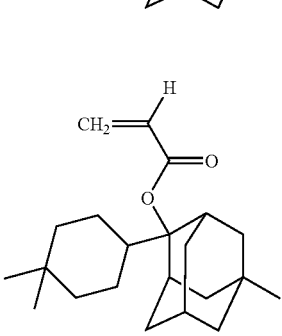

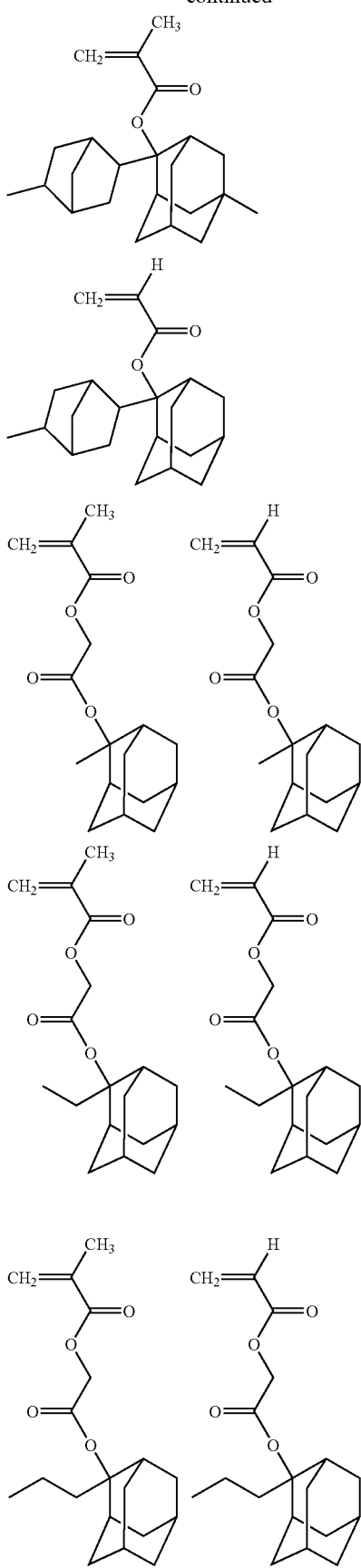
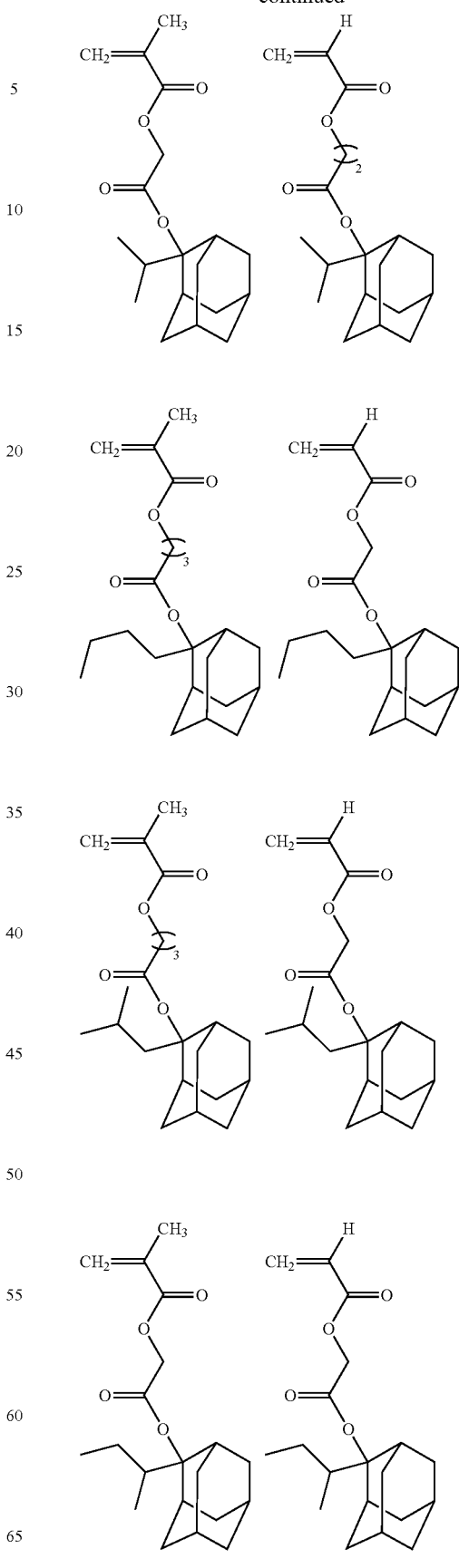

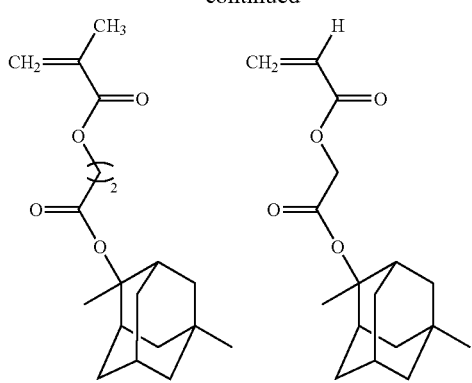
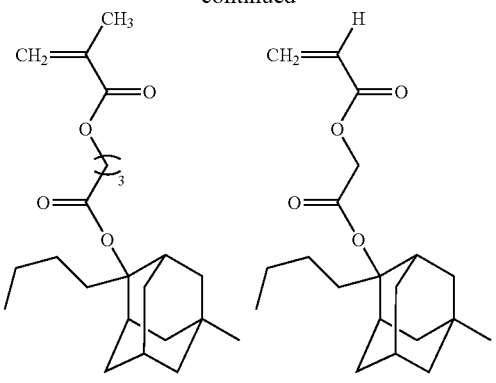
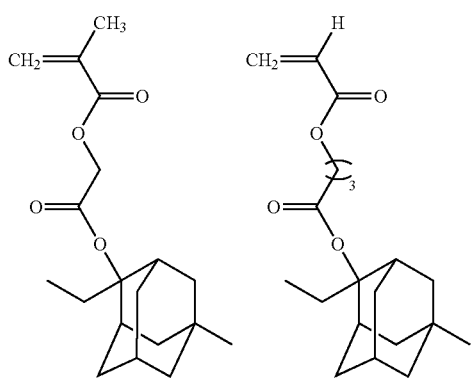
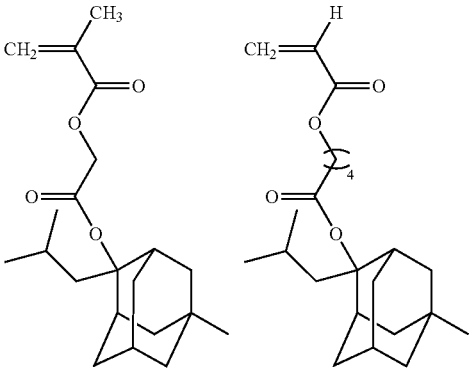
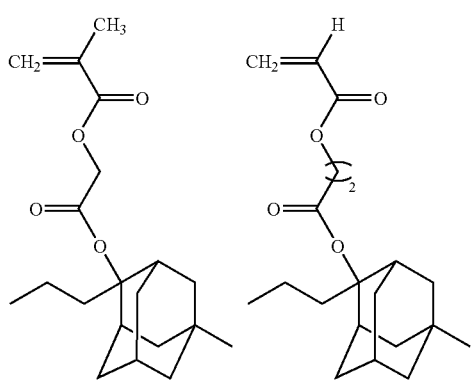
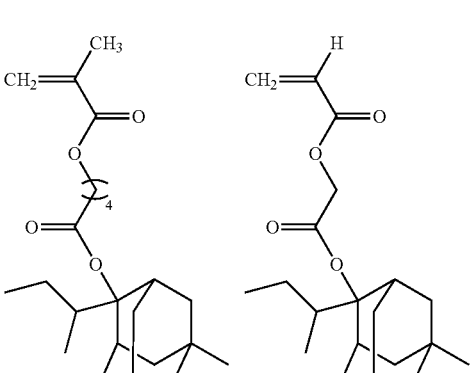
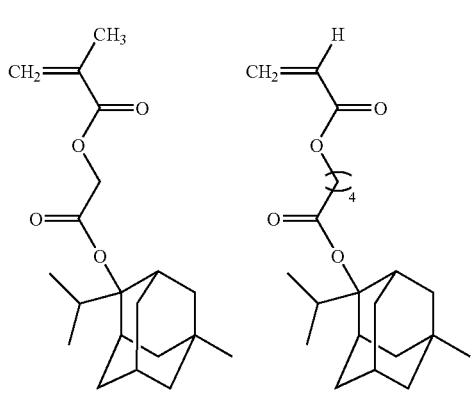
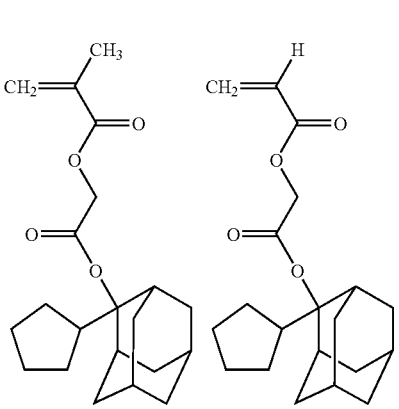

-continued
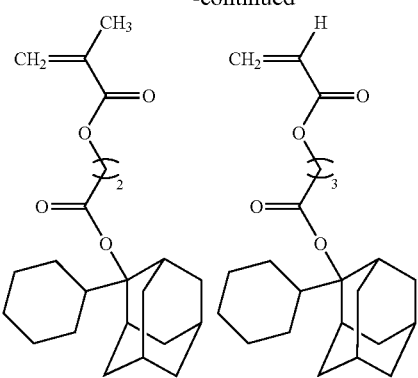
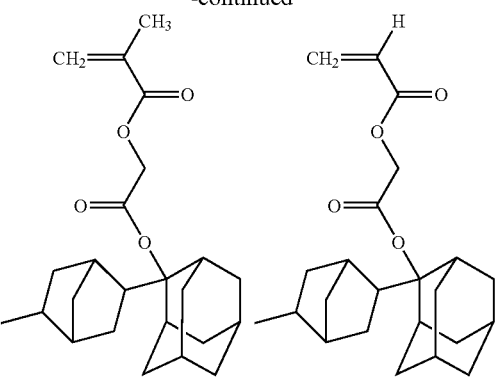
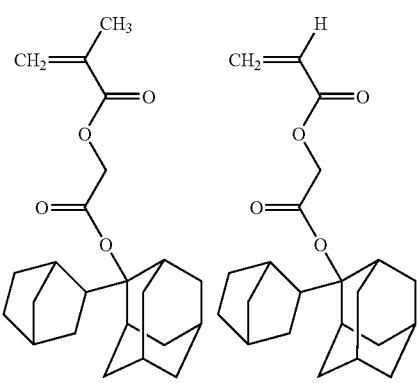
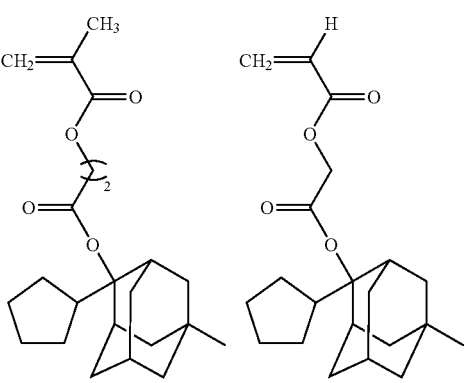
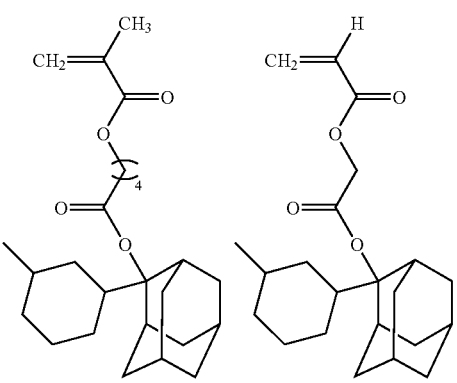
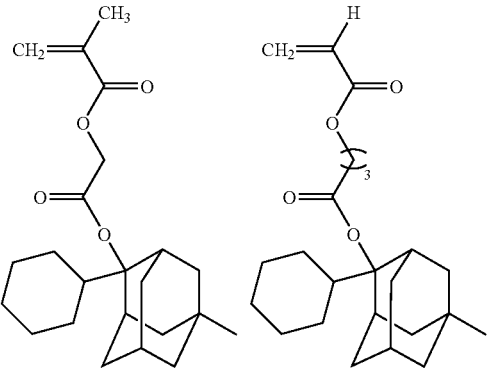
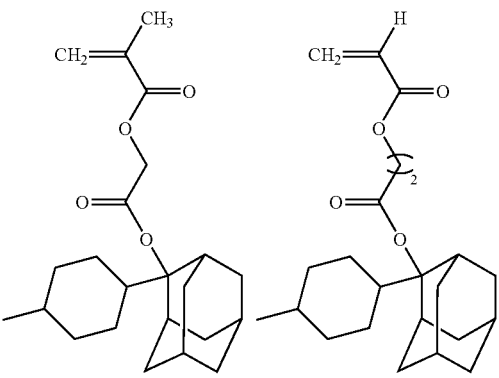
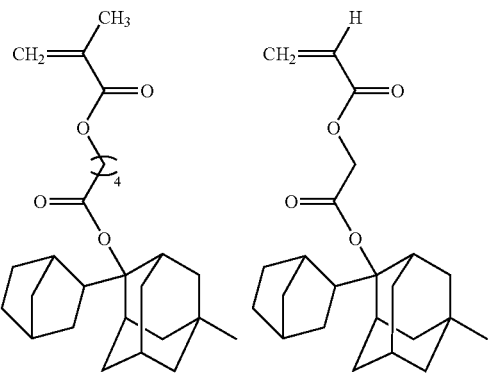

-continued
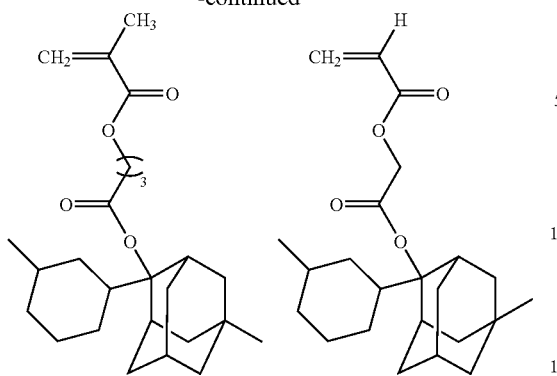
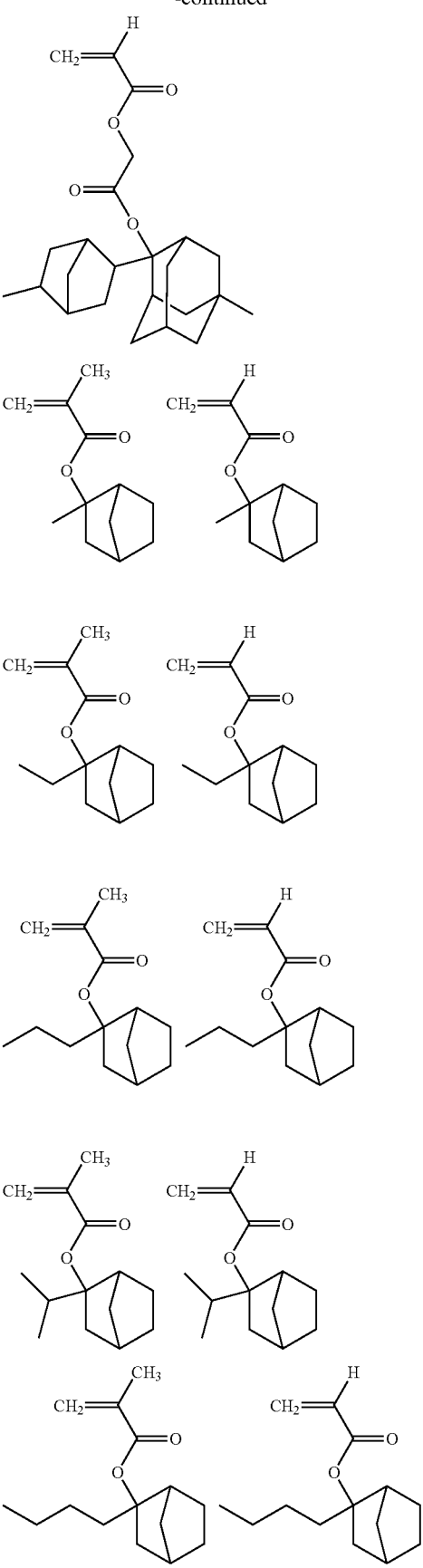

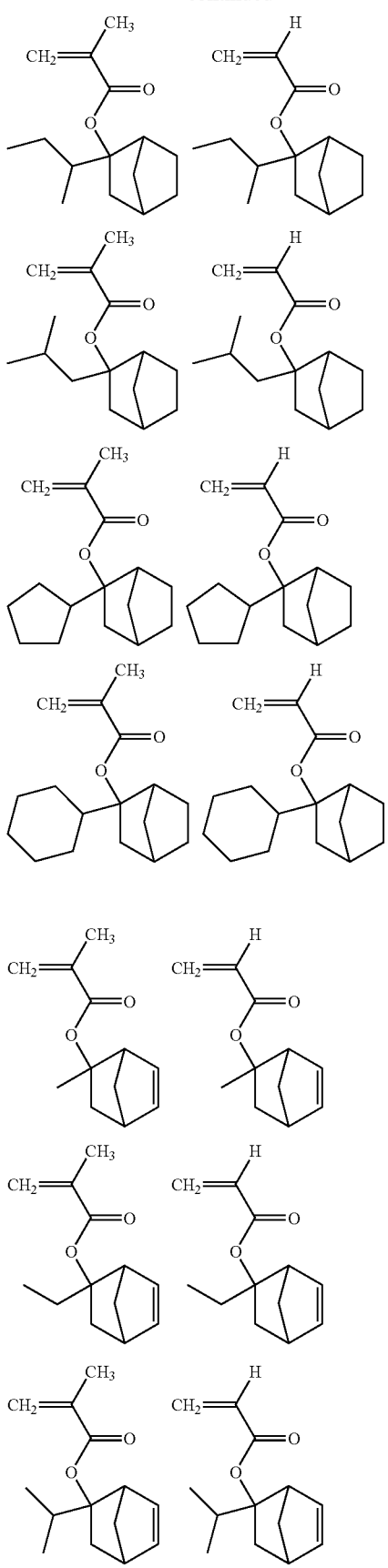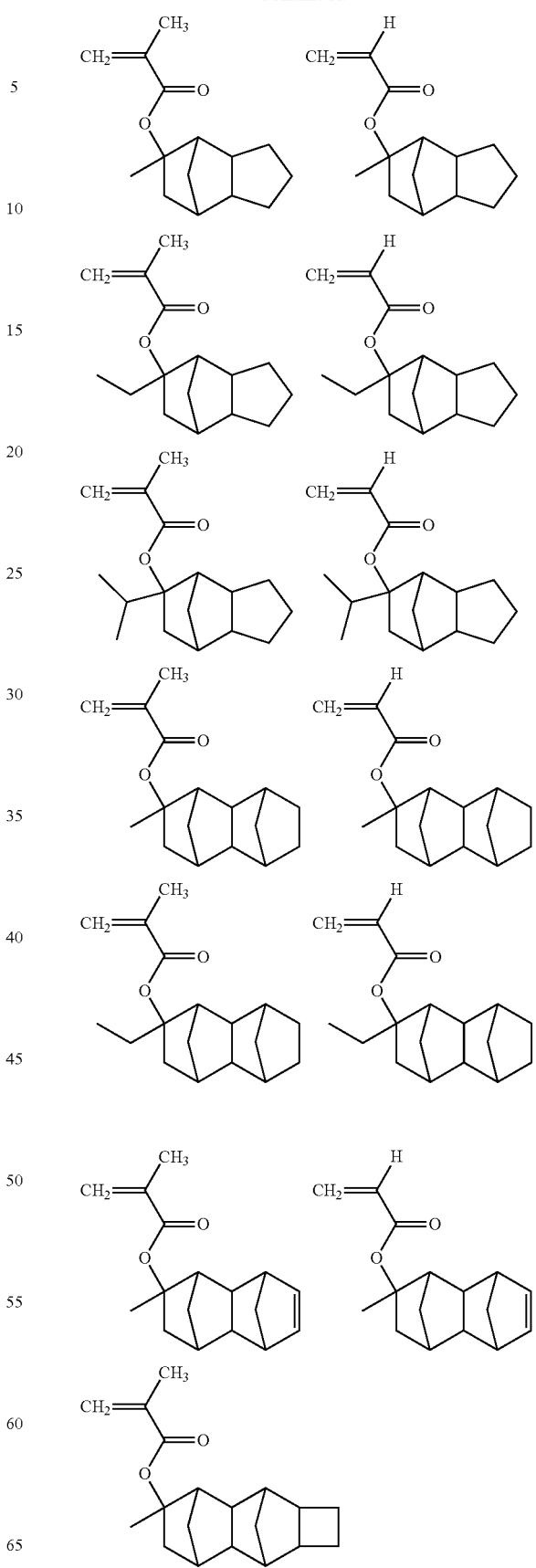

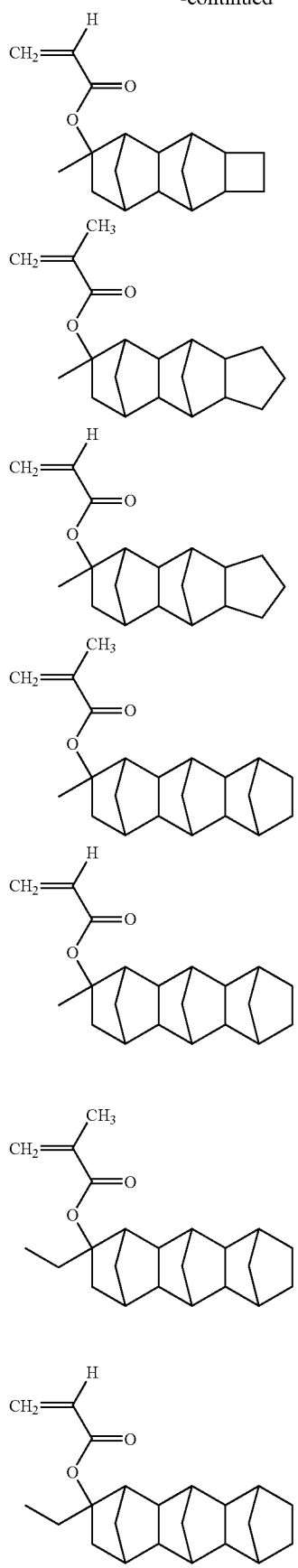
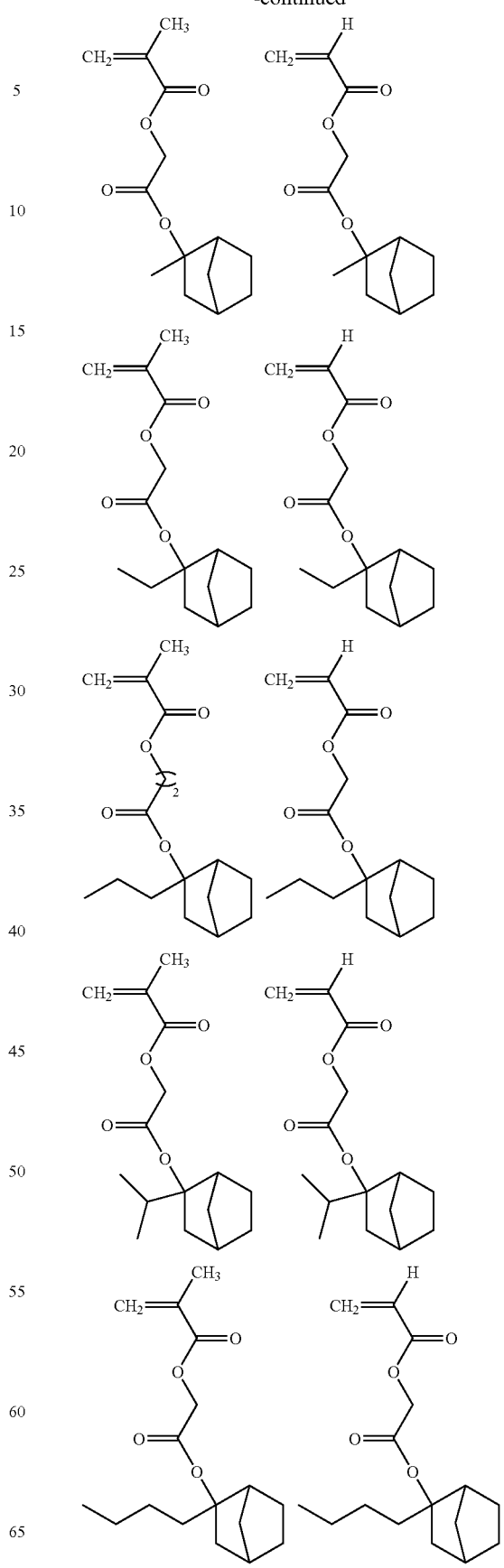

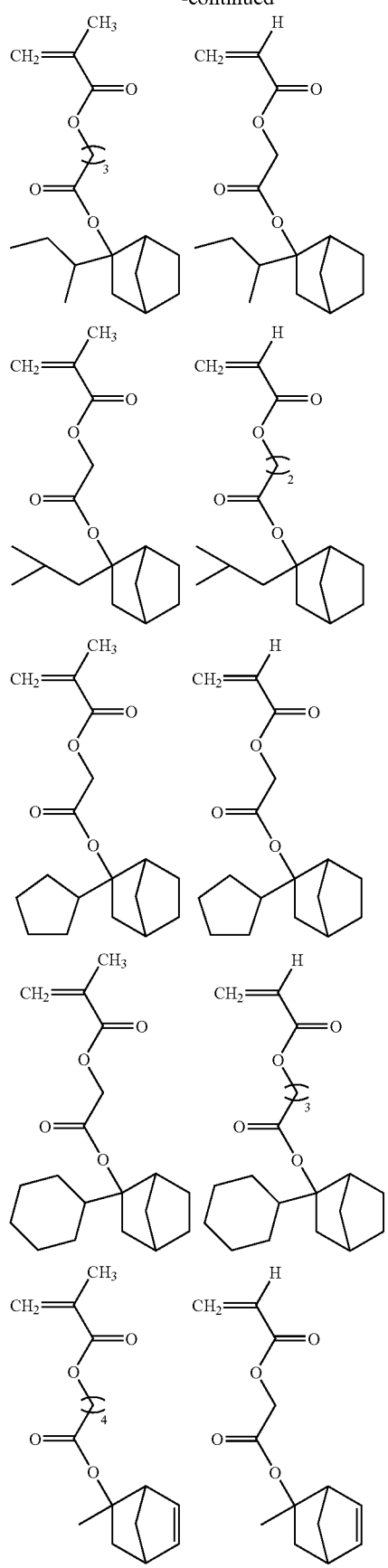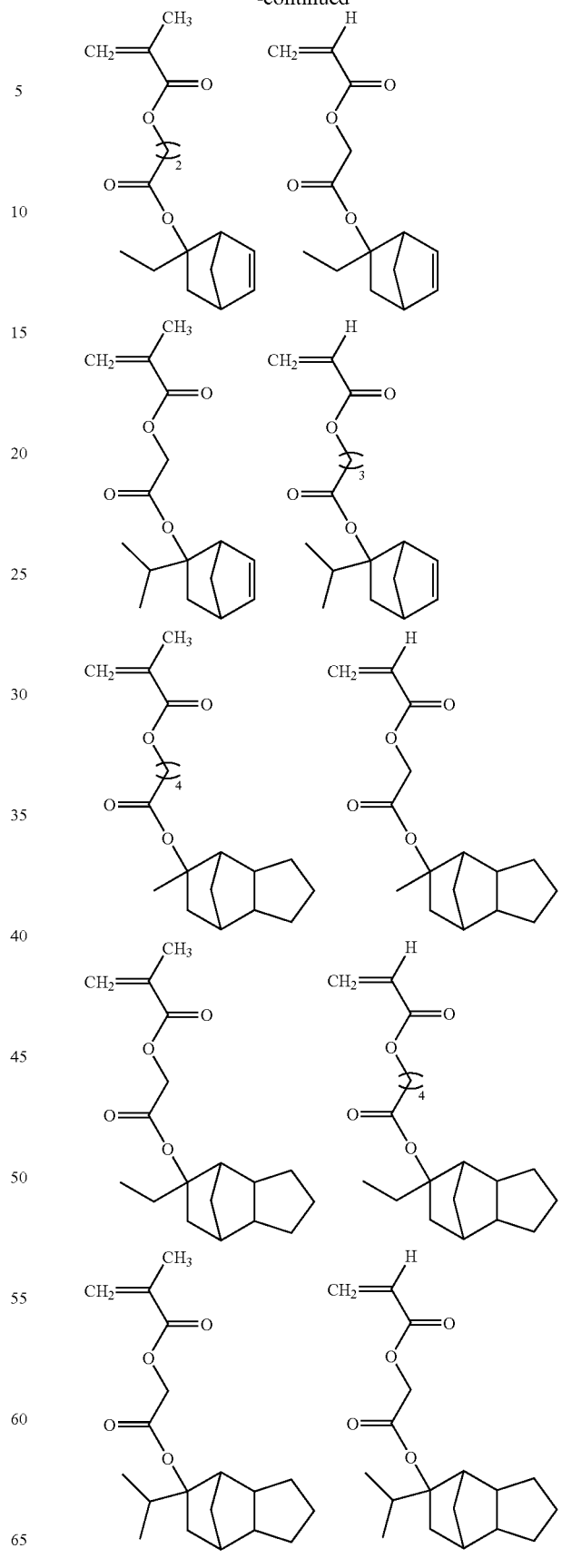

Among these monomers, 2-alkyl-2-adamantyl acrylate, 2-alkyl-2-adamantyl methacrylate, 1-(2-alkyl-2-adamntyloxycarbonyl)alkyl acrylate and 1-(2-alkyl-2-adamntyloxycarbonyl)alkyl methacrylate are preferable, and 2-ethyl-2-adamantyl acrylate, 2-ethyl-2-adamantyl methacrylate, 2-isopropyl-2-adamantyl acrylate, 2-isopropyl-2-adamantyl methacrylate and 1-(2-methyl-2-adamantyloxycarbonyl)methyl methacrylate are more preferable since excellent sensitivity is obtained when the resin containing such structural unit is used in the present resist composition.

2-Alkyl-2-adamantyl acrylate can be produced, for example, by reacting 2-alkyl-2-adamantanol or metal salt thereof with an acryloyl halide, and 2-alkyl-2-adamantyl methacrylate can be produced, for example, by reacting 2-alkyl-2-adamantanol or metal salt thereof with a methacryloyl halide.

The structural unit (a3) and (b3) have a hydroxyl group. The structural unit (a3) and (b3) may be the same or different from each other.

As the structural units (a3) and (b3), structural units derived from optionally substituted acrylic compounds are preferable. Examples of the optionally substituted acrylic compound include those as same as described above.

As the structural unit (a3), a structural unit represented by the formula (IIa) (hereinafter, simply referred to as the structural unit (IIa)) is preferable. As the structural unit (b3), a structural unit represented by the formula (IIb) (hereinafter, simply referred to as the structural unit (IIb)) is preferable.

In the structural unit (IIa), $R^{12}$ represents a hydrogen atom or a methyl group, $R^{13}$ and $R^{14}$ each independently represents a hydrogen atom, a methyl group or a hydroxyl group, $R^{15}$ represents a methyl group, n" represents an integer of 0 to 12, $Z^4$ represents a single bond or a —$(CH_2)_{q''}$—COO— group, and q" represents an integer of 1 to 4. In the structural unit (IIb), $R^8$ represents a hydrogen atom or a methyl group, $R^9$ and $R^{10}$ each independently represents a hydrogen atom, a methyl group or a hydroxyl group, $R^{11}$ represents a methyl group, n' represents an integer of 0 to 12, $Z^3$ represents a single bond or a —$(CH_2)_q$—COO— group, and q represents an integer of 1 to 4.

The structural unit (IIa) is derived from a monomer represented by the following formula:

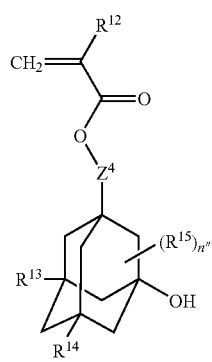

wherein $R^{12}$, $R^{13}$, $R^{14}$, $R^{15}$, n" and $Z^4$ are the same as defined above, and the structural unit (IIb) is derived from a monomer represented by the following formula:

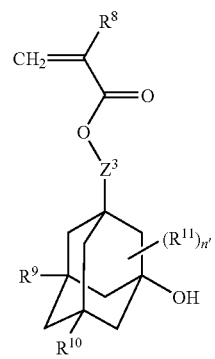

wherein $R^8$, $R^9$, $R^{10}$, $R^{11}$, n' and $Z^3$ are the same as defined above.

Specific examples of the monomer represented by the above-mentioned formulae include the followings:

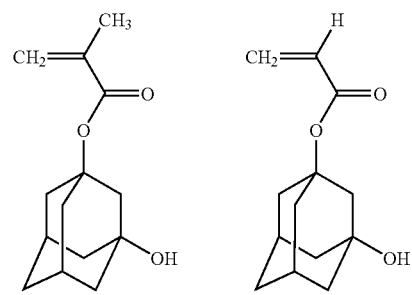

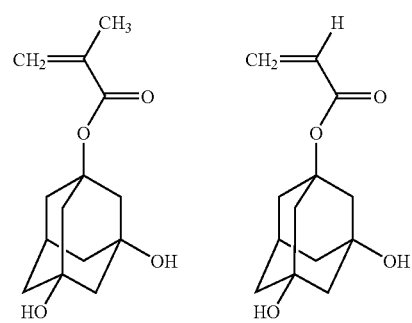

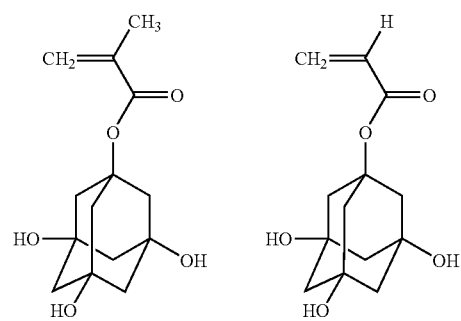

-continued
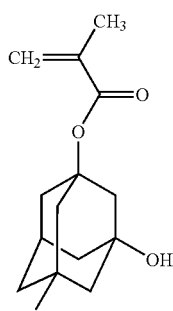 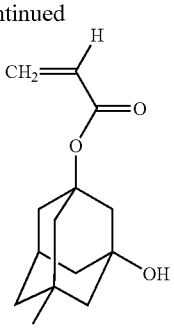
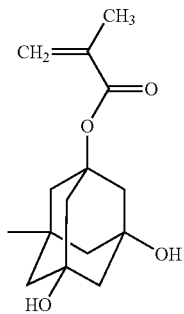 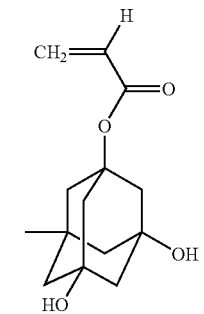
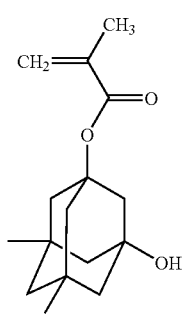 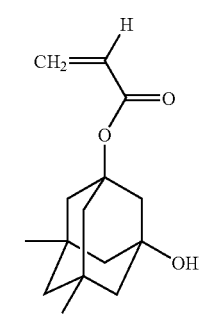
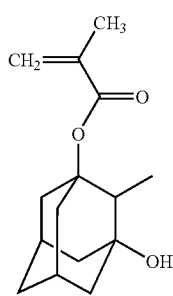 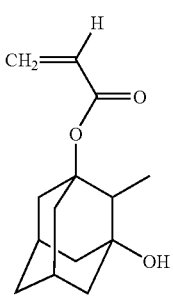
-continued
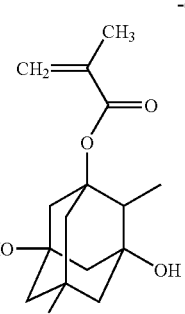 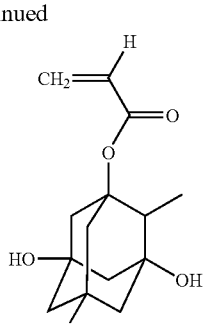
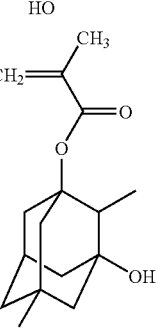 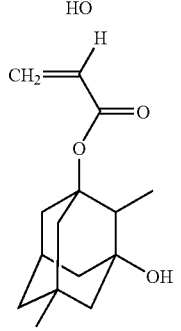
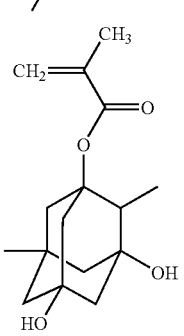 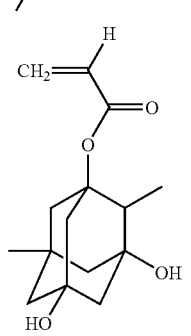
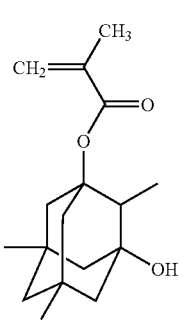 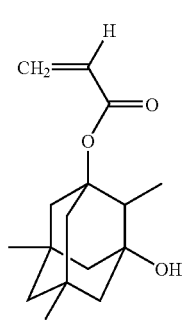
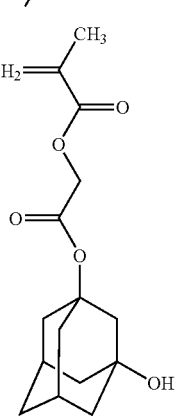 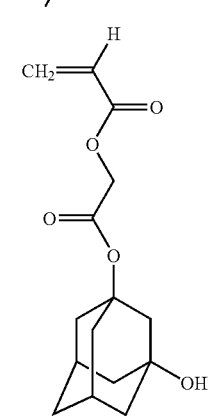

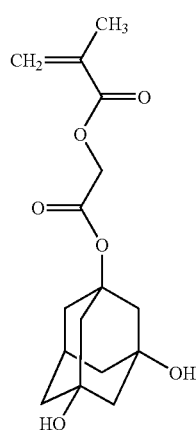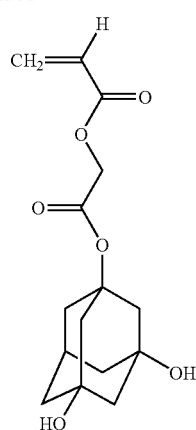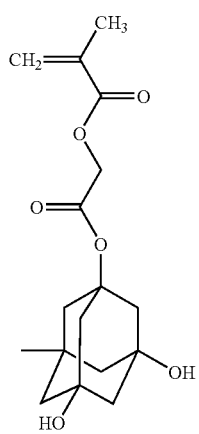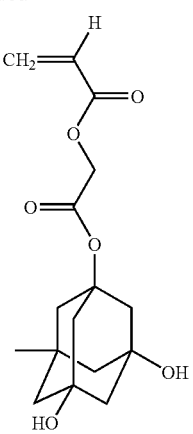
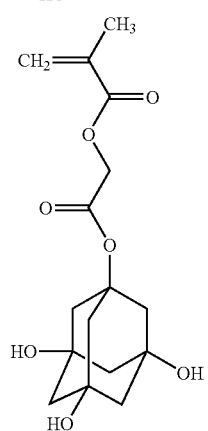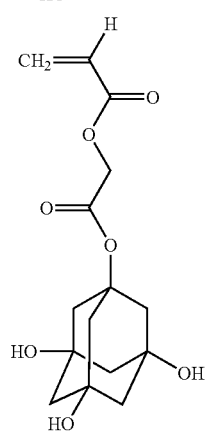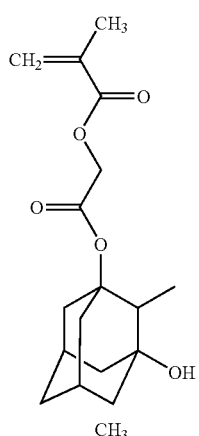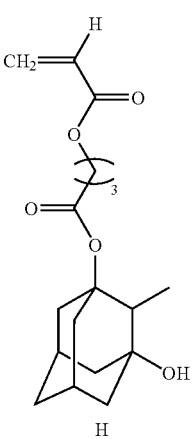
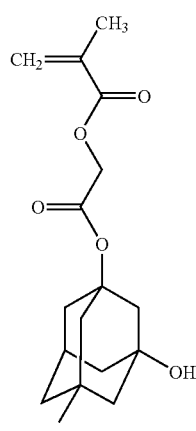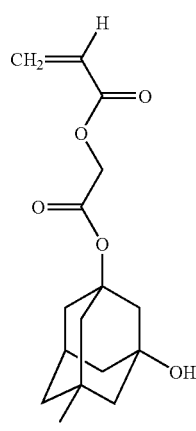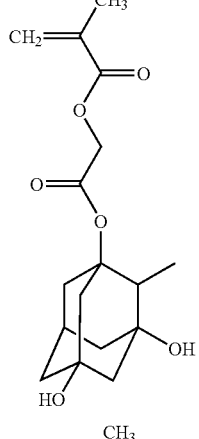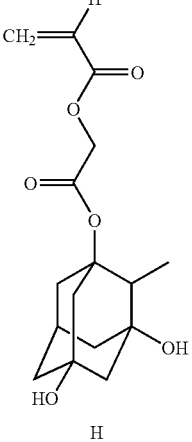
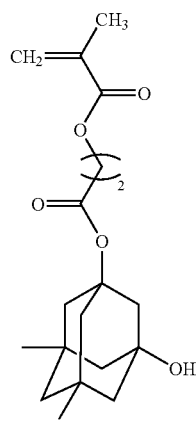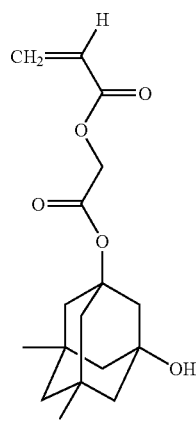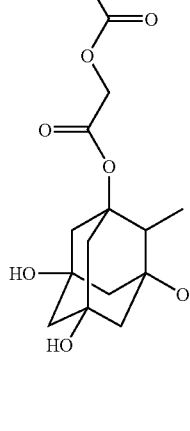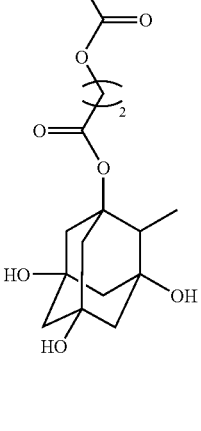

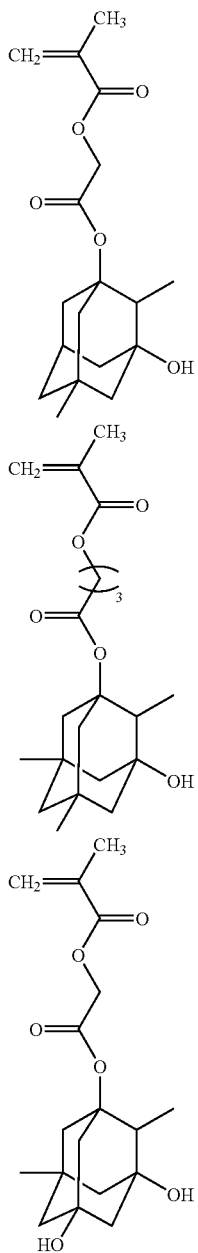

Among these monomers, 3-hydroxy-1-adamantyl acrylate, 3,5-dihydroxy-1-adamantyl acrylate, 3-hydroxy-1-adamantyl methacrylate, 3,5-dihydroxy-1-adamantyl methacrylate, 1-(3-hydroxy-1-adamantyloxycarbonyl)methyl methacrylate and 1-(3,5-dihydroxy-1-adamantyloxycarbony)methyl methacrylate are preferable since excellent resolution is obtained when the resin containing the structural unit derived from such monomer is used in the present resist composition.

3-Hydroxy-1-adamantyl acrylate, 3,5-dihydroxy-1-adamantyl acrylate, 3-hydroxy-1-adamantyl methacrylate and 3,5-dihydroxy-1-adamantyl methacrylate can be produced, for example, by reacting corresponding hydroxyl-substituted adamantane with acrylic acid, methacrylic acid, or its acid halide, and they are also commercially available.

The structural units (a4) and (b4) have a lactone structure respectively. The structural unit (a4) and (b4) may be the same or different from each other.

As the structural units (a4) and (b4), a structural unit derived from an optionally substituted acrylic compound is preferable. Examples of the optionally substituted acrylic compound include those as same as described above.

As the structural unit (a4), a structural unit represented by the formula (IIIg), (IIIh), (IIIi), (IIIj), (IIIk) or (IIIl) is preferable, and the structural units represented by the formulae (IIIg) and (IIIh) are more preferable.

As the structural unit (b4), a structural unit represented by the formula (IIIa), (IIIb), (IIIc), (IIId), (IIIe) or (IIIf) is preferable, and the structural units represented by the formulae (IIIa) and (IIIb) are more preferable.

In the structural unit represented by the formula (IIIa), (IIIb), (IIIc), (IIId), (IIIe) or (IIIf), $R^{17}$ represents a hydrogen atom or a methyl group, $R^{18}$ represents a methyl group, $R^{19}$ is independently in each occurrence a carboxyl group, a cyano group or a C1-C4 hydrocarbon group, $R^{20}$ is independently in each occurrence a carboxyl group, a cyano group or a C1-C4 hydrocarbon group, j represents an integer of 0 to 3, a represents an integer of 0 to 5, b represents an integer of 0 to 3, c represents an integer of 0 to (2j+2), $Z^5$ represents a single bond or a —$(CH_2)_{q''}$—COO— group, and q" represents an integer of 1 to 4.

In the structural unit represented by the formula (IIIg), (IIIh), (IIIi), (IIIj), (IIIk) or (IIIl), $R^{21}$ represents a hydrogen atom or a methyl group, $R^{22}$ represents a methyl group, $R^{23}$ is independently in each occurrence a carboxyl group, a cyano group or a C1-C4 hydrocarbon group, $R^{24}$ is independently in each occurrence a carboxyl group, a cyano group or a C1-C4 hydrocarbon group, i represents an integer of 0 to 3, d represents an integer of 0 to 5, e represents an integer of 0 to 3, f represents an integer of 0 to (2i+2), $Z^6$ represents a single bond or a —$(CH_2)_{q'''}$—COO— group, and q''' represents an integer of 1 to 4.

Examples of the C1-C4 hydrocarbon group include a C1-C4 alkyl group such as a methyl group, an ethyl group, a 1-propyl group, a 2-propyl group, a 1-butyl group, an isobutyl group, a sec-butyl group and a tert-butyl group, and a methyl group is preferable.

The structural units represented by the formulae (IIIa), (IIIb), (IIIc), (IIId), (IIIe), (IIIf), (IIIg), (IIIh), (IIIi), (IIIj), (IIIk) and (IIIl) are respectively derived from the corresponding monomers.

Specific examples of the monomer used to give the structural units represented by the formulae (IIIa) and (IIIg) include the followings:

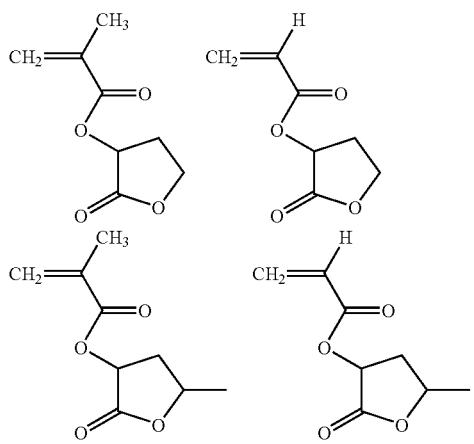

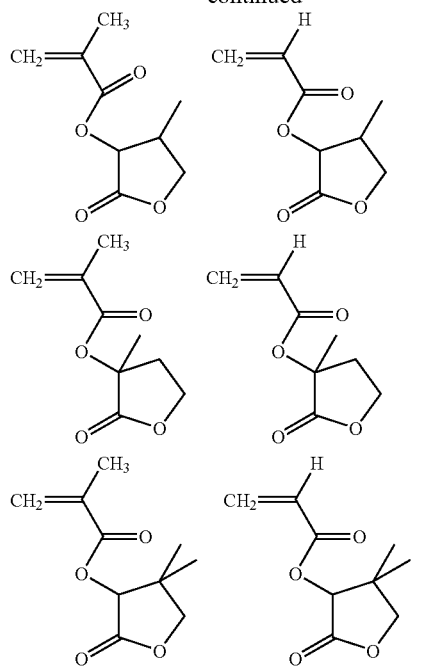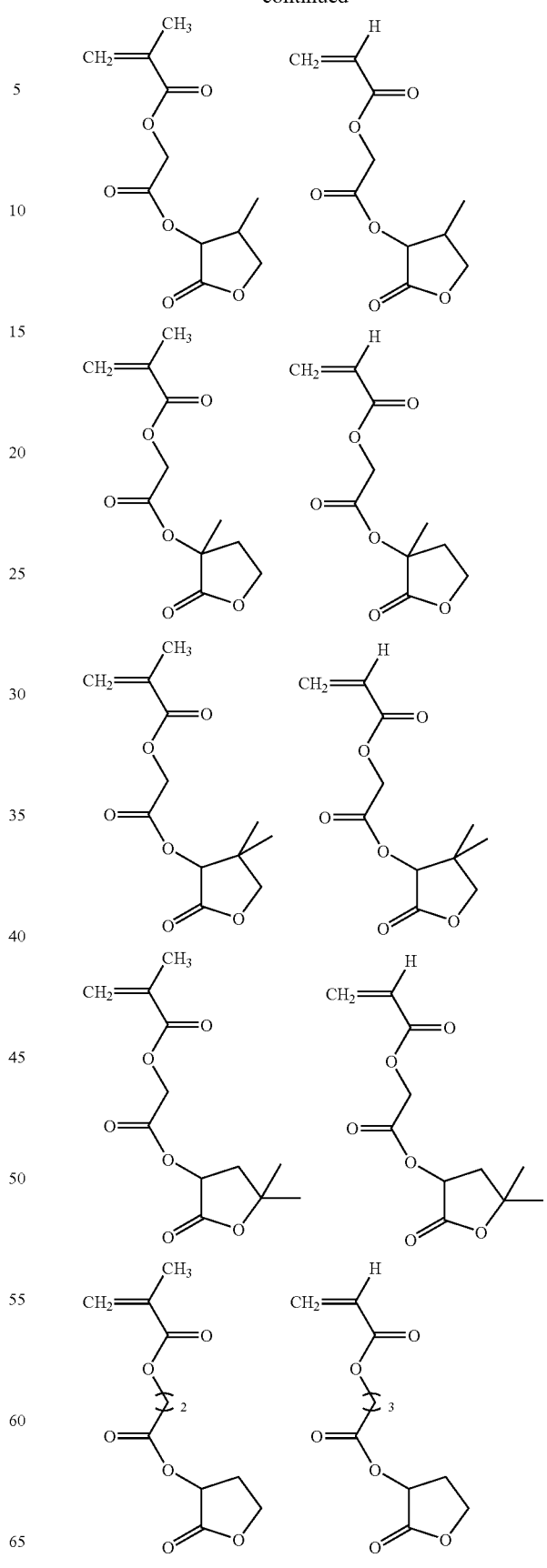

-continued
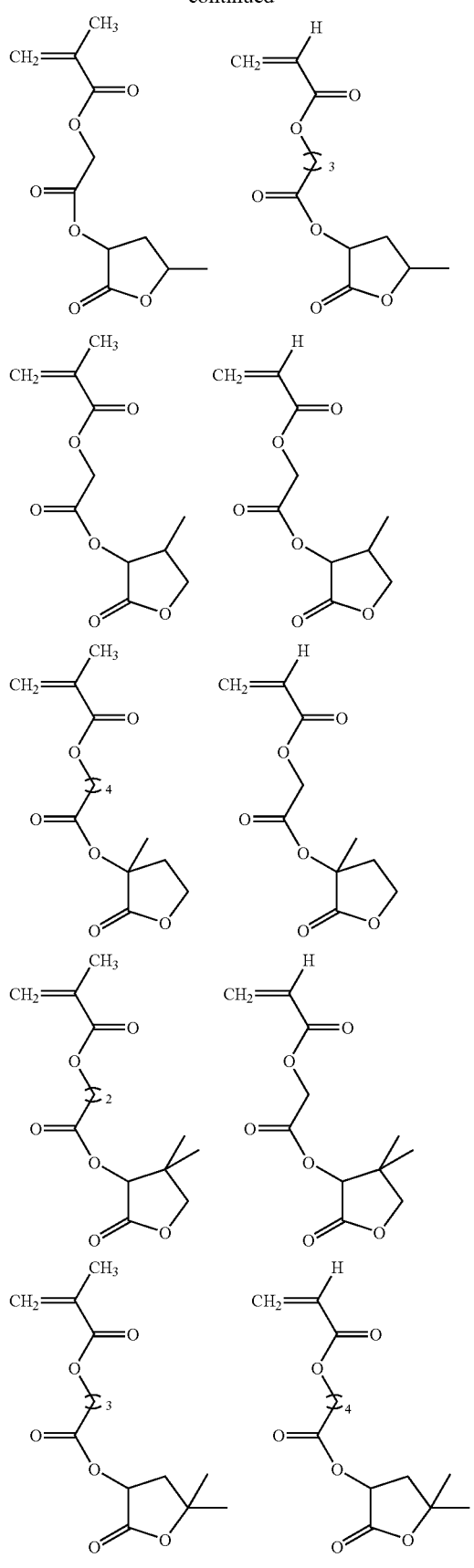
Specific examples of the monomer used to give the structural units represented by the formulae (IIIb) and (IIIh) include the followings:
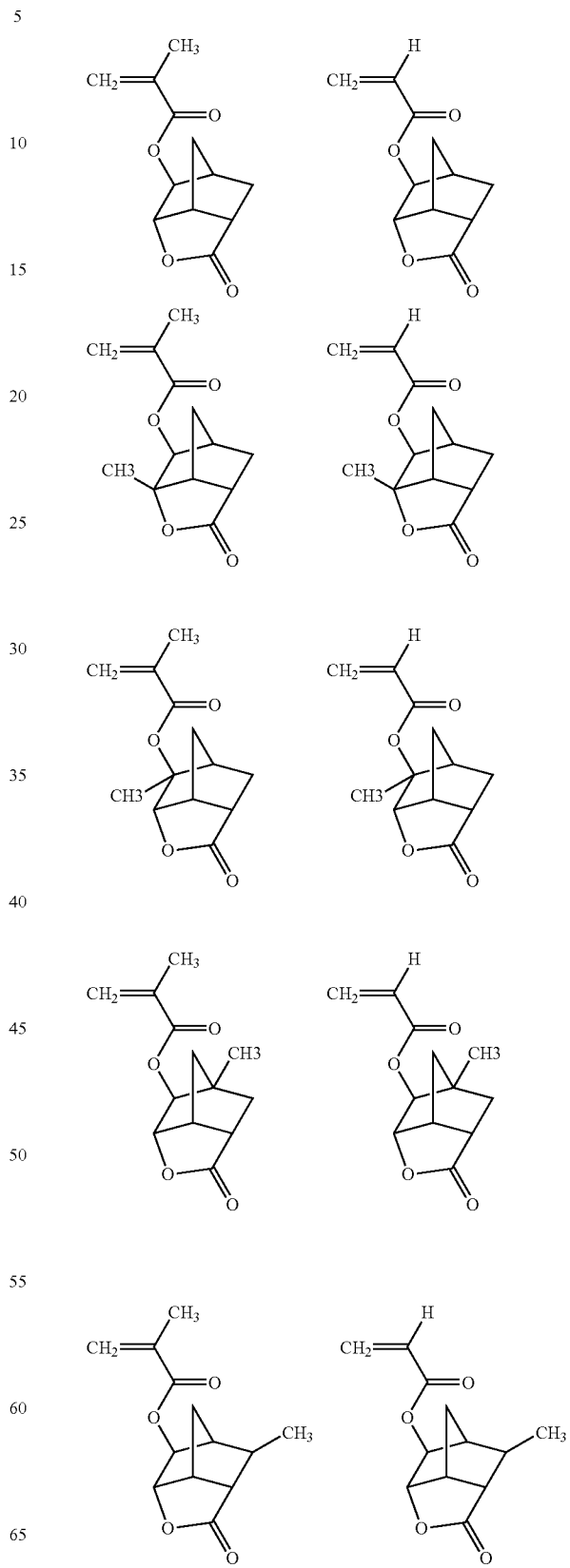

-continued
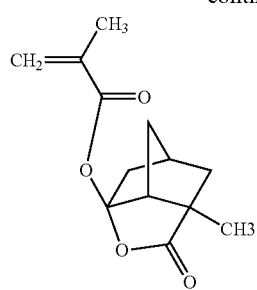 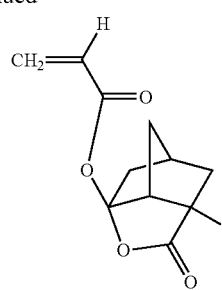
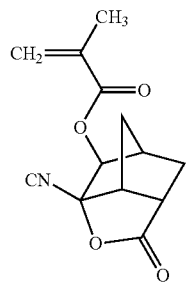 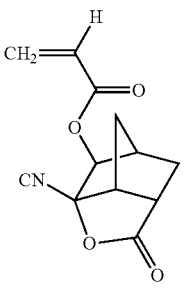
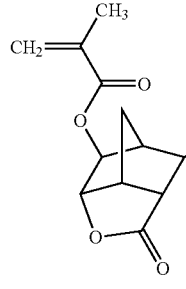 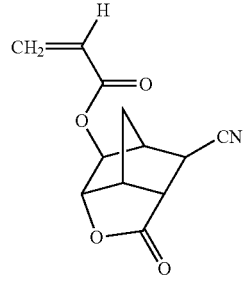
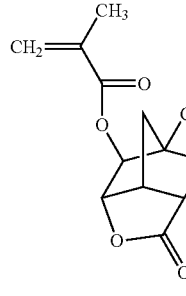 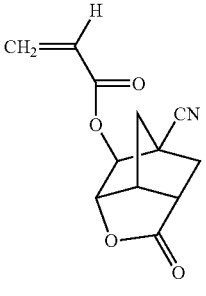
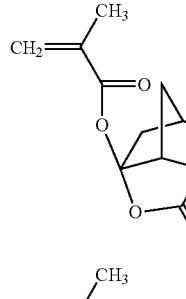 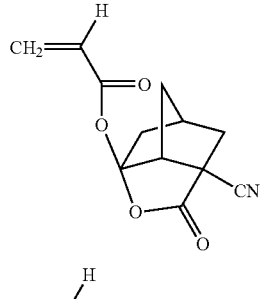
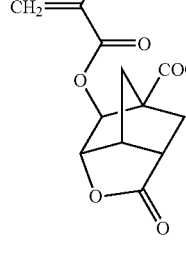 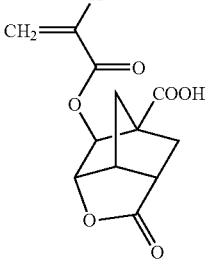
-continued
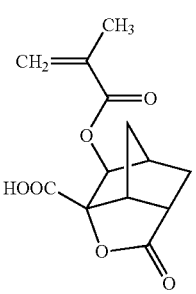 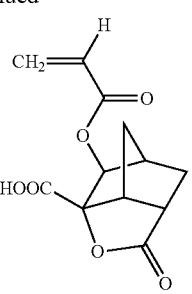
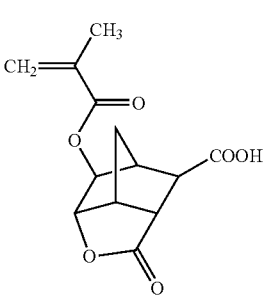
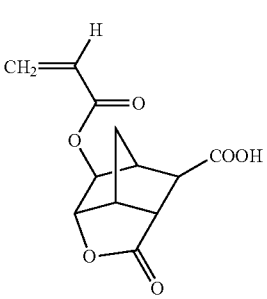
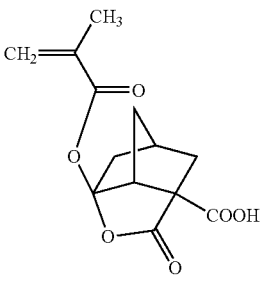
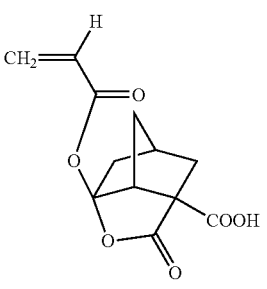

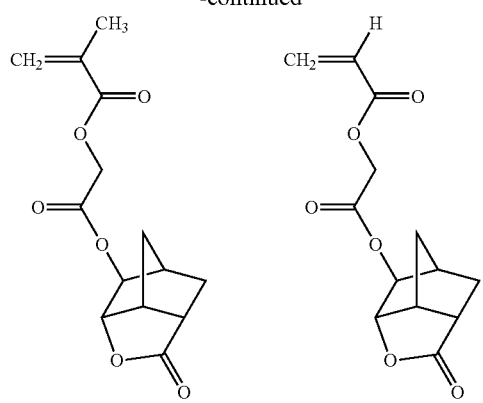
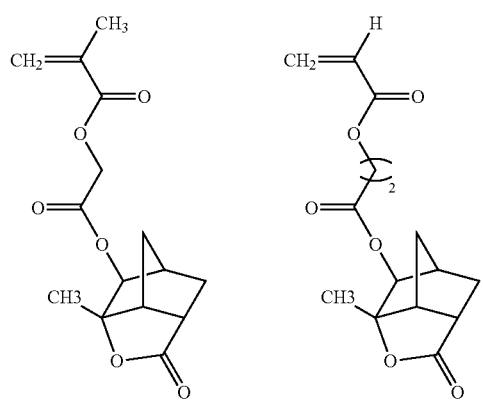
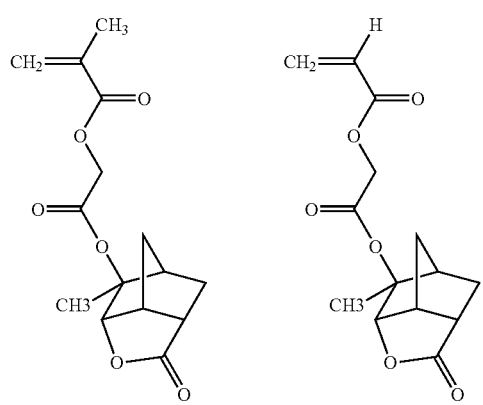
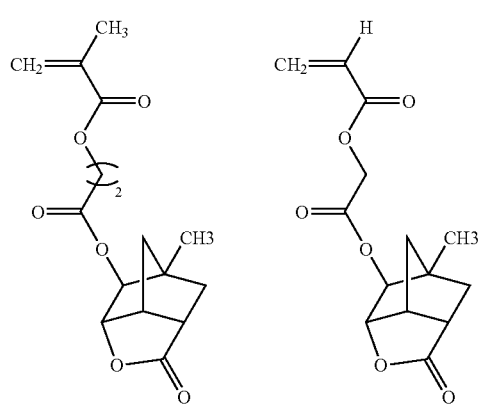
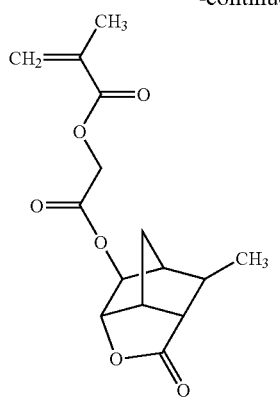
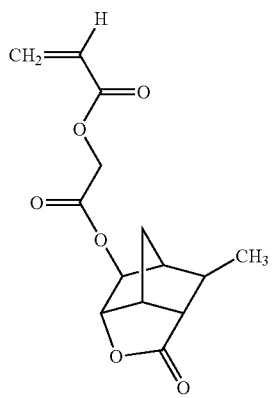
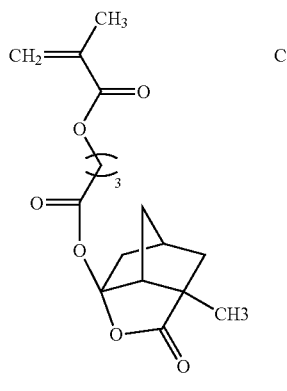
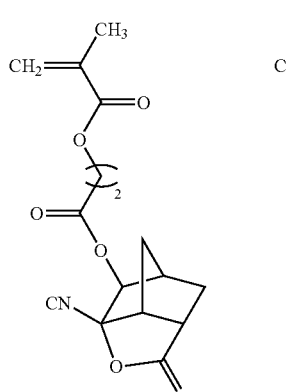

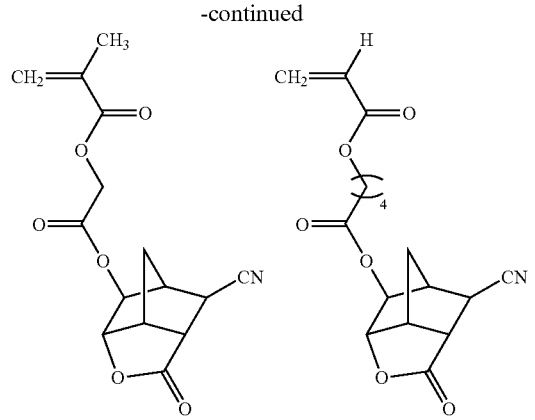
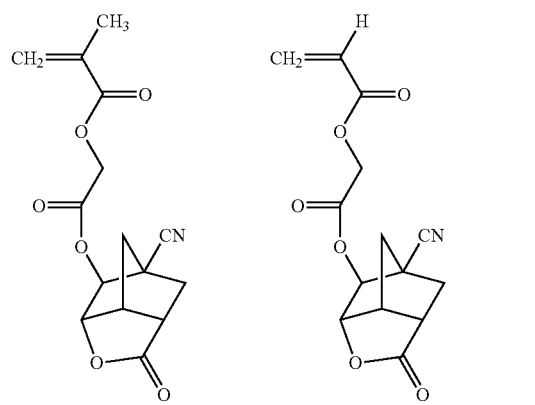
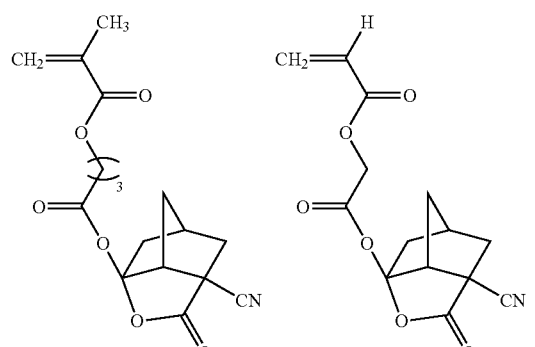
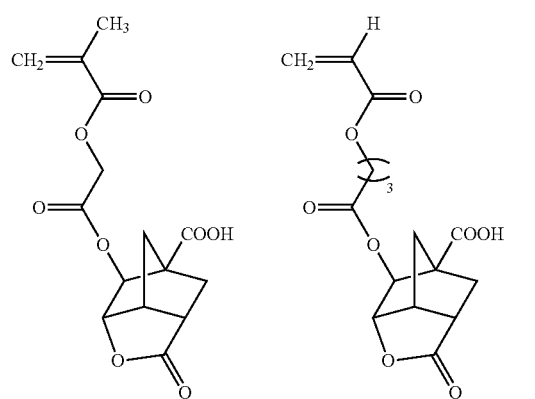
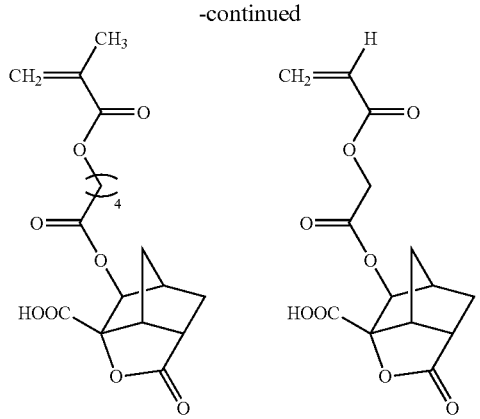
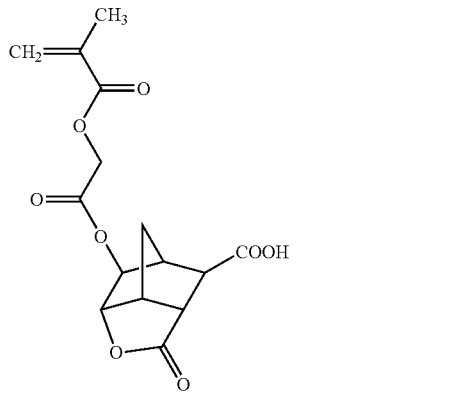
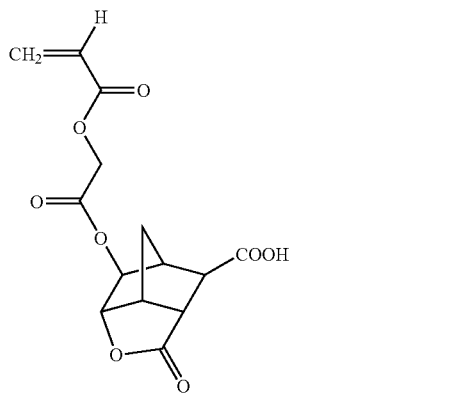

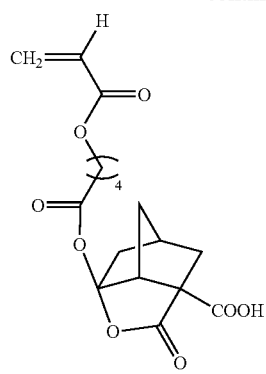
Specific examples of the monomer used to give the structural units represented by the formulae (IIIc) and (IIIi) include the followings:
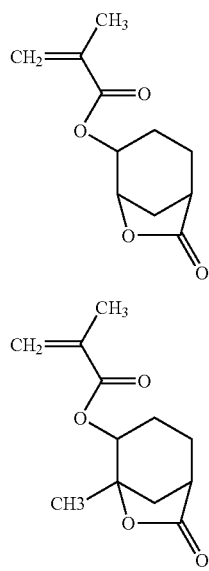
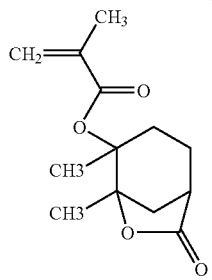 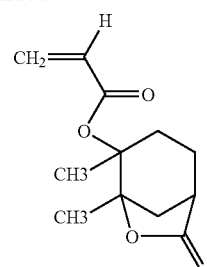
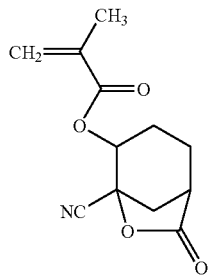 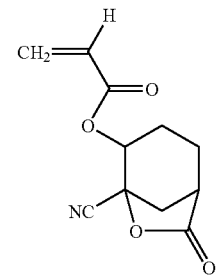
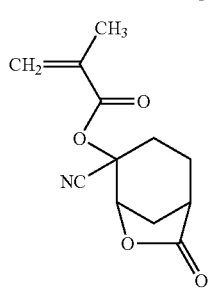 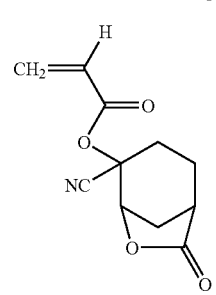
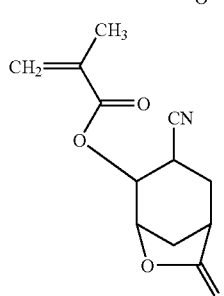 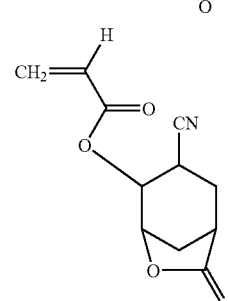
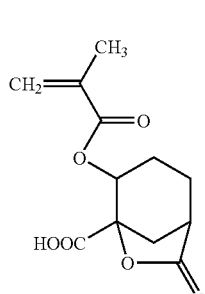 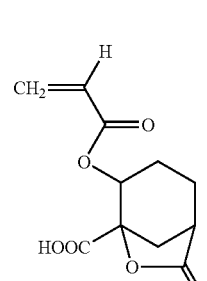
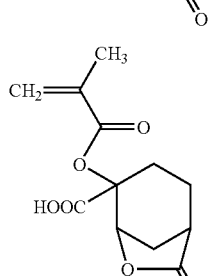 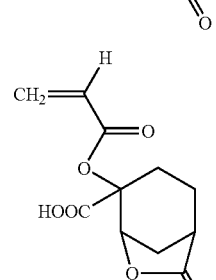

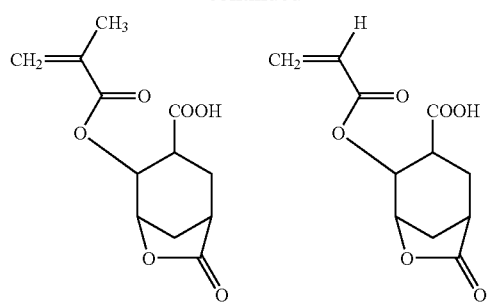
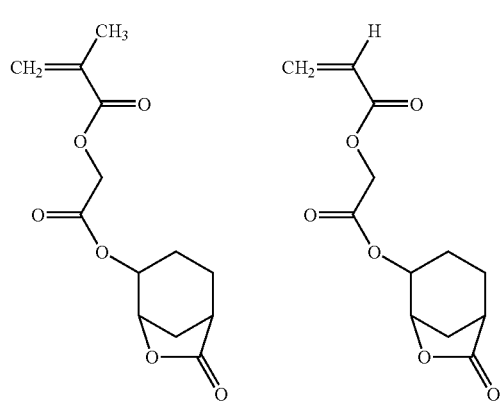
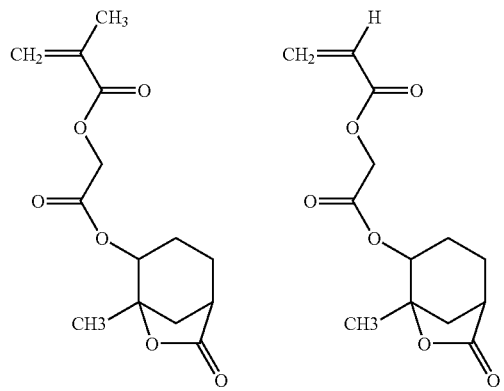
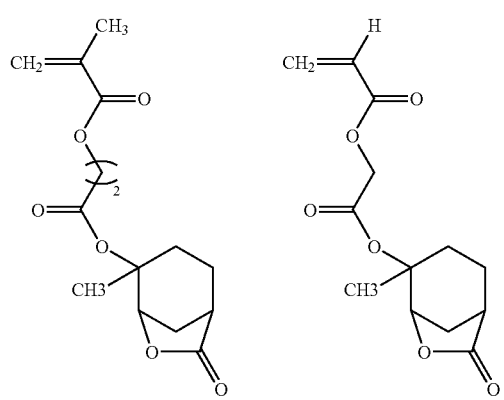
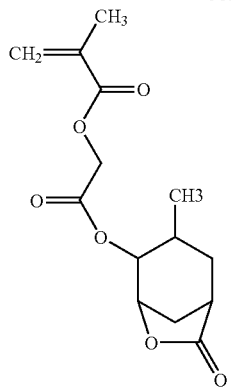
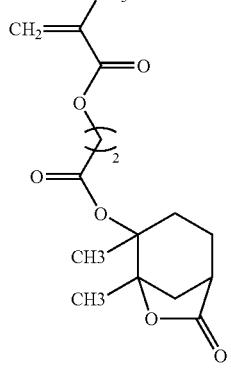
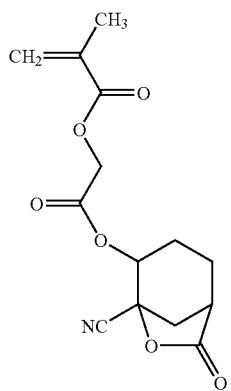
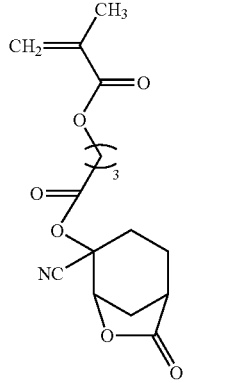

-continued
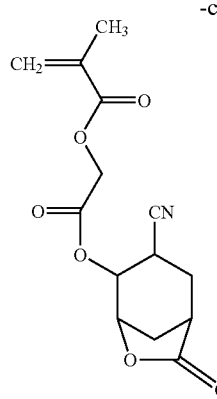
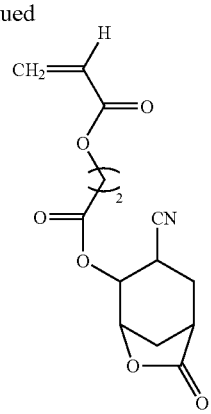
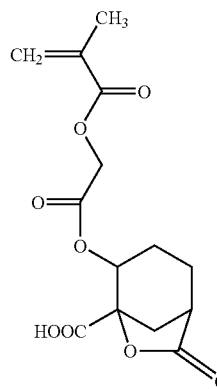
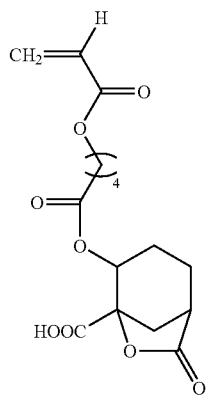
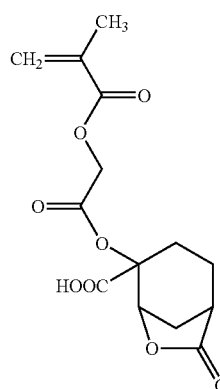
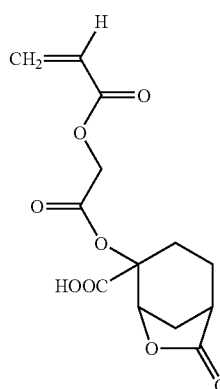
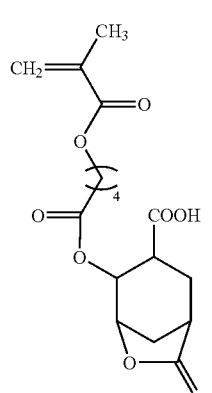
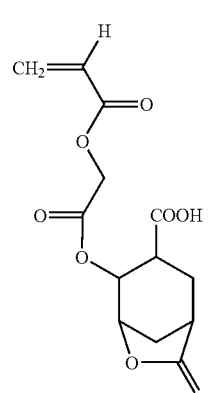
Specific examples of the monomer used to give the structural units represented by the formulae (IIId) and (IIIj) include the followings:
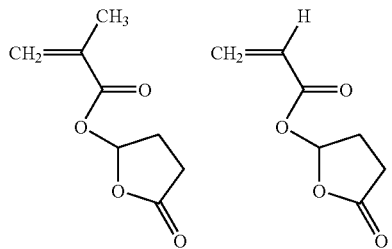
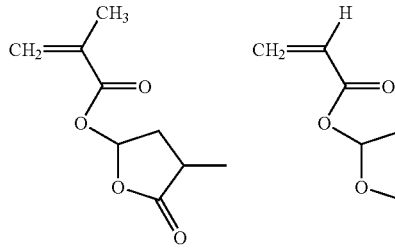
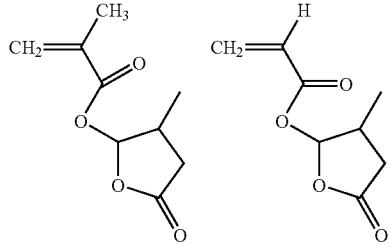
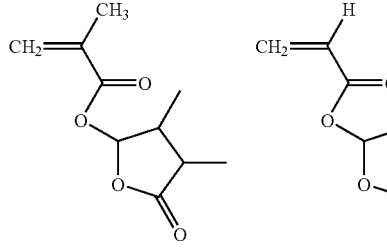
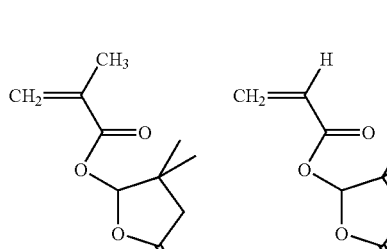
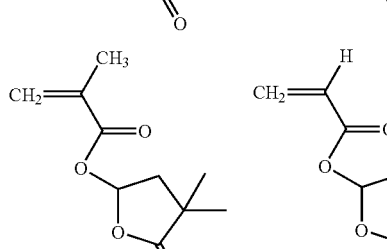

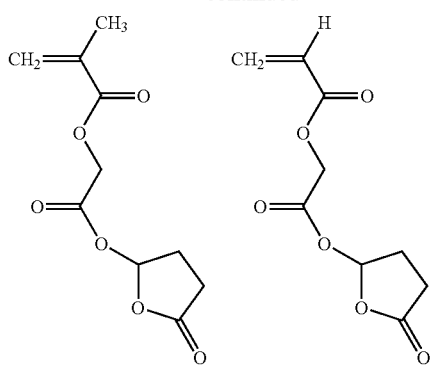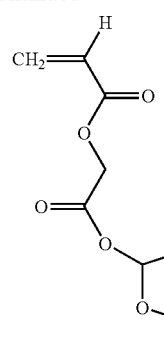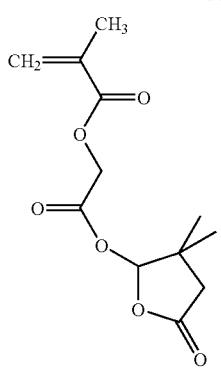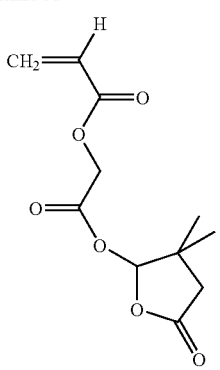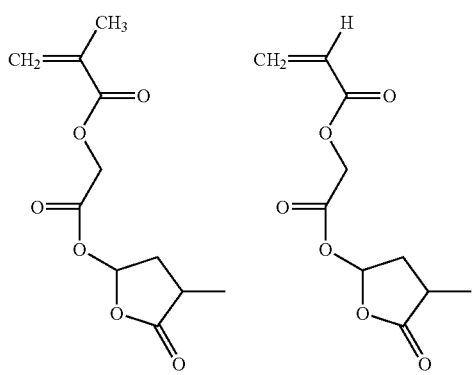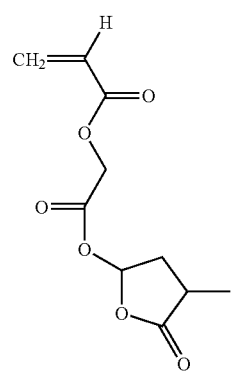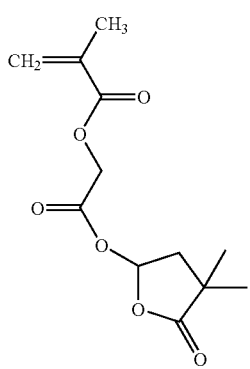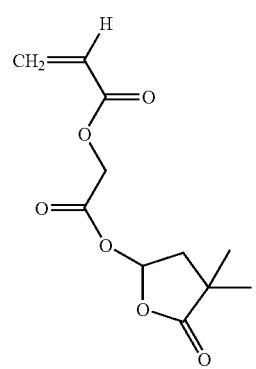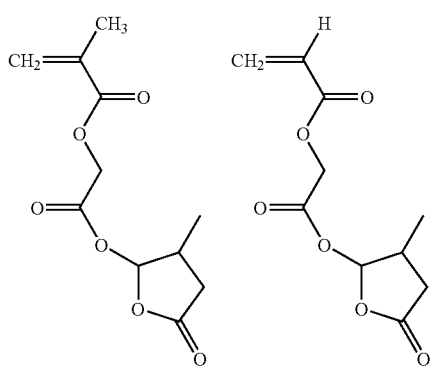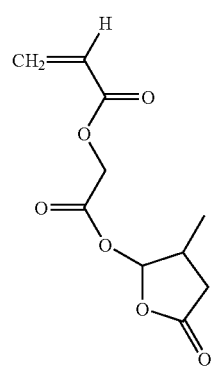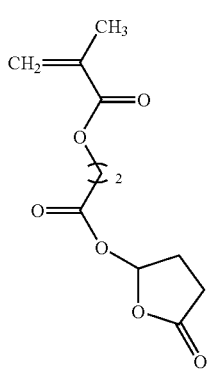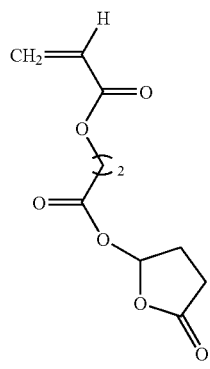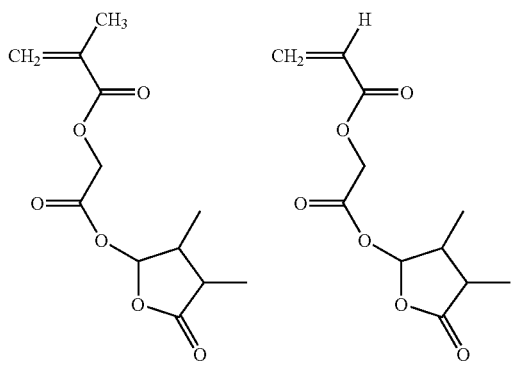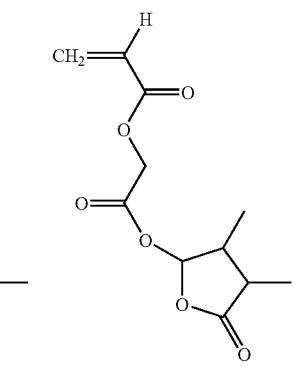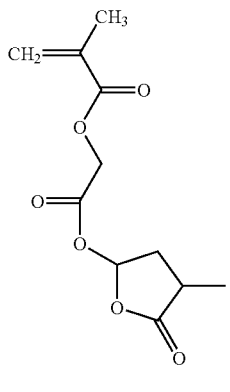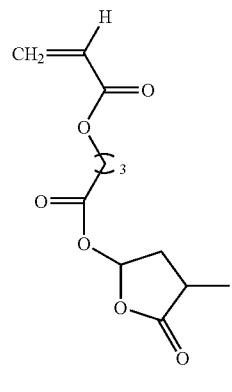

-continued
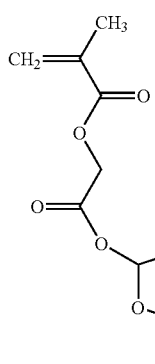
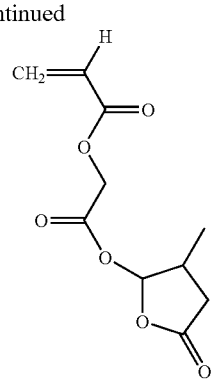
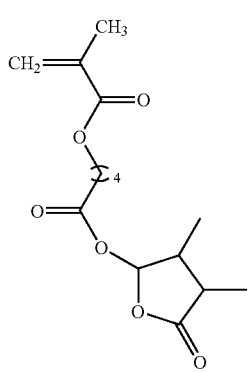
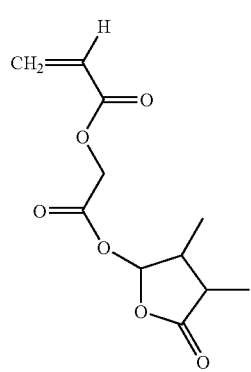
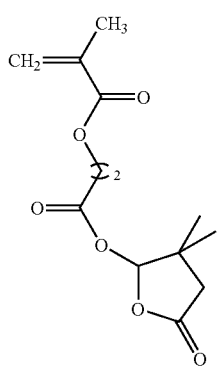
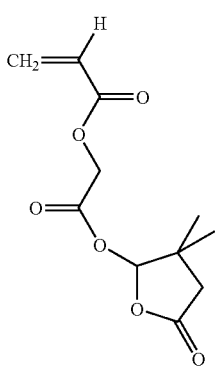
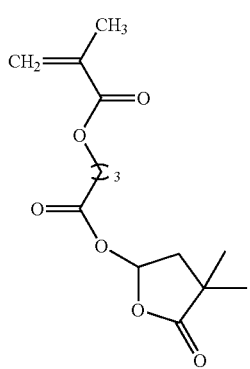
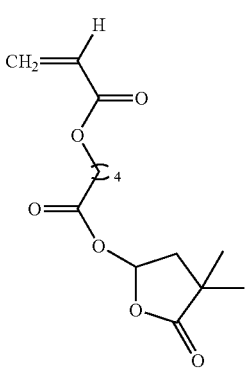
Specific examples of the monomer used to give the structural units represented by the formulae (IIIe) and (IIIk) include the followings:
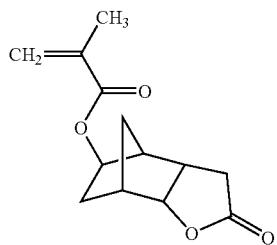
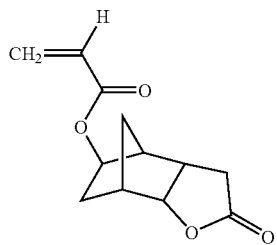
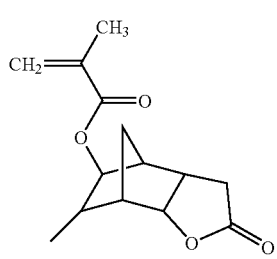
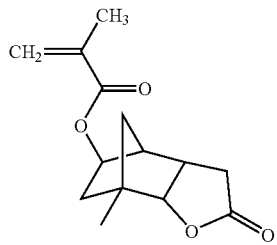
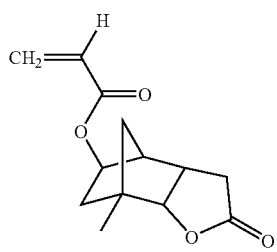
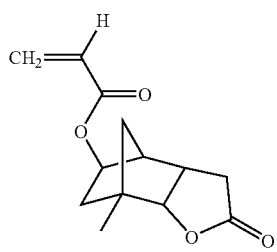

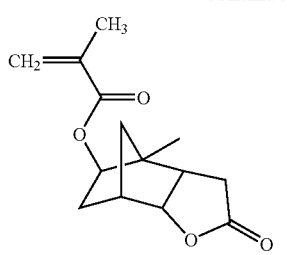
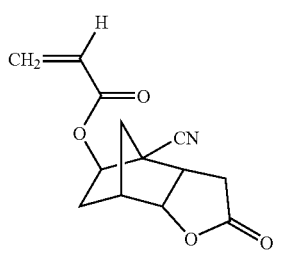
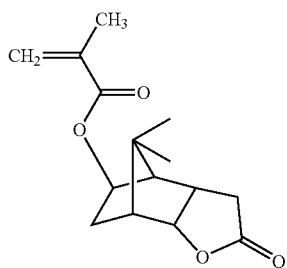
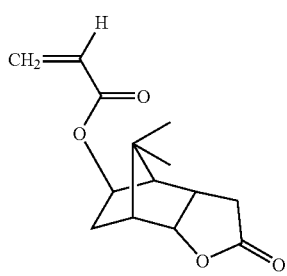
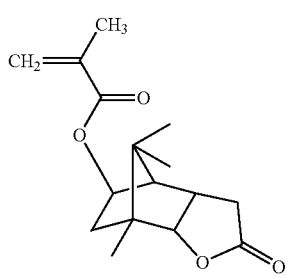
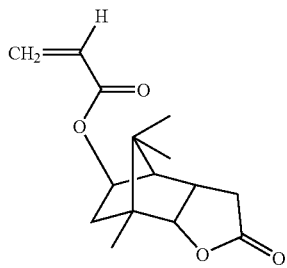
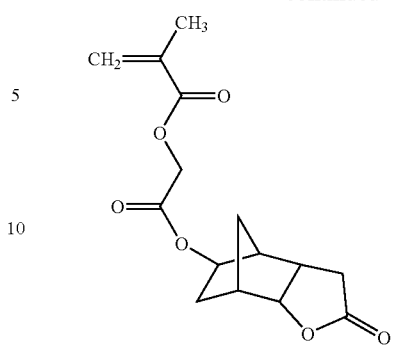
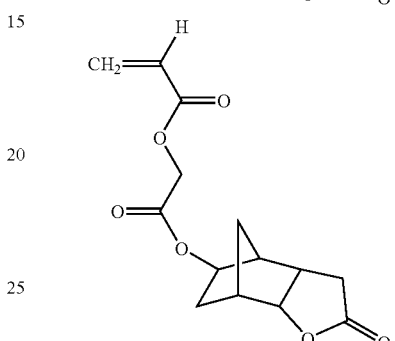
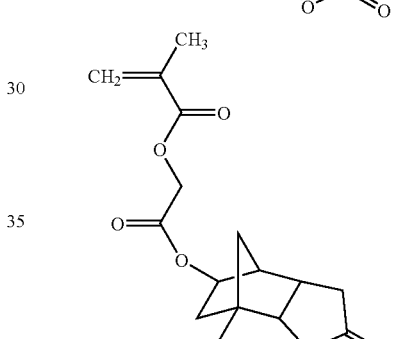
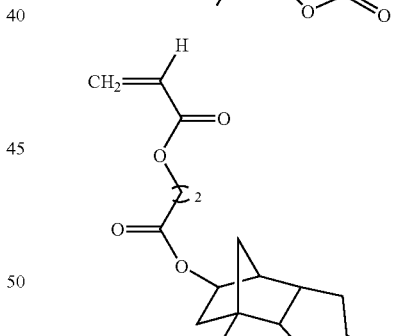
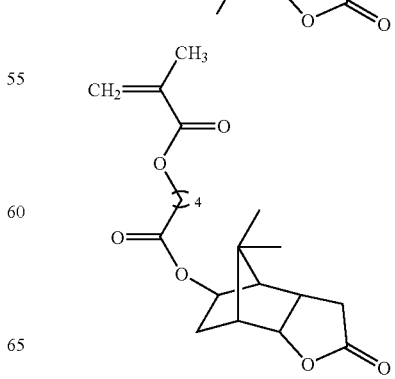

-continued
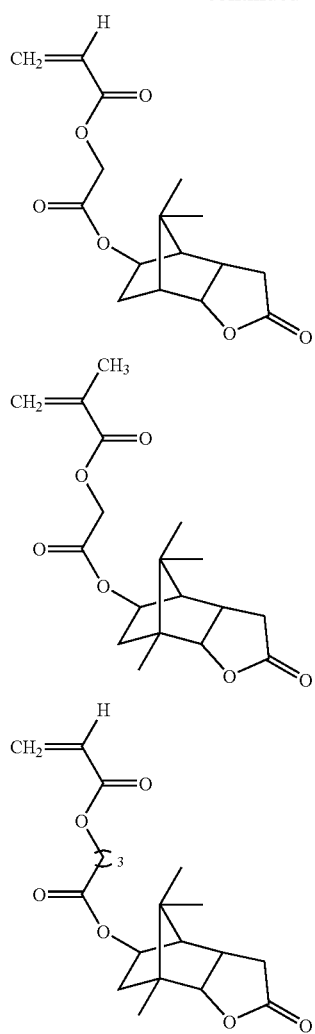
Specific examples of the monomer used to give the structural units represented by the formulae (IIIf) and (IIIl) include the followings:
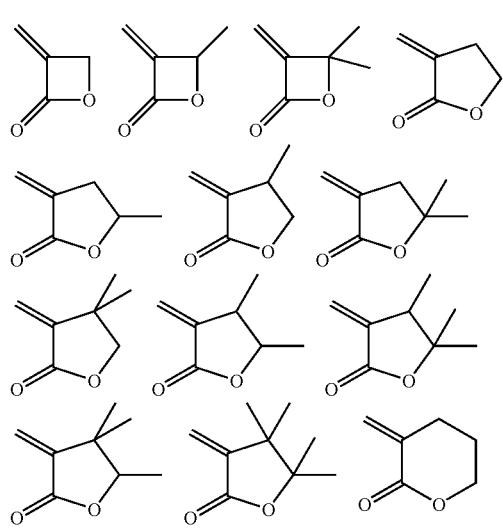
-continued
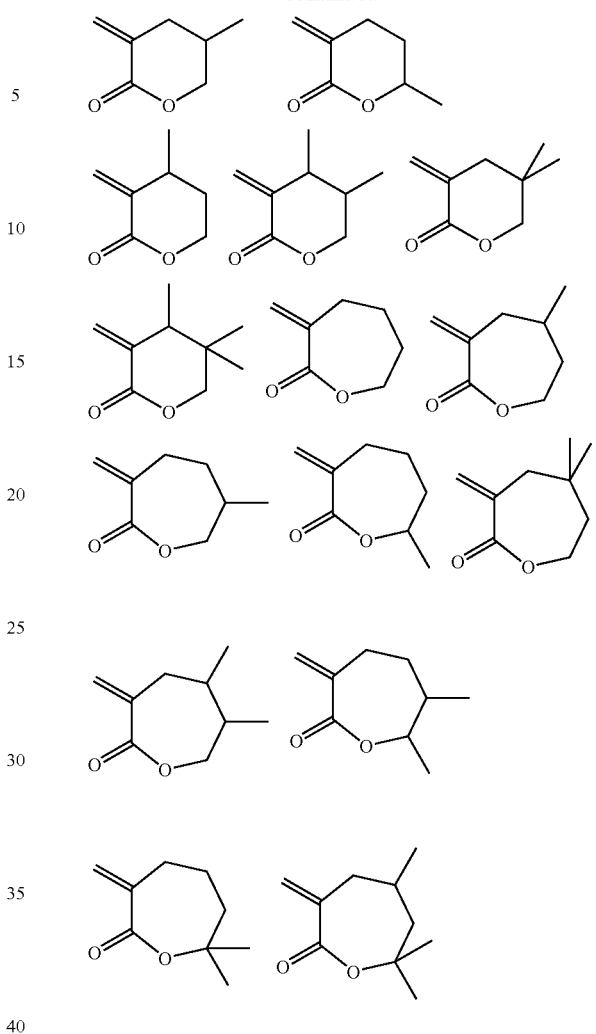
Among these monomers, the followings are preferable.
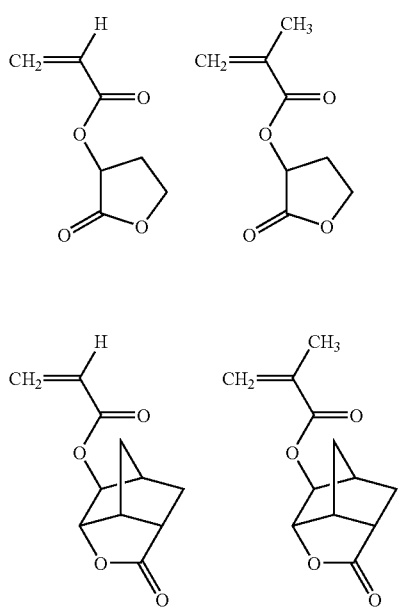

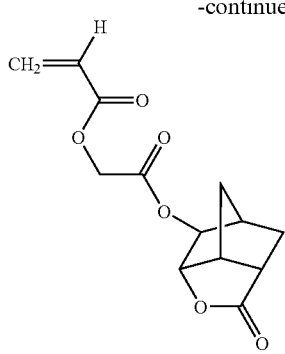

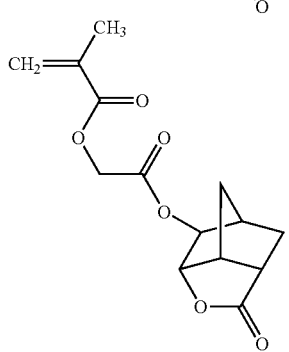

Among the above-mentioned monomers, acryloyloxy-γ-butyrolactone can be produced by reacting the corresponding α- or β-bromo-γ-butyrolactone with acrylic acid, or reacting the corresponding α- or β-hydroxy-γ-butyrolactone with an acryloyl halide, and methacryloyloxy-γ-butyrolactone can be produced by reacting the corresponding α- or β-bromo-γ-butyrolactone with methacrylic acid, or reacting the corresponding α- or β-hydroxy-γ-butyrolactone with a methacryloyl halide.

Among the above-mentioned monomers, examples of the monomer used to give the structural unit represented by the formulae (IIIb), (IIIc), (IIIh) and (IIIi) include an acrylate and methacrylate of the following alicyclic lactone having a hydroxyl group.

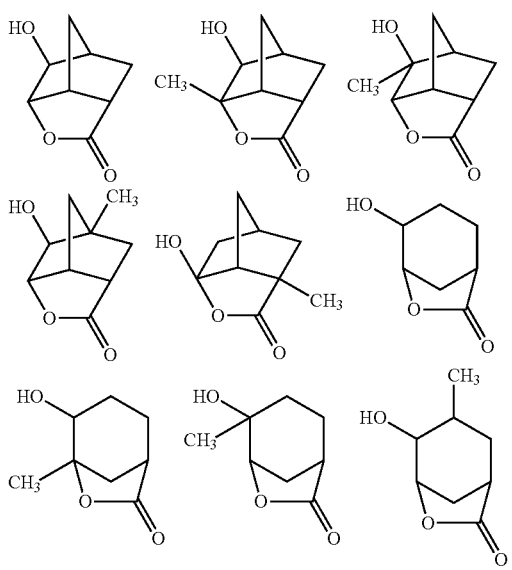

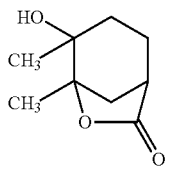

The above-mentioned acrylate and methacrylate of the alicyclic lactone having a hydroxyl group can be produced, for example, by reacting corresponding alicyclic lactone having a hydroxyl group with acryloyl halide or methacryloyl halide described in JP 2000-26446 A.

The structural unit (b2) has a fluorine-containing group. The structural unit (b2) may have two or more fluorine-containing groups.

Examples of the fluorine-containing group include an alkyl group which is substituted with at least one fluorine atom, an alkoxy group which is substituted with at least one fluorine atom and an alkoxycarbonyl group which is substituted with at least one fluorine atom and may be substituted with an alkoxy group or an alkoxy group substituted with at least one fluorine atom.

The structural unit (b2) may also have one or more hydroxyl groups in addition to the fluorine-containing group.

As the structural unit (b2), a structural unit derived from an optionally substituted acrylic compound is preferable. Examples of the optionally substituted acrylic compound include those as same as described above.

Preferable examples of the structural unit (b2) include a structural unit represented by the formula (IV) (hereinafter, simply referred to as the structural unit (IV)).

In the structural unit (IV), $R^{25}$ represents a hydrogen atom or a methyl group, and AR represents a C1-C30 fluorine-containing alkyl group which may contain one to five hydroxyl groups and at least one heteroatom selected from the group consisting of a oxygen atom, a nitrogen atom and a sulfur atom.

Examples of the C1-C30 fluorine-containing alkyl group include a C1-C30 perfluoroalkyl group such as a trifluoromethyl group, a pentafluoroethyl group, a heptafluoropropyl group and a nonafluorobutyl group; a C1-C30 perfluoroalkoxyalkyl group such as a 1-trifluoromethoxyethyl group and a 1-pentafluoroethoxyethyl group; a C1-C30 perfluoroalkoxyperfuloroalkyl group such as a 1-trifluoromethoxydifluoroethyl group and a 1-pentafluoroethoxydifluoroethyl group; and the following:

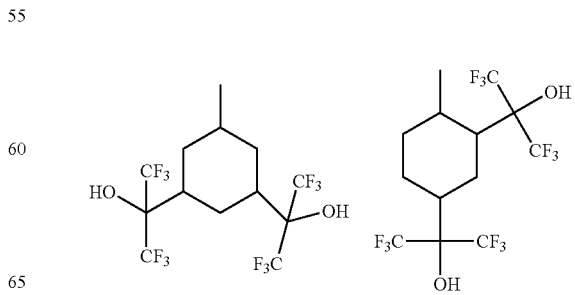

-continued
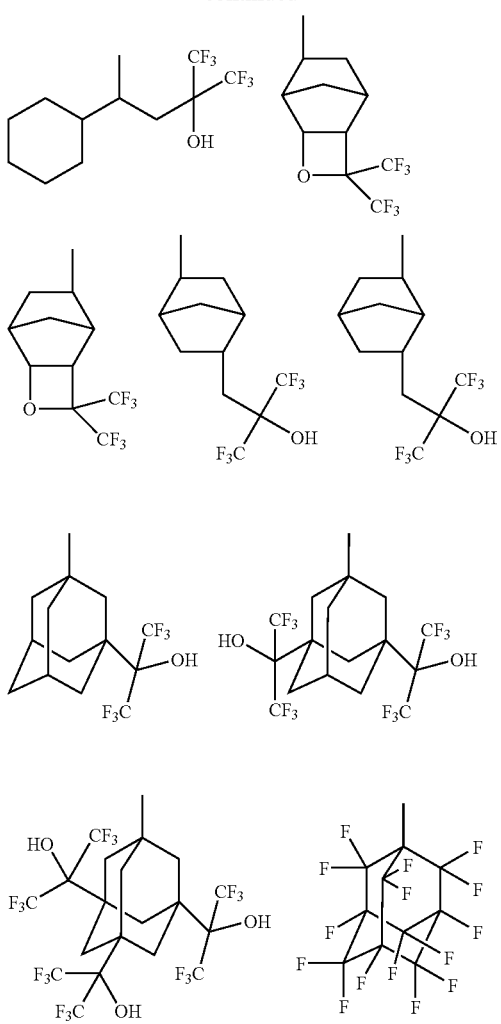
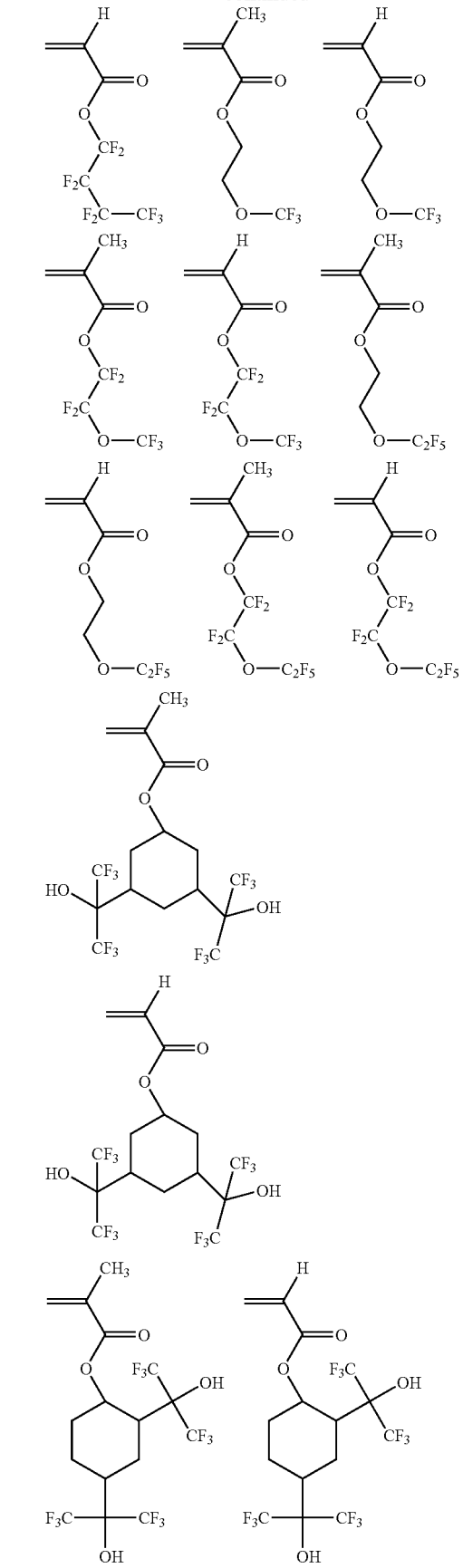
In the formulae above, straight line with an open end shows a bond extended from the adjacent oxygen group.
As the structural unit (IV), the structural unit derived from the following monomer is exemplified.
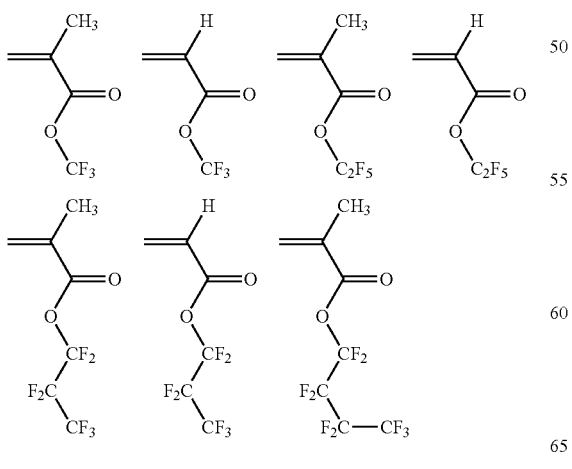

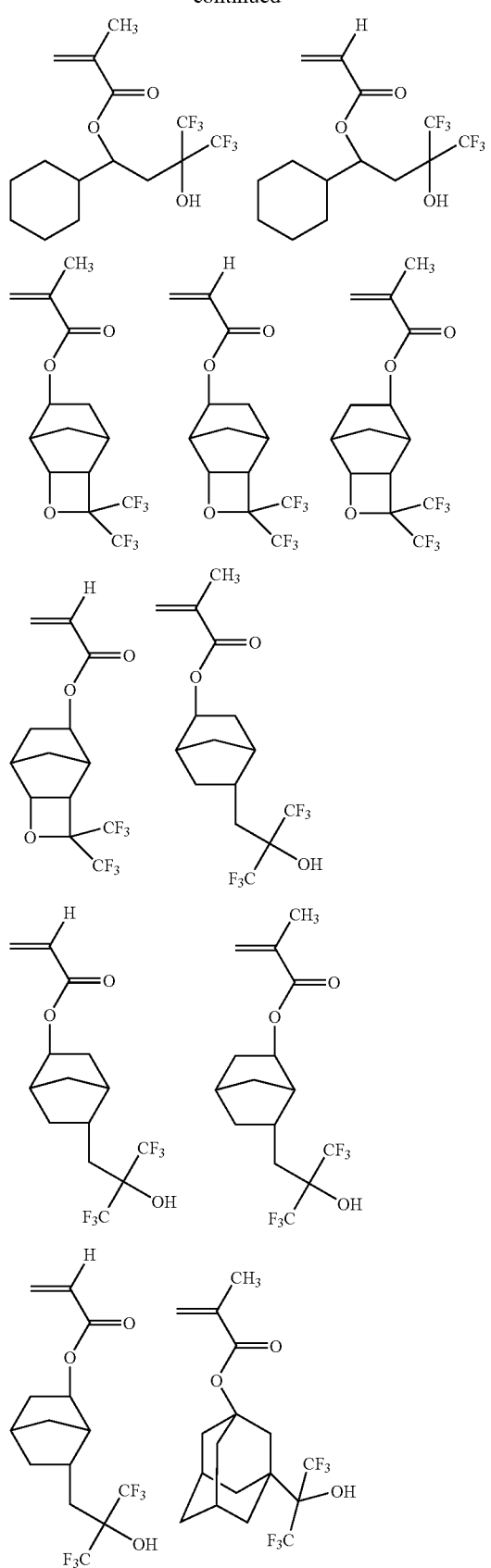
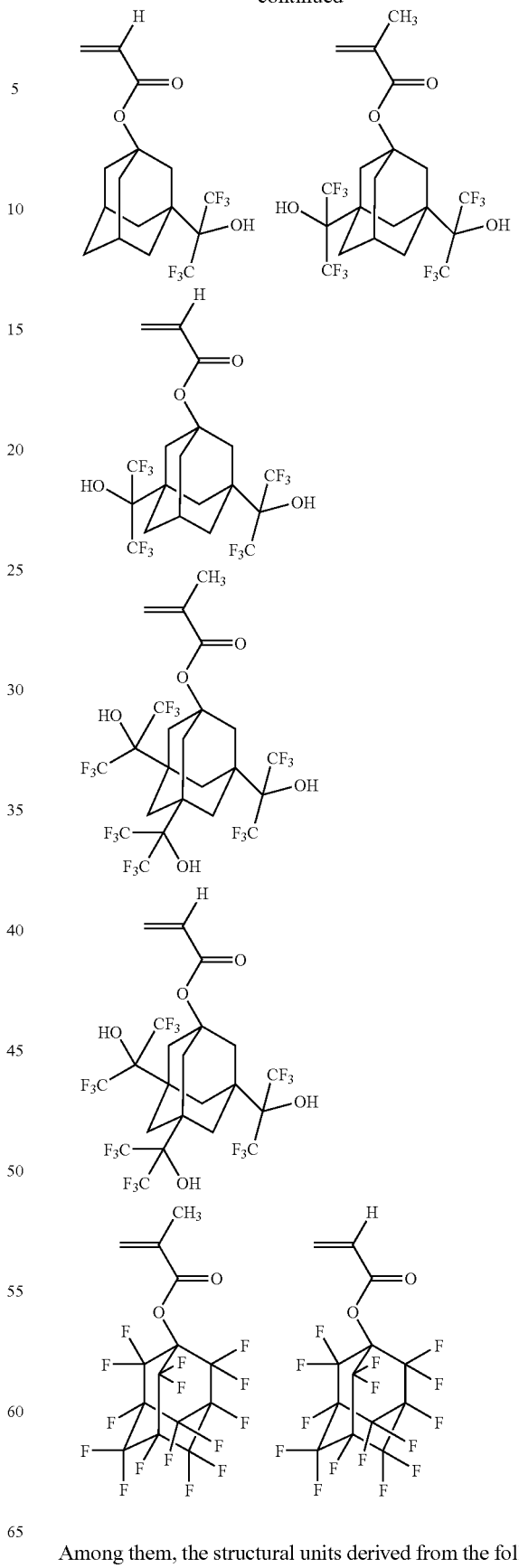
Among them, the structural units derived from the following monomers are preferable since excellent resolution is obtained when the resin containing the structural unit derived from such monomer is used in the present resist composition.

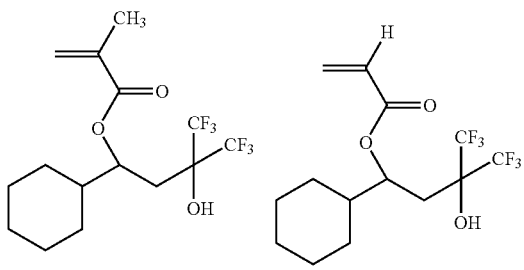

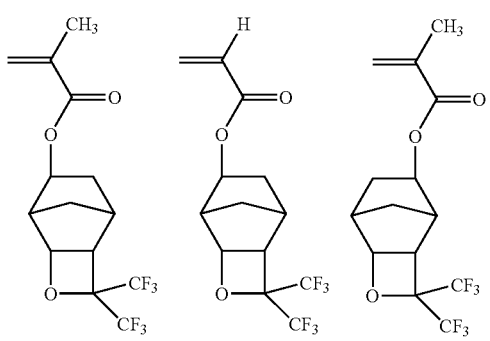

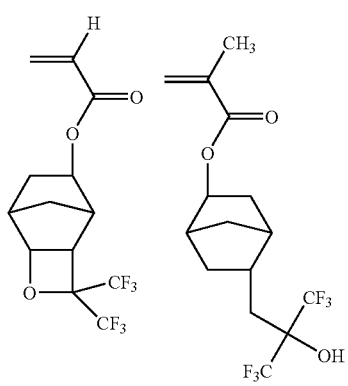

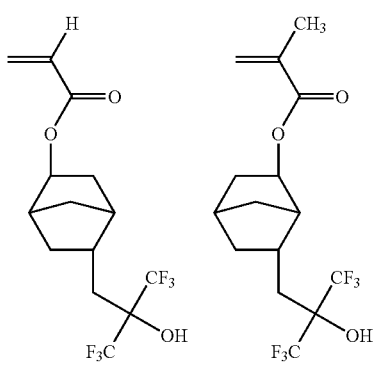

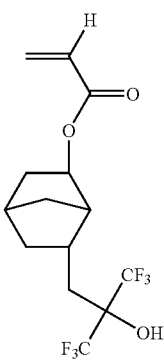

The resin (A) and (B) may contain the other structural unit or units in addition to the above-mentioned structural unit. The resin containing the structural unit derived from 2-norbornene shows strong structure because an alicyclic group is directly present on its main chain and shows a property that dry etching resistance is excellent.

The structural unit derived from 2-norbornene can be introduced into the main chain by radical polymerization using, for example, aliphatic unsaturated dicarboxylic anhydrides such as maleic anhydride and itaconic anhydride together in addition to 2-norbornene. The structural unit derived from 2-norbornene is formed by opening of its double bond, and can be represented by the formula (d):

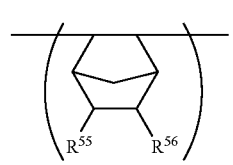

(d)

wherein, $R^{55}$ and $R^{56}$ each independently represents a hydrogen atom, a C1-C3 alkyl group, a C1-C3 hydroxyalkyl group, a carboxyl group, a cyano group or —$COOU^1$ group in which $U^1$ represents an alcohol residue, provided that the alcohol residue is not an acid-labile group, or $R^{55}$ and $R^{56}$ may be bonded together to form a carboxylic anhydride residue represented by —C(=O)OC(=O)—.

The structural unit derived from maleic anhydride and the structural unit derived from itaconic anhydride which are the structural unit derived from aliphatic unsaturated dicarboxylic anhydrides are formed by opening of their double bonds, and can be represented by the formula (e) and the formula (f), respectively.

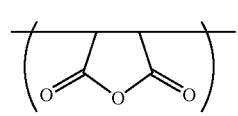

(e)

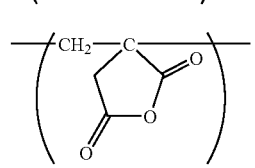

(f)

In $R^{55}$ and $R^{56}$, examples of the C1-C3 alkyl group include a methyl group, an ethyl group, a 1-propyl group and an isopropyl group, and examples of the C1-C3 hydroxyalkyl group include a hydroxymethyl group and a 2-hydroxyethyl group.

In $R^{55}$ and $R^{56}$, —$COOU^1$ group is an ester formed from a carboxyl group, and Examples of the alcohol residue corresponding to $U^1$ include optionally substituted primary or secondary alkyl groups having about 1 to 8 carbon atoms, a 2-oxooxolan-3-yl and a 2-oxooxolan-4-yl. Examples of the substituent on the alkyl group include a hydroxyl group and an alicyclic hydrocarbon residues.

Specific examples of the monomer used to give the structural unit represented by the formula (d) include 2-norbornene, 2-hydroxy-5-norbornene, 5-norbornen-2-carboxylic acid, methyl 5-norbornen-2-carboxylate, 2-hydroxyethyl 5-norbornen-2-carboxylate, 5-norbornen-2-methanol, 5-norbornen-2,3-dicarboxylic acid anhydride, and the like.

A structural unit represented by the formula (g):

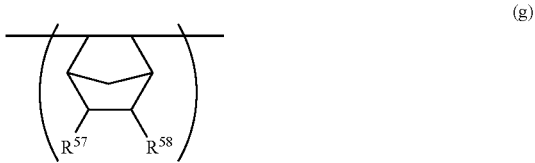

(g)

wherein, any one of $R^{57}$ and $R^{58}$ represents —$COOU^2$ group in which $U^2$ represents an acid-labile group, and the other represents a hydrogen atom, a C1-C3 alkyl group, a C1-C3 hydroxyalkyl group, a carboxyl group, a cyano group or —$COOU^3$ group in which $U^3$ represents an alcohol residue, is a structural unit having acid-labile group even if it has norbornene structure, and the structural units (a1) and (b1) also include the structural unit represented by the formula (g).

Examples of monomers giving the structural unit represented by the formula (g) include t-butyl 5-norbornen-2-carboxylate, 1-cyclohexyl-1-methylethyl 5-norbornen-2-carboxylate, 1-methylcyclohexyl 5-norbornen-2-carboxylate, 2-methyl-2-adamantyl 5-norbornen-2-carboxylate, 2-ethyl-2-adamantyl 5-norbornen-2-carboxylate, 1-(4-methylcyclohexyl)-1-methylethyl 5-norbornen-2-carboxylate, 1-(4-hydroxylcyclohexyl)-1-methylethyl 5-norbornen-2-carboxylate, 1-methyl-1-(4-oxocyclohexyl)ethyl 5-norbornen-2-carboxylate, 1-(1-adamantyl)-1-methylethyl 5-norbornen-2-carboxylate, and the like.

A structural unit represented by the formula (h):

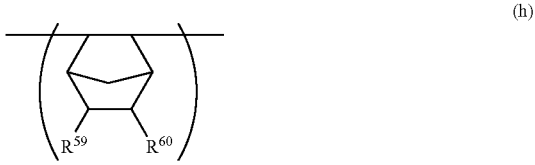

(h)

wherein, any one of $R^{59}$ and $R^{60}$ represents a C1-C3 fluorine-containing alkyl group, a C1-C3 fluorine-containing hydroxyalkyl group or —$COOU^4$ group in which $U^4$ represents a fluorine-containing alcohol residue, provided that the fluorine-containing alcohol residue is not an acid-labile group, and the other represents a hydrogen atom, a C1-C3 alkyl group which may be substituted with at least one fluorine atom, a C1-C3 hydroxyalkyl group which may be substituted with at least one fluorine atom, a carboxyl group, a cyano group or —$COOU^5$ group in which $U^5$ represents an alcohol residue, provided that the alcohol residue is not an acid-labile group is a structural unit having a fluorine-containing group, and the structural unit (b2) also includes the structural unit represented by the formula (h).

The resin (A) and (B) can be produced, for example, by polymerizing the corresponding monomer or monomers. The resin (A) and (B) can be also produced by conducting oligomerization of the corresponding monomer or monomers followed by polymerizing the oligomer obtained.

For example, resin (A) containing the structural unit (Ia), the structural unit (IIa) and the structural unit represented by the formula (IIIh) respectively as the structural unit (a1), the structural unit (a3) and the structural unit (a4) can be produced, for example, by polymerizing a monomer used to give the structural unit (Ia), a monomer used to give the structural unit (IIa) and a monomer used to give the structural unit represented by the formula (IIIh).

For example, resin (B) containing the structural unit (Ia), the structural unit (IIb), the structural unit represented by the formula (IIIb) and the structural unit (IV) respectively as the structural unit (b1), the structural unit (b3), the structural unit (b4) and the structural unit (b2) can be produced, for example, by polymerizing a monomer used to give the structural unit (Ia), a monomer used to give the structural unit (IIb), a monomer used to give the structural unit represented by the formula (IIIb) and a monomer used to give the structural unit (IV).

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited. When the mixture of two kinds of radical initiators is used, preferred examples of the combination include a combination of 2,2'-azobisisobutyronitrile and 2,2'-azobis(2,4-dimethylvaleronitrile), a combination of 2,2'-azobis(2,4-dimethylvaleronitrile) and 2,2'-azobis(2-methylbutyronitrile), a combination of 2,2'-azobis(2,4-dimethylvaleronitrile) and 1,1'-azobis(cyclohexane-1-carbonitrile), and a combination of 2,2'-azobis(2,4-dimethylvaleronitrile) and dimethyl-2,2'-azobis(2-methylpropionate).

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobtyl ketone; an alcohol solvent such as isopropyl alcohol; a cyclic ester solvent such as γ-butyrolactone; a glycol ether ester ester solvent such as propyleneglycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After completion of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

The present chemically amplified positive resist composition contains the acid generator. The acid generated by irradiation to the composition catalytically acts against acid-labile groups in the resin(A) and the resin (B) in the case that the resin (B) contains the structural unit (b1), cleaves the acid-labile-group, and the resin becomes soluble in an alkali aqueous solution.

The present resist composition usually includes 80 to 99.9% by weight of sum of the resins (A) and (B) and 0.1 to 20% by weight of the acid generator based on the total solid content of the present composition.

Specific examples of the acid generator include a salt represented by the formula (V):

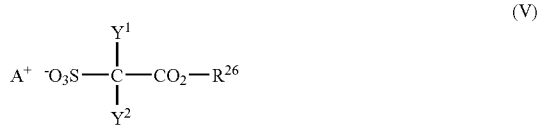

(V)

(hereinafter, simply referred to as the salt (V)).

In the salt (V), $Y^1$ and $Y^2$ each independently represents a fluorine atom or a C1-C6 perfluoroalkyl group. Examples of the C1-C6 perfluoroalkyl group include a trifluoromethyl group, a pentafluoroethyl group, a heptafluoropropyl group, a nonafluorobutyl group, a perfluorohexyl group. $Y^1$ and $Y^2$ each independently is a fluorine atom or a trifluoromethyl group. $Y^1$ and $Y^2$ are preferably the same groups.

In the salt (V), $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy group, a C1-C4 perfluoroalkyl group, a C1-C6 hydroxyalkyl group, a hydroxyl group, a cyano group, a carbonyl group or an ester group, or at least one —$CH_2$— in the monocyclic or bicyclic hydrocarbon group may be replaced with —CO— or —O—; $A^+$ represents an organic counter ion; $Y^1$ and $Y^2$ each independently represents a fluorine atom or a C1-C6 perfluoroalkyl group.

$R^{26}$ is preferably a C3-C30 monocyclic or polycyclic hydrocarbon group having a hydroxyl group or a carbonyl group, and at least one hydrogen atom in the monocyclic or polycyclic hydrocarbon group may be replaced with a C1-C6 alkyl group, a C1-C6 alkoxy group, a C1-C4 perfluoroalkyl group, a C1-C6 hydroxyalkyl group, a hydroxyl group or a cyano group.

Examples of the C1-C6 linear or branched chain hydrocarbon group include a methyl group, an ethyl group, a propyl group, an isopropyl group, an n-butyl group, an isobutyl group, a sec-butyl group, a tert-butyl group, an n-pentyl group and an n-hexyl group. Examples of the C1-C6 alkoxy group include a methoxy group, an ethoxy group, an n-propoxy group, an isopropoxy group, an n-butoxy group, an isobutoxy group, a sec-butoxy group, a tert-butoxy group, an n-pentyloxy group and an n-hexyloxy group.

Examples of the C1-C4 perfluoroalkyl group include a trifluoromethyl group, a pentafluoroethyl group, a heptafluoropropyl group and a nonafluorobutyl group. Examples of the C1-C6 hydroxyalkyl group include a hydroxymethyl group, a 2-hydroxyethyl group, a 3-hydroxypropyl group and a 4-hydroxybutyl group. Examples of the ester group include a methoxycarbonyl group, an ethoxycarbonyl group and a 2-oxotetrahydrofuran-3-yl group. Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group.

Examples of the C3-C30 monocyclic or bicyclic hydrocarbon group having a hydroxyl group or a carbonyl group include a C4-C8 cycloalkyl group having a hydroxyl group or a carbonyl group, an adamantyl group having a hydroxyl group or a carbonyl group and a norbornyl group having a hydroxyl group or a carbonyl group.

Specific examples thereof include 2-oxocyclopentyl group, 2-oxocyclohexyl group, 3-oxocyclopentyl group, 3-oxocyclohexyl group, 4-oxocyclohexyl group, 2-hydroxycyclopentyl group, 2-hydroxycyclohexyl group, 3-hydroxycyclopentyl group, 3-hydroxycyclohexyl group, 4-hydroxycyclohexyl group, 4-oxo-2-adamantyl group, 3-hydroxy-1-adamantyl group, 4-hydroxy-1-adamantyl group, 5-oxonorbornan-2-yl group, 1,7,7-trimethyl-2-xonorbornan-2-yl group, 3,6,6-trimethyl-2-oxobicyclo[3.1.1]hept-3-yl group, 2-hydroxynorbornan-3-yl group, 1,7,7-trimethyl-2-hydroxynorbornan-3-yl group, 3,6,6-trimethyl-2-hydroxybicyclo[3.1.1]hept-3-yl group, and the followings:

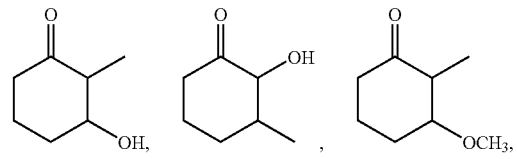

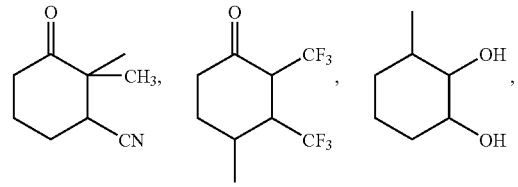

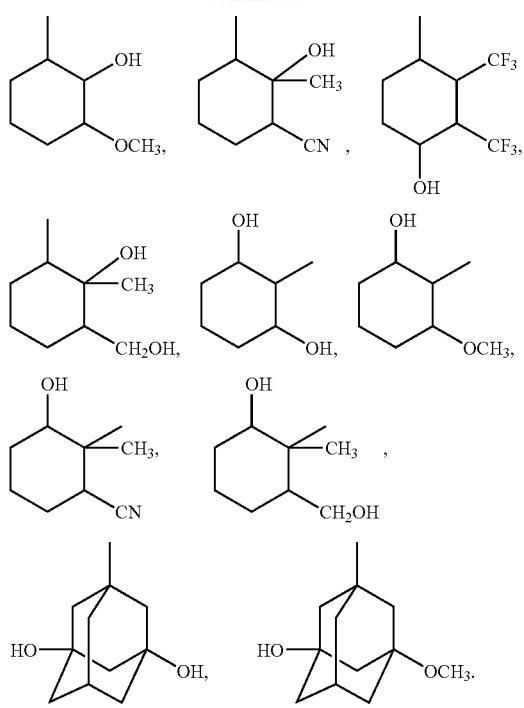
In the formulae above, straight line with an open end shows a bond which is extended from an adjacent group.
Specific examples of the anion part of the salt (V) include the followings:
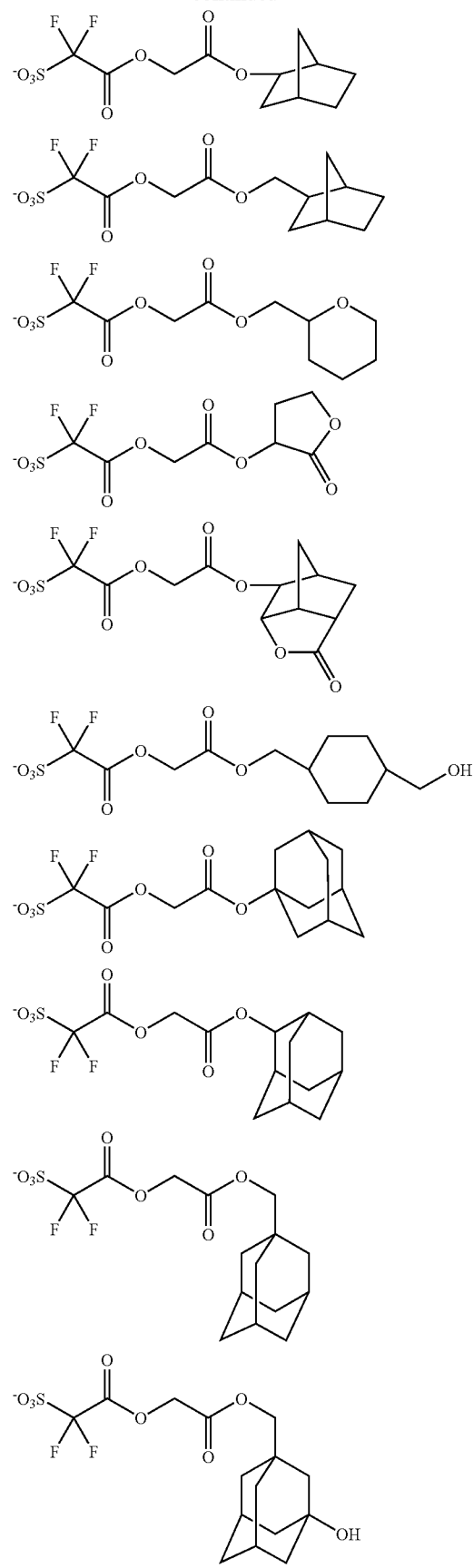

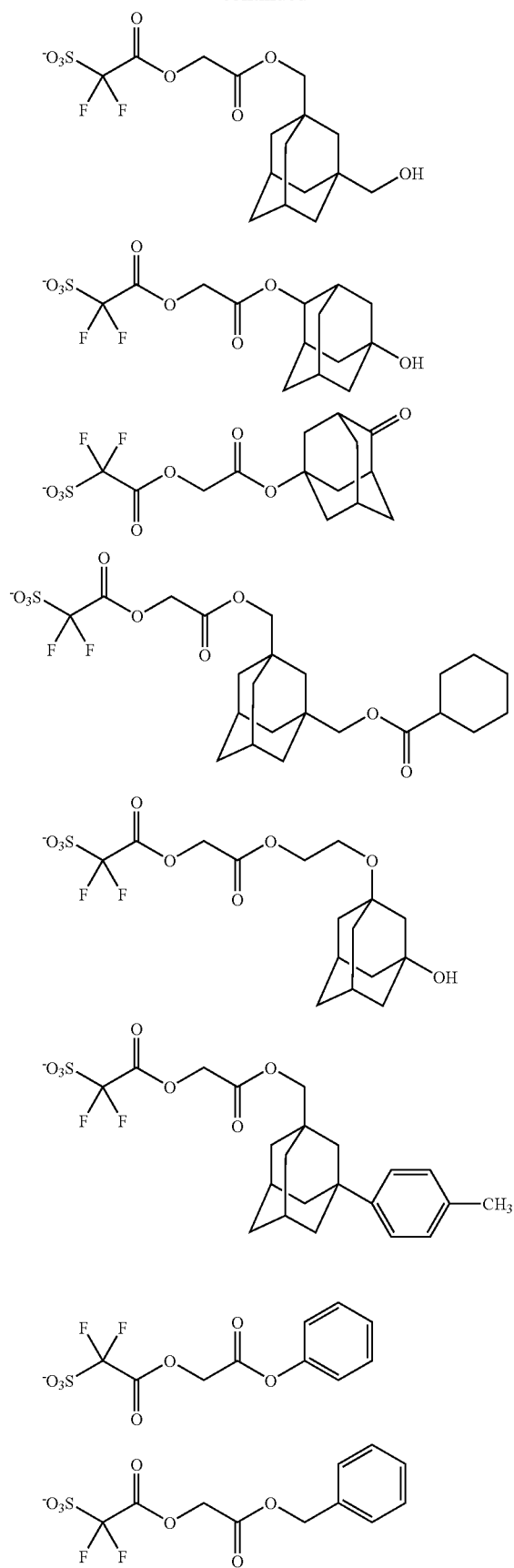
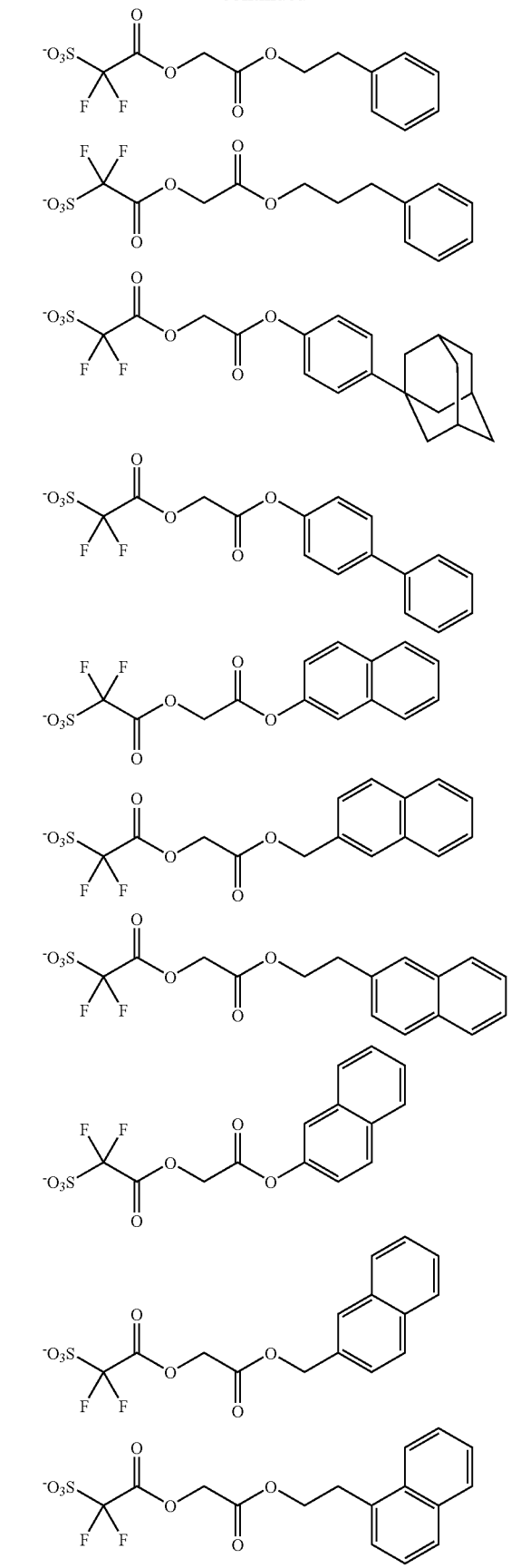

85
-continued
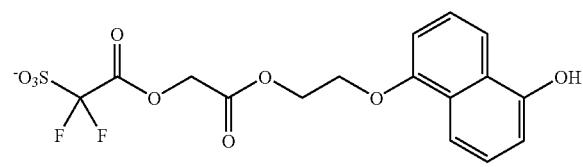
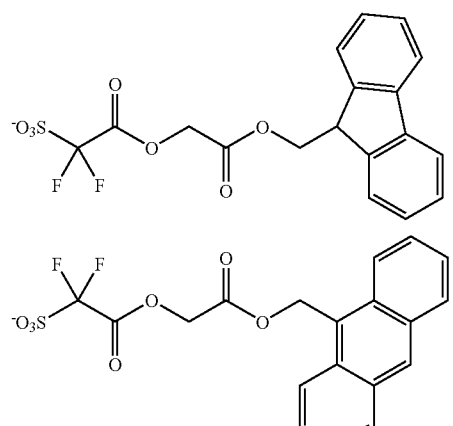
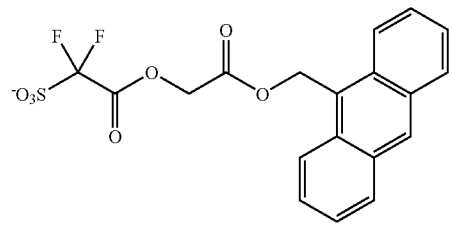
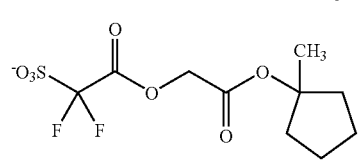
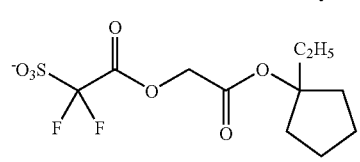
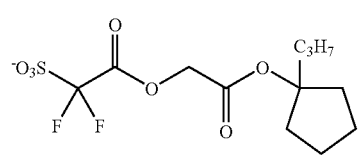
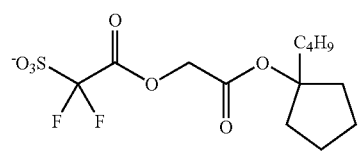
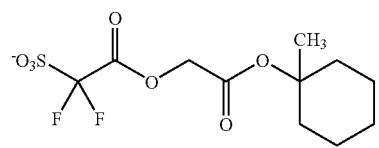
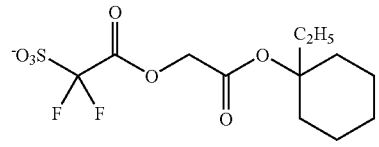
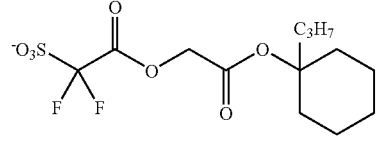
86
-continued
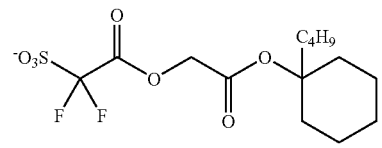
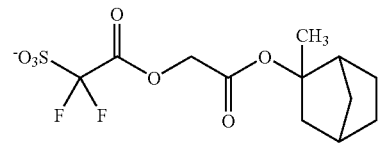
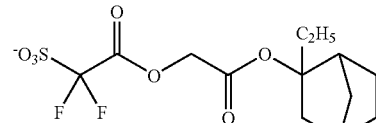
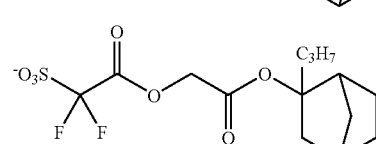
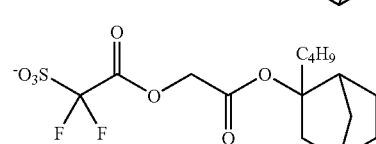
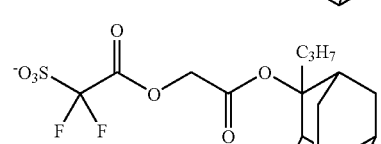
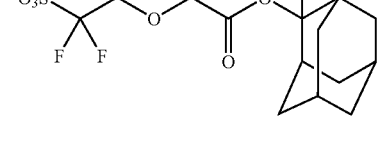
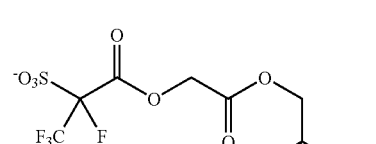
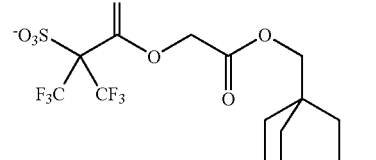

87
-continued
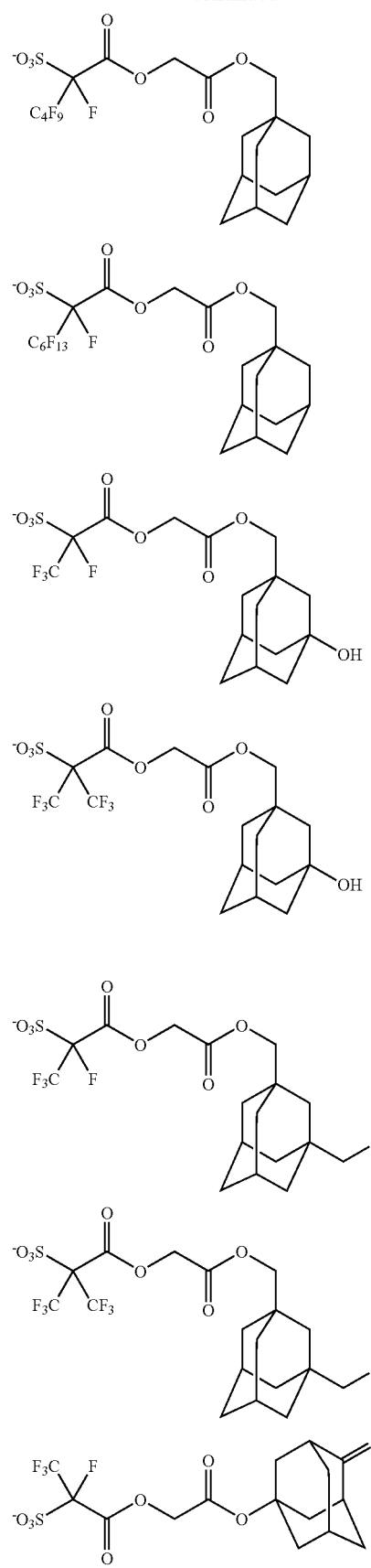
88
-continued
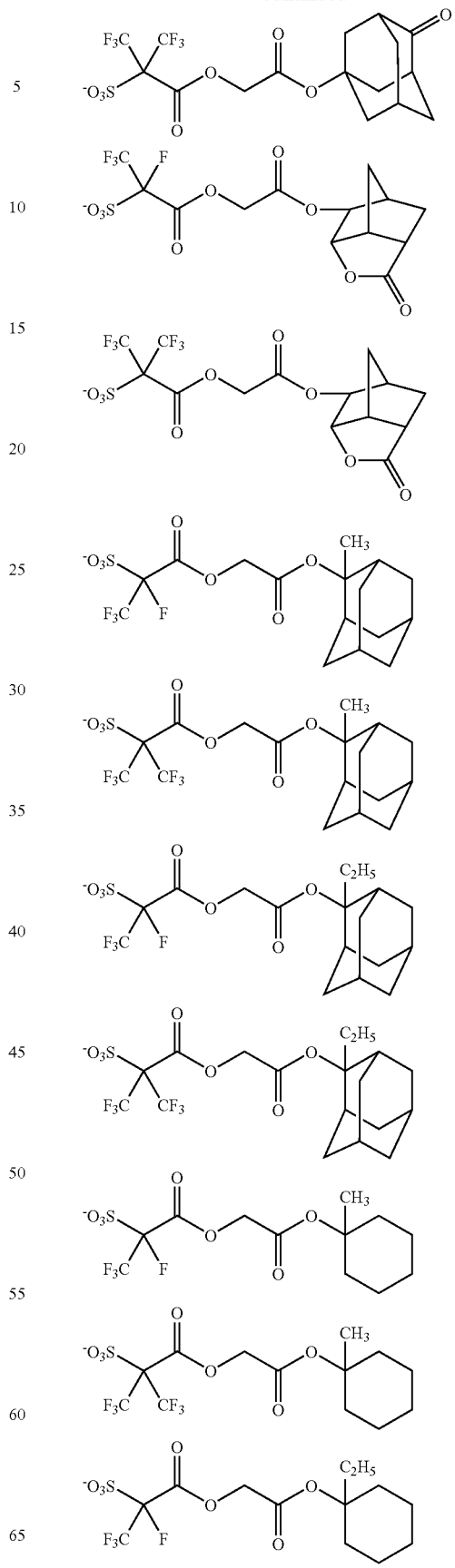

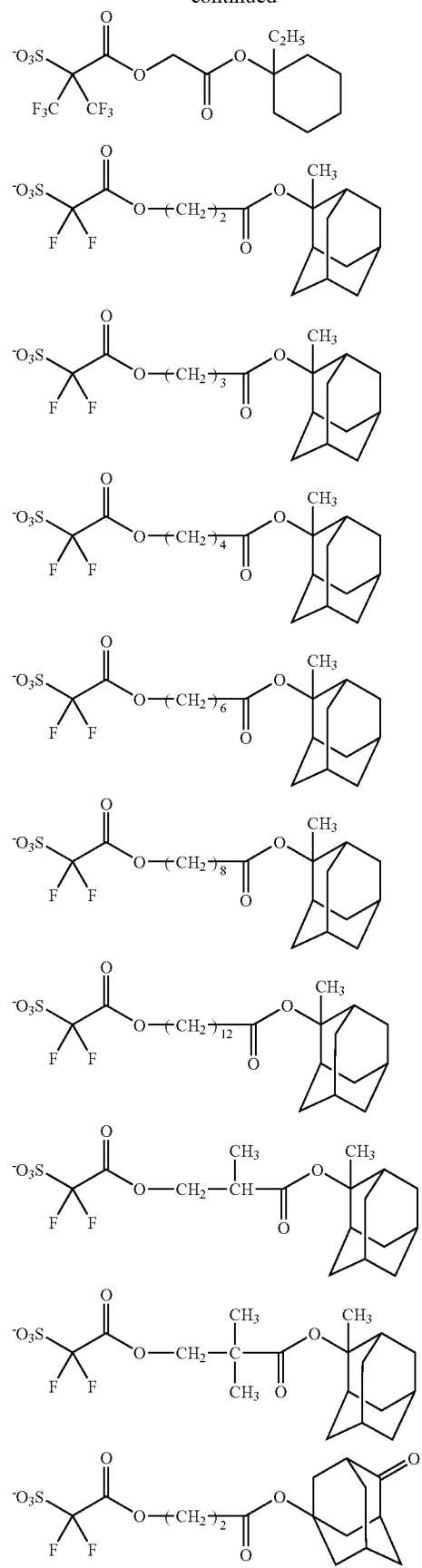
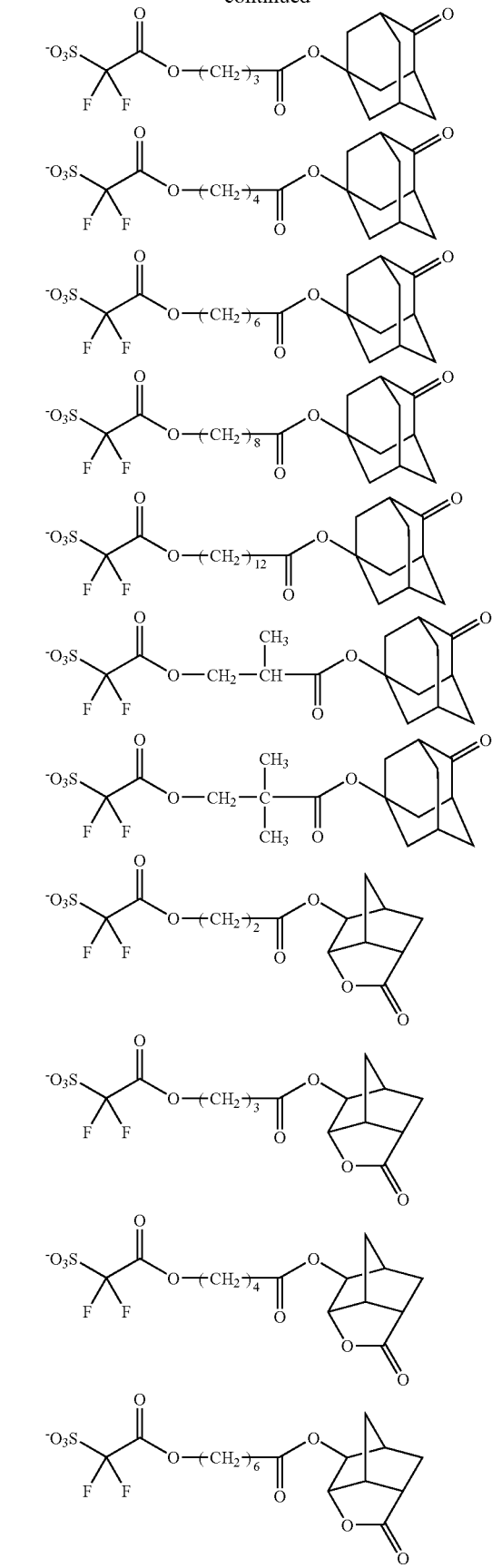

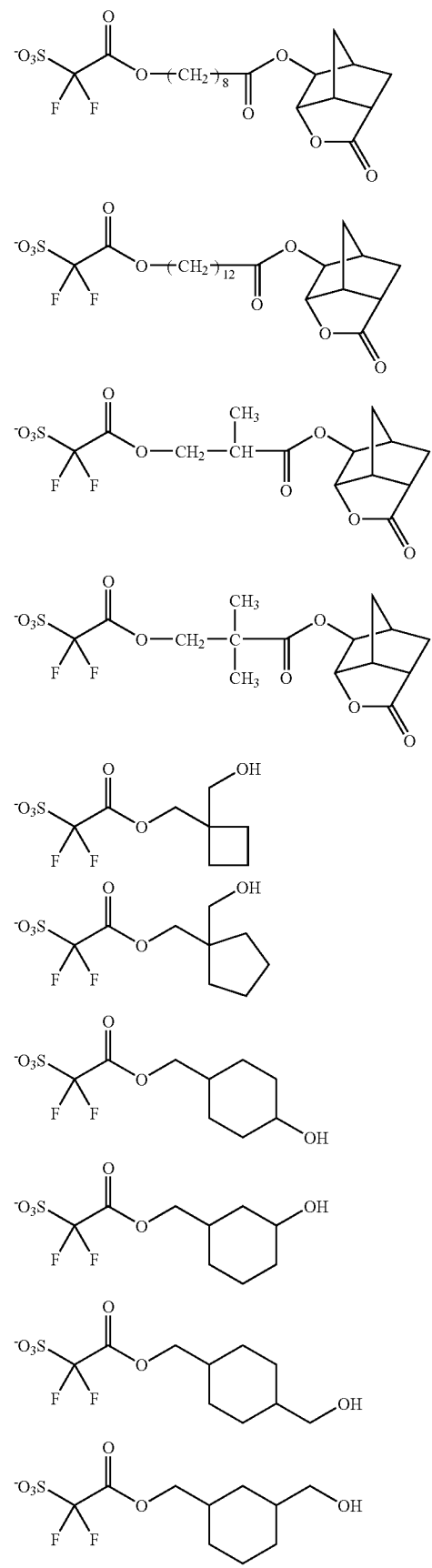
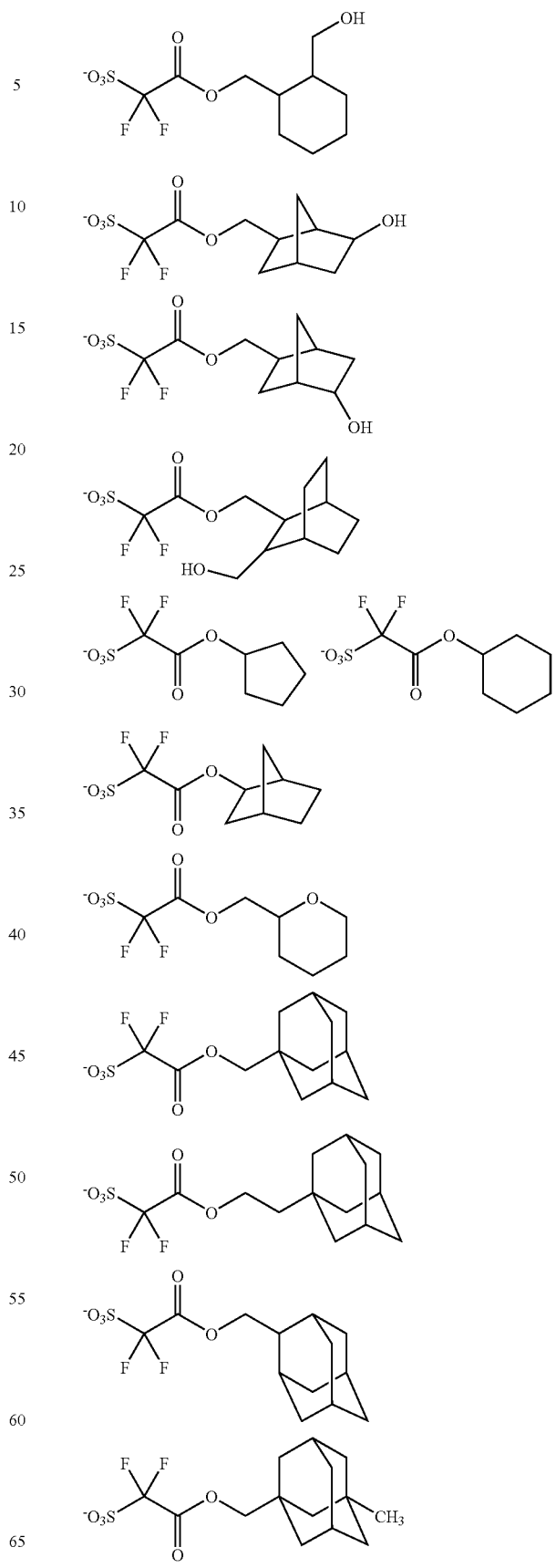

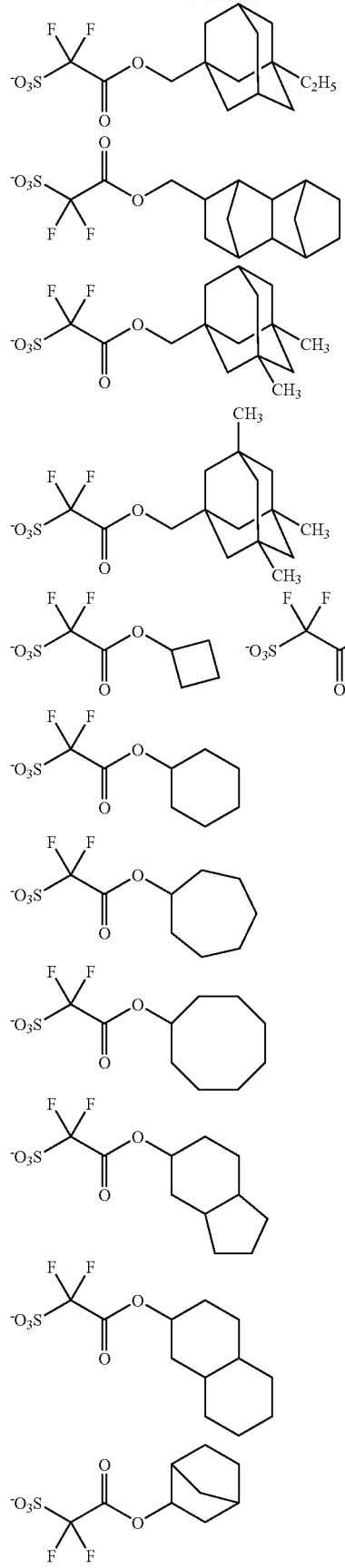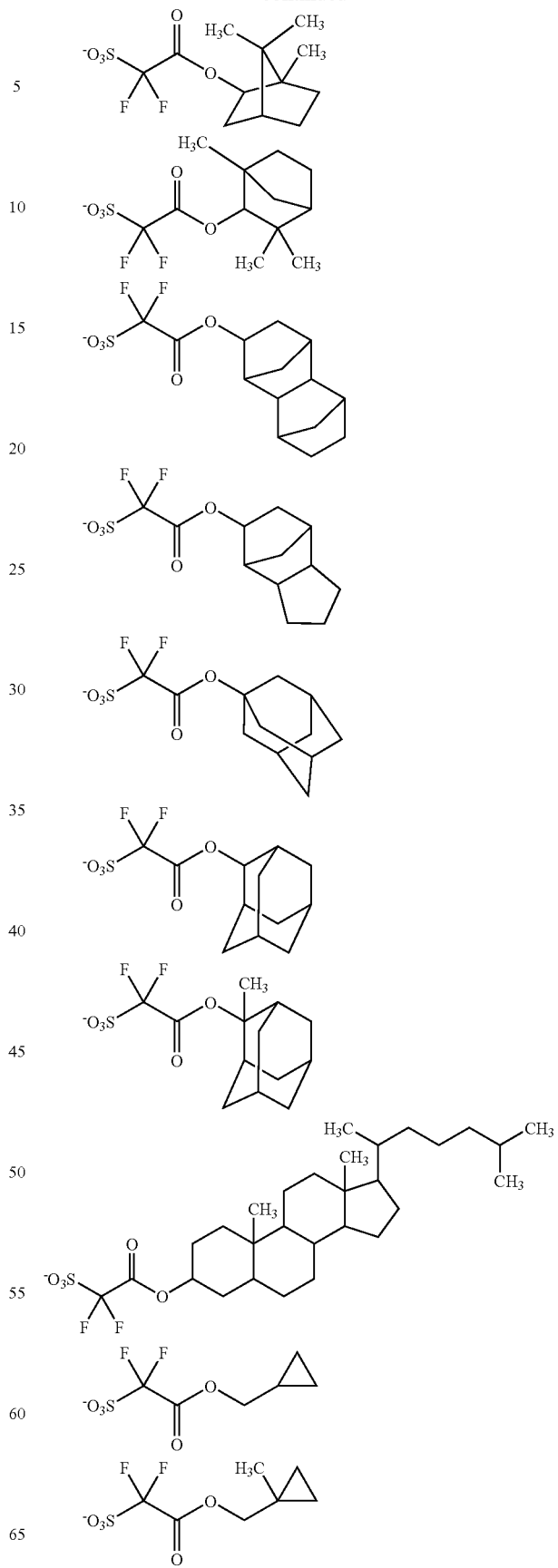

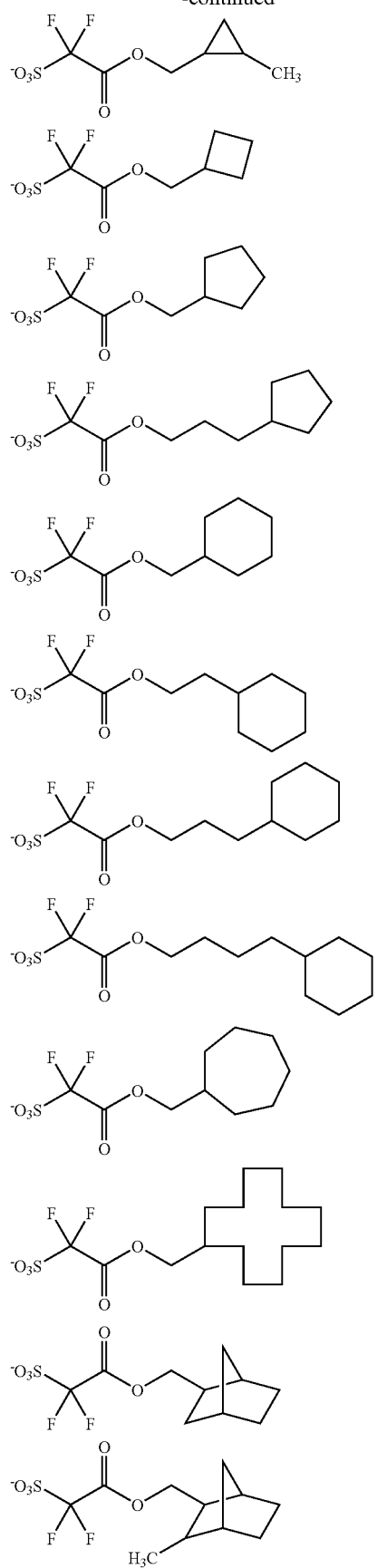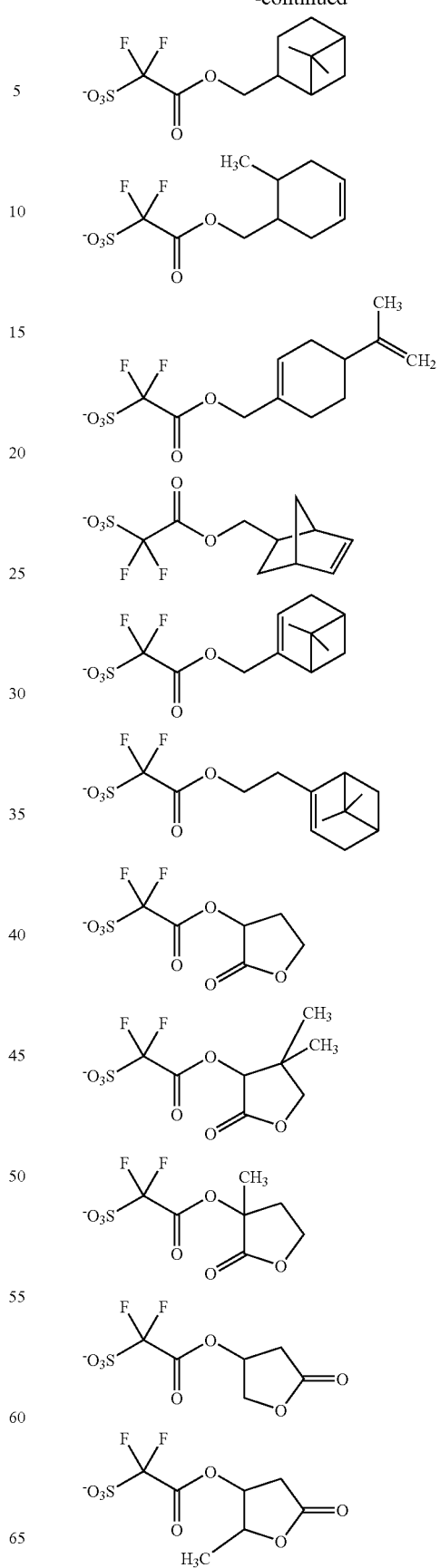

97
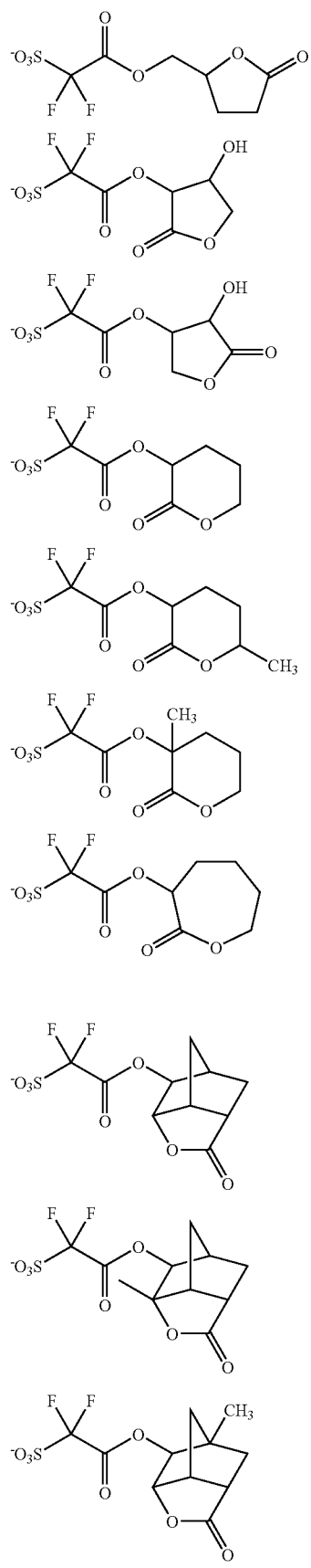
98
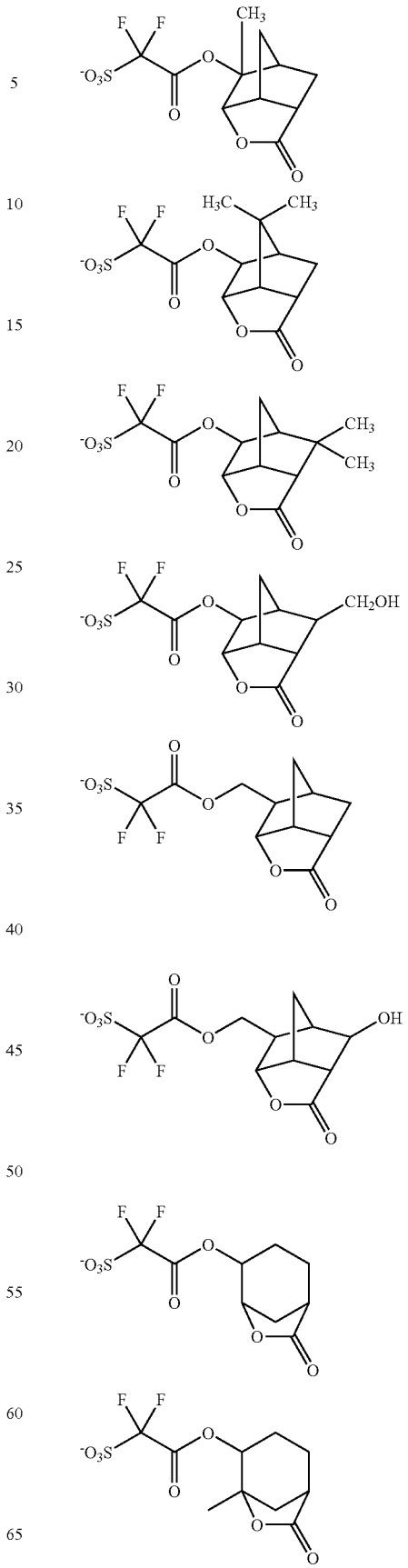

-continued
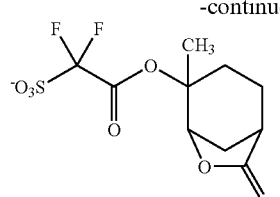
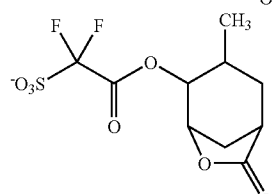
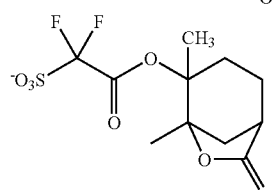
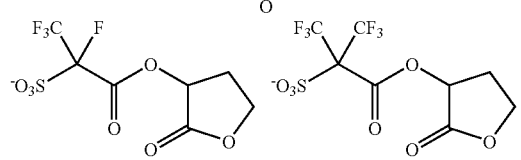
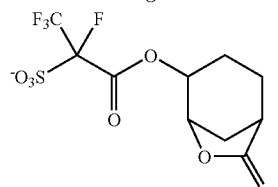
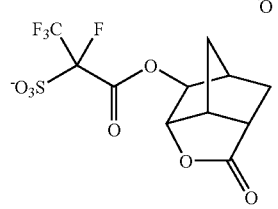
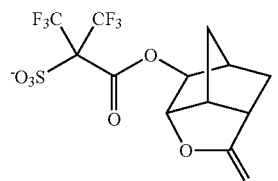
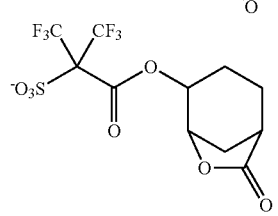
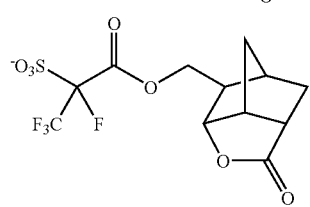
-continued
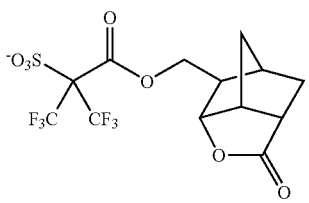
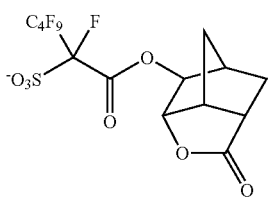
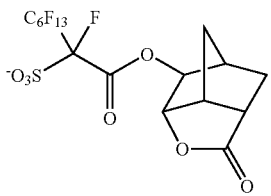
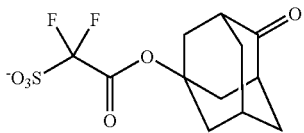
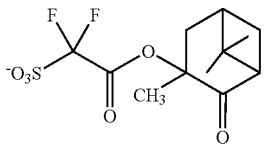
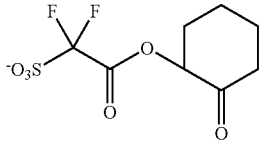
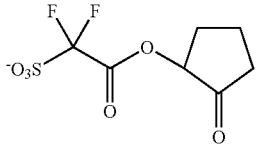
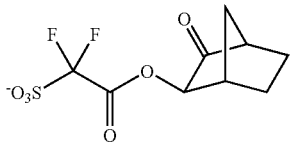
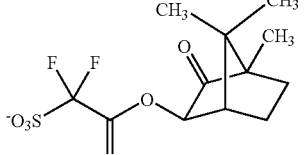
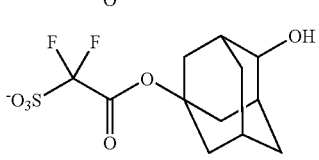

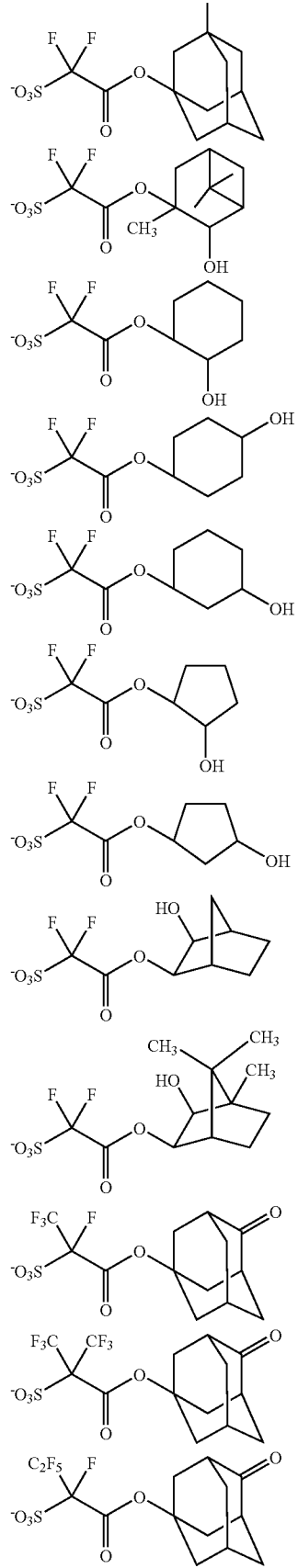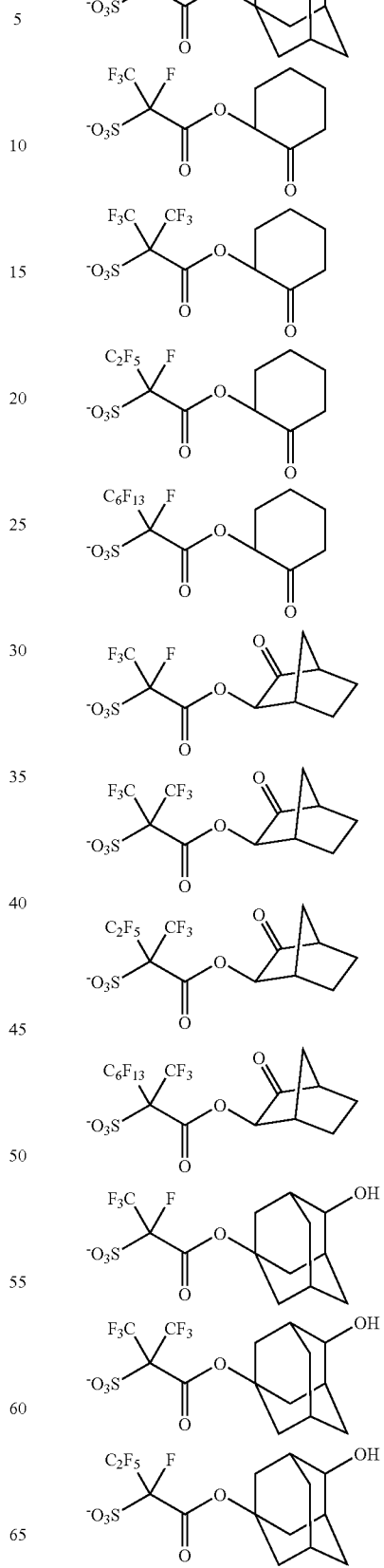

103
-continued
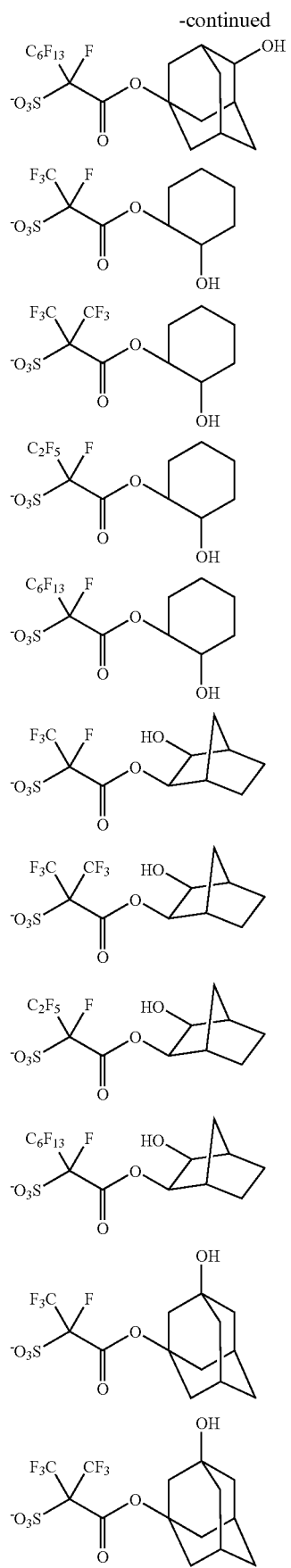
104
-continued
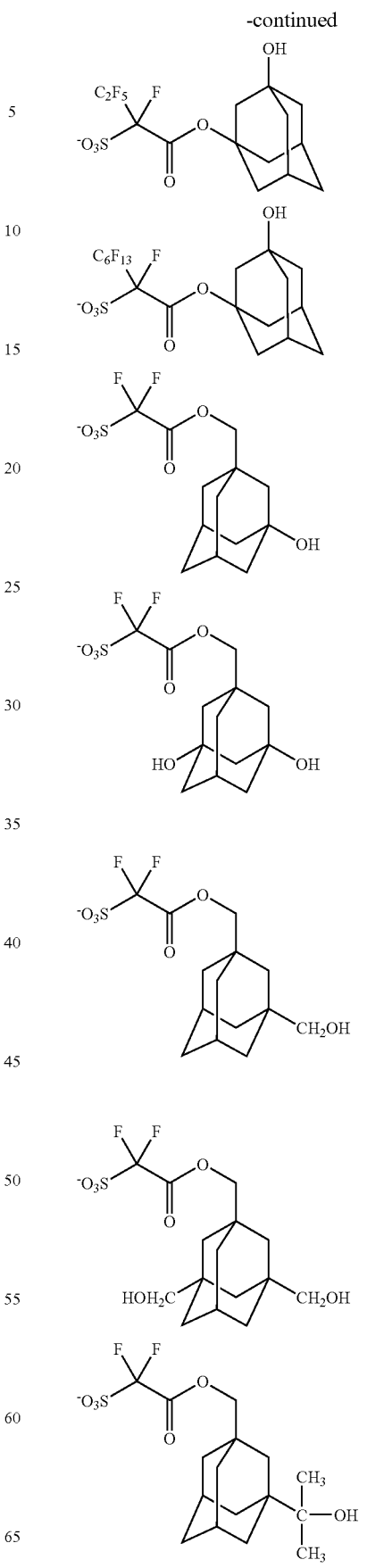

105
-continued
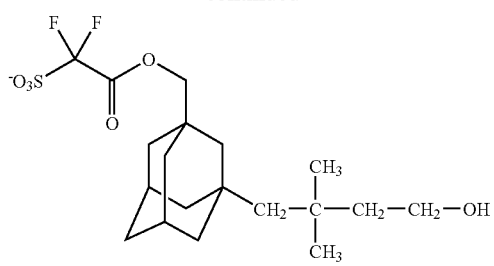
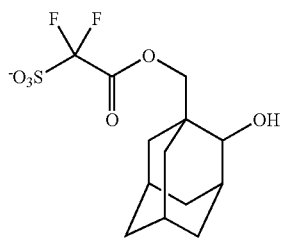
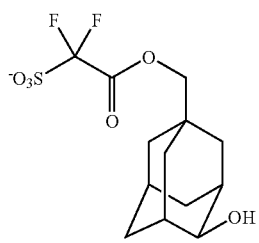
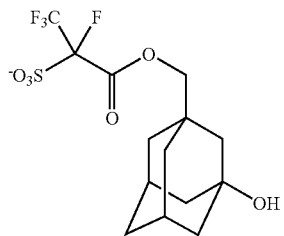
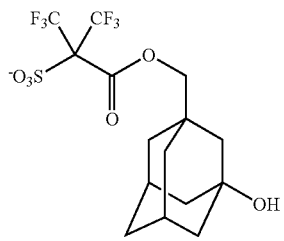
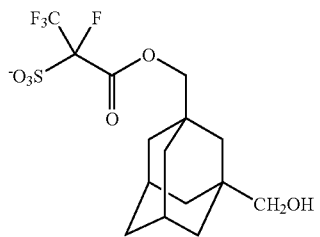
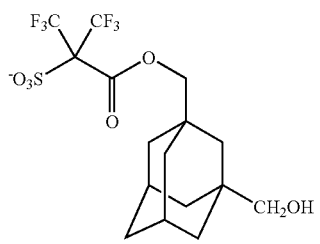
106
-continued
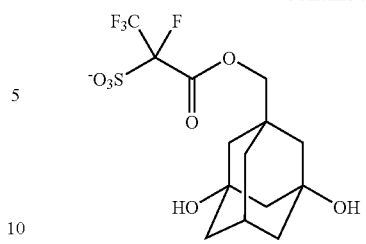
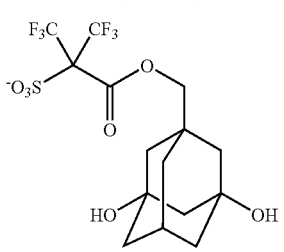
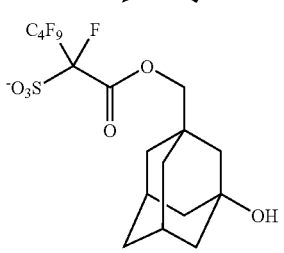
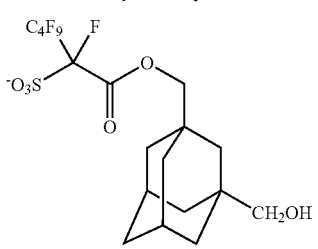
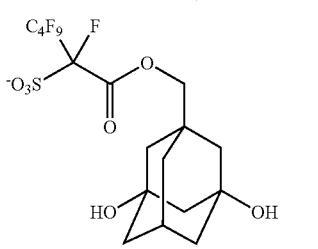
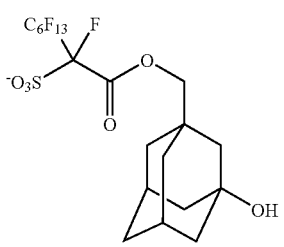
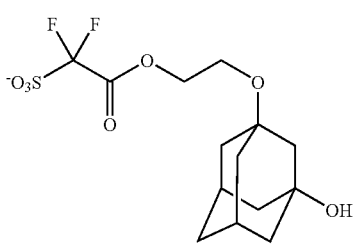

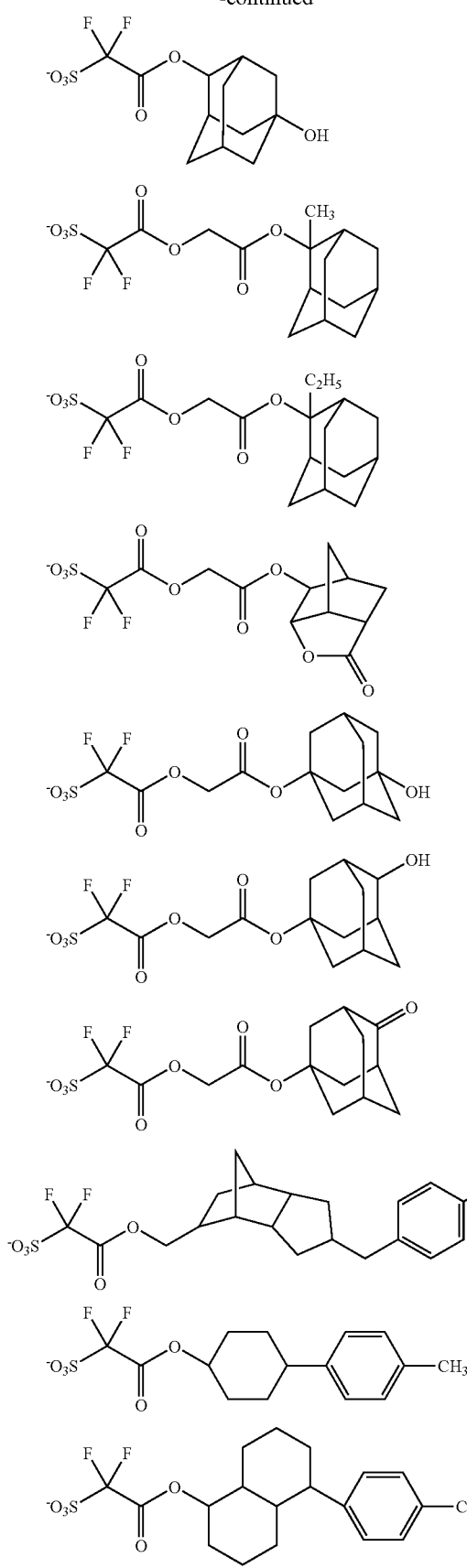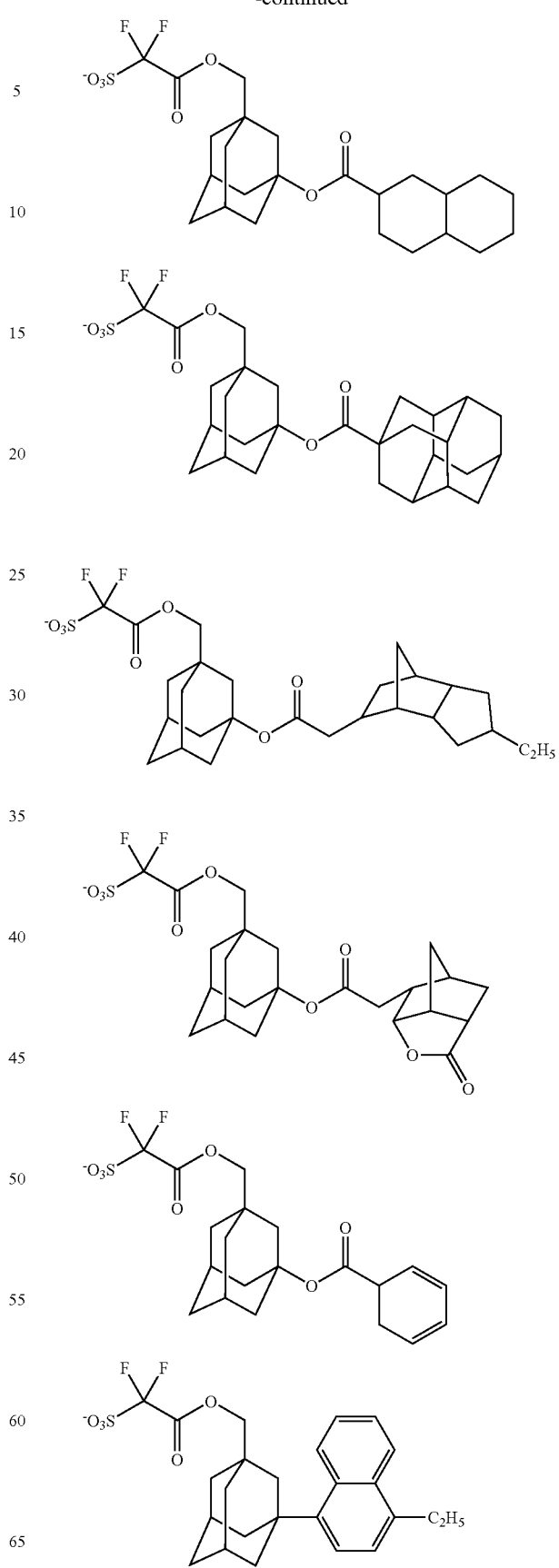

109
-continued
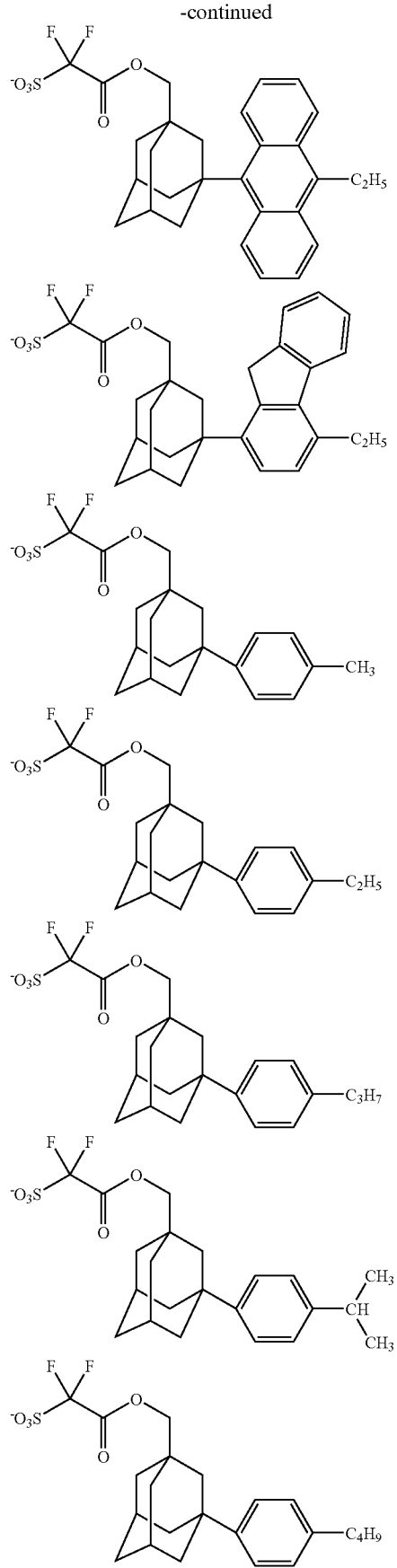
110
-continued
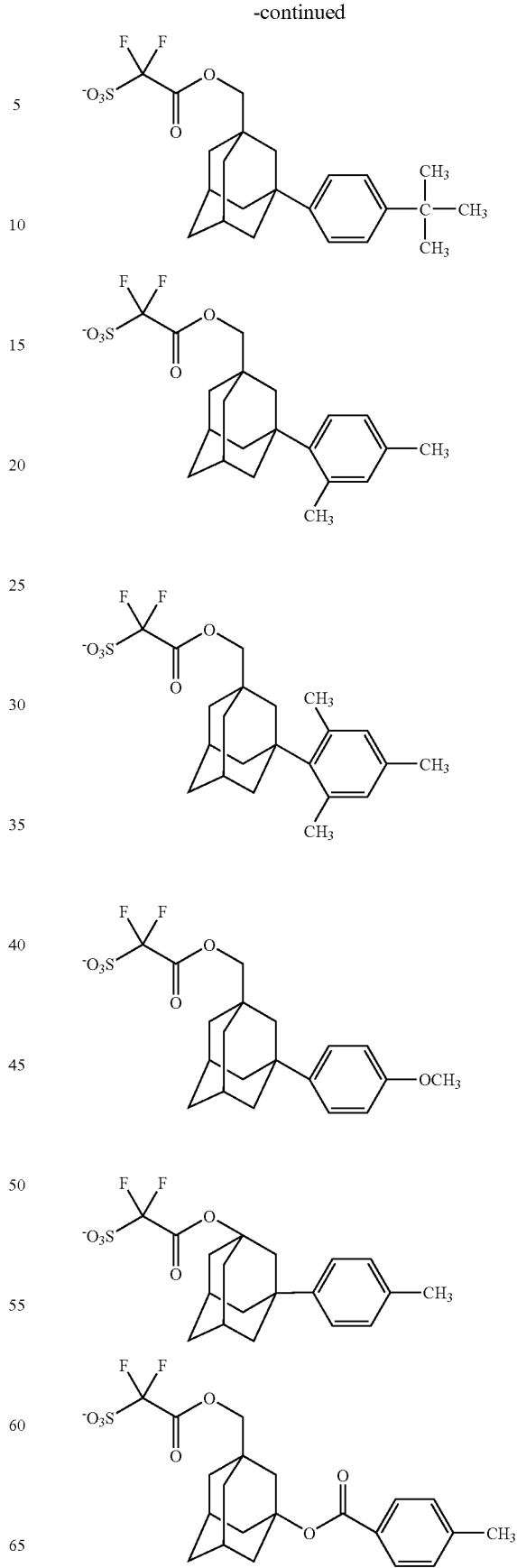

111
-continued
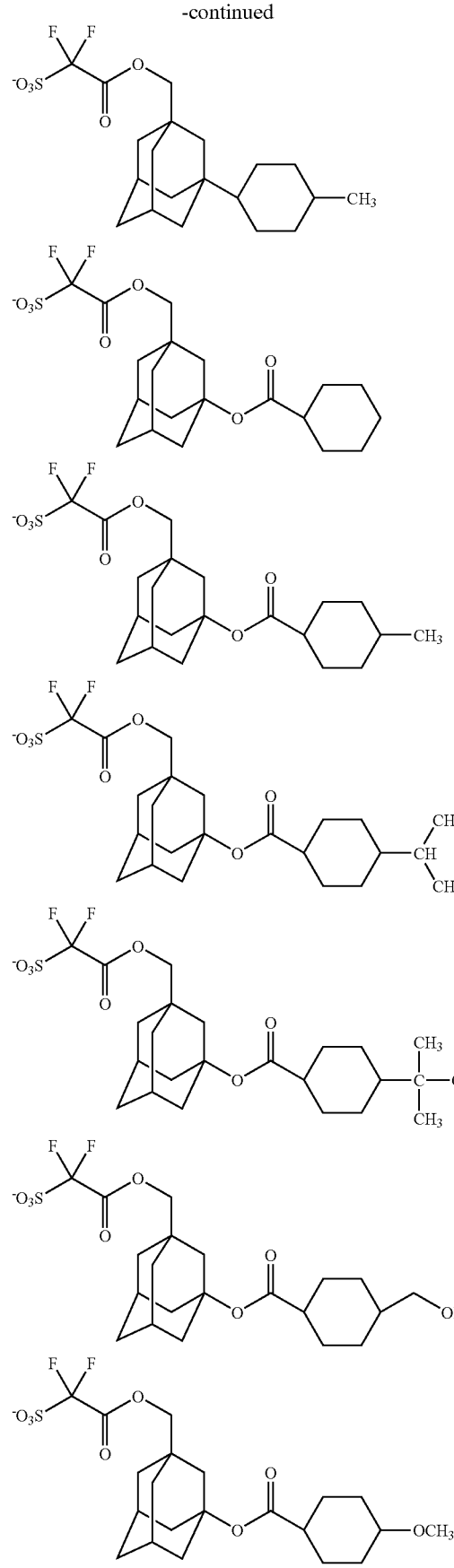
112
-continued
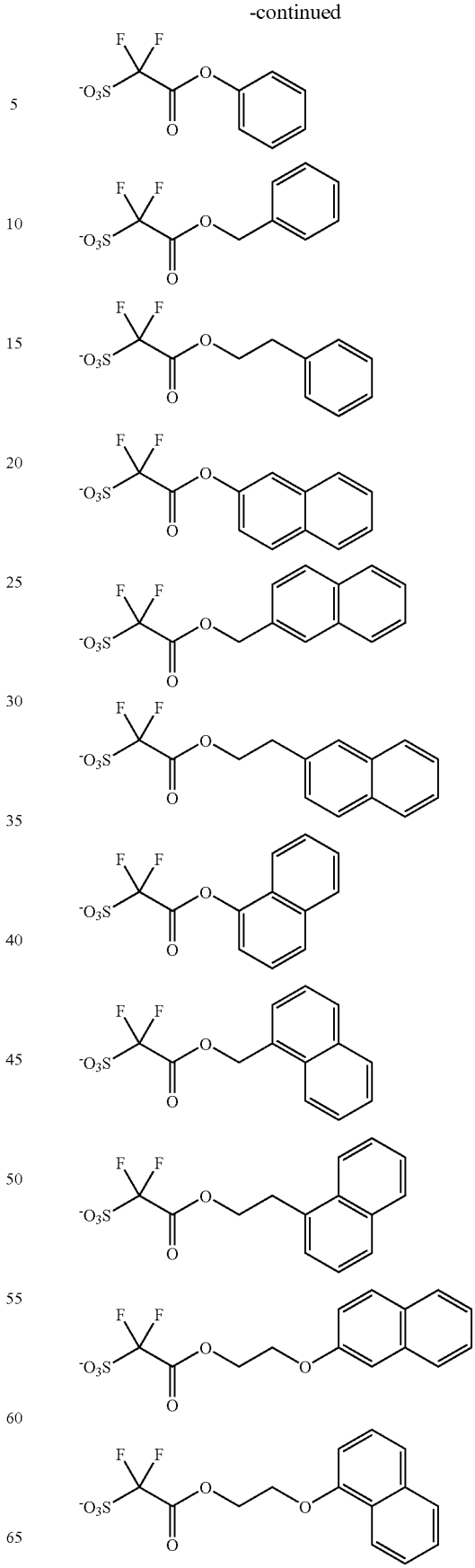

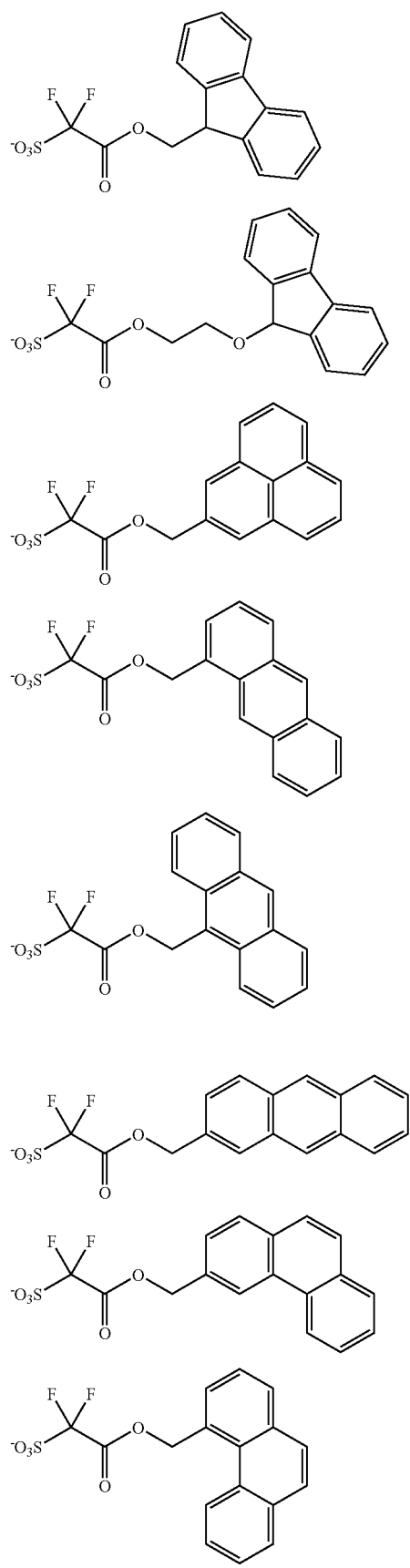
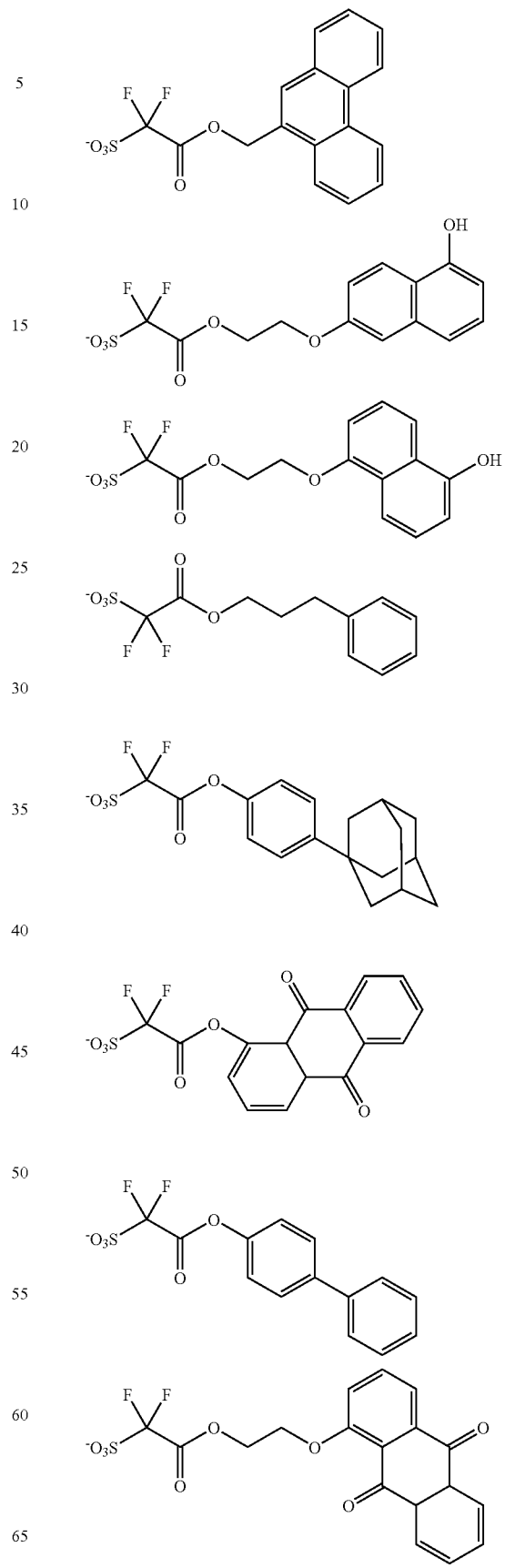

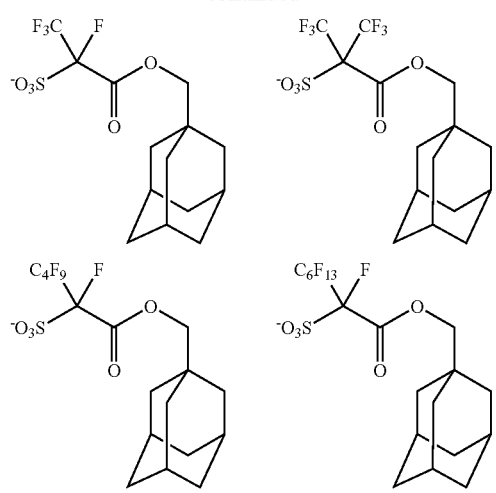
Preferable examples of the anion part include the followings:
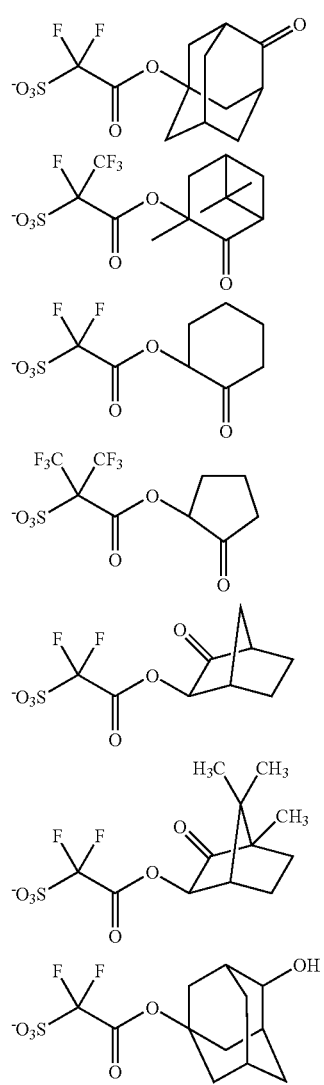
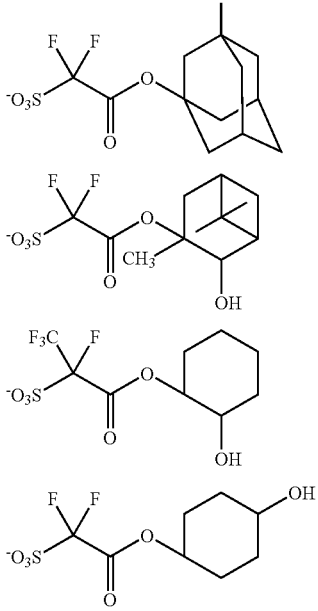
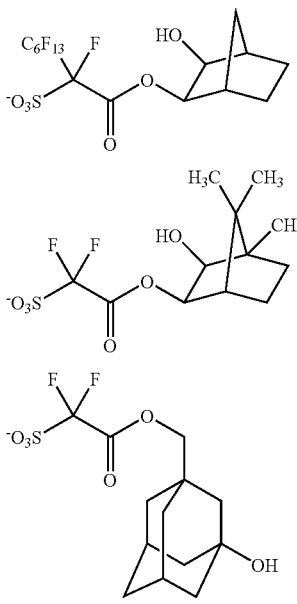

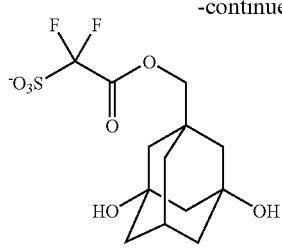

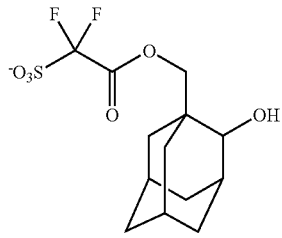

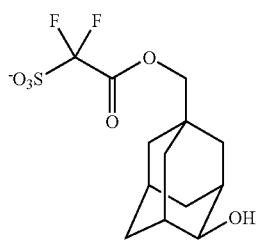

Other examples of the acid generator include a salt represented by the formula (VII):

$$A^{+-}O_3S—R^{27} \quad (VIII)$$

wherein $A^+$ is the same meaning as defined above and $R^{27}$ represents a C1-C6 linear or branched chain perfluoroalkyl group (hereinafter, simply referred to as the salt (VII)).

Specific examples of the anion part of the salt (VIII) include a trifluoromethanesulfonate anion, a pentafluoroethanesulfonate anion, a heputafluoropropanesulfonate anion and a nonafluorobutanesulfonate anion.

Examples of the organic counter ion represented by $A^+$ include a cation represented by the formula (IXz):

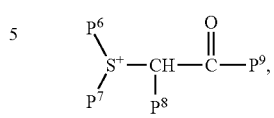

(IXz)

a cation represented by the formula (Ixb):

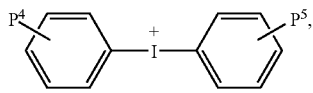

(IXb)

a cation represented by the formula (IXc):

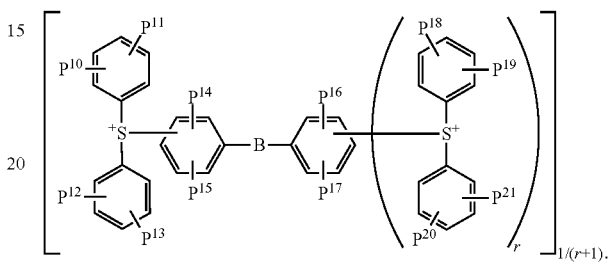

(IXc)

and a cation represented by the formula (IXd):

(IXd)

In the cation represented by the formula (IXz), $P^a$, $P^b$ and $P^c$ each independently represents a C1-C30 alkyl group which may be substituted with at least one selected from the group consisting of a hydroxyl group and a C1-C12 alkoxy group, or a C3-C30 cyclic hydrocarbon group which may be substituted with at least one selected from the group consisting of a hydroxyl group and a C1-C12 alkoxy group.

Examples of the C1-C30 alkyl group in the formula (IXz) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group. Examples of the C1-C12 alkoxy group in the formula (IXz) include a methoxy group, an ethoxy group, an n-propoxy group, an isopropoxy group, an n-butoxy group, an isobutoxy group, a sec-butoxy group, a tert-butoxy group, an n-pentyloxy group, an n-hexyloxy group, an n-octyloxy group and a 2-ethylhexyloxy group. Examples of the C3-C30 cyclic hydrocarbon group include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-n-hexylphenyl group, a 4-n-octylphenyl group, a 1-naphthyl group, a 2-naphthyl group, a fluorenyl group and a biphenyl group.

In the formula (IXb), $P^4$ and $P^5$ each independently represents a hydrogen atom, a hydroxyl group, a C1-C12 alkyl group or a C1-C12 alkoxy group. Examples of the C1-C12 alkyl group in the formula (IXb) include a methyl group, an ethyl group, an n-propyl group, an isopropyl group, an n-butyl group, an isobutyl group, a sec-butyl group, a tert-butyl group, an n-pentyl group, an n-hexyl group, an n-octyl group and a 2-ethylhexyl group, and examples of the C1-C12 alkoxy group in the formula (IXb) include the same groups as mentioned in the above formula (IXz).

In the formula (IXc), $P^6$ and $P^7$ each independently represents a C1-C12 alkyl group or a C3-C12 cycloalkyl group, or $P^6$ and $P^7$ bond to form a C3-C12 divalent hydrocarbon group which forms a ring together with the adjacent $S^+$, and at least one —$CH_2$— in the divalent hydrocarbon group may be replaced with —CO—, —O— or —S—, P[8] represents a hydrogen atom, P[9] represents a C1-C12 alkyl group, a C3-C12 cycloalkyl group or an aromatic group optionally substituted, or P[8] and P[9] bond to form a divalent hydrocarbon group which forms a 2-oxocycloalkyl group together with the adjacent —CHCO—, and at least one —CH$_2$— in the divalent hydrocarbon group may be replaced with —CO—, —O— or —S—.

Examples of the C1-C12 alkyl group in the formula (IXc) include the same groups as mentioned in the above formula (IXb) and examples of the C3-C12 cycloalkyl group in the formula (IXc) include a cyclopropyl group, a cyclobutyl group, a cyclopentyl group, a cyclohexyl group, a cycloheptyl group, a cyclooctyl group and a cyclodecyl group. Examples of the C3-C12 divalent hydrocarbon group formed by bonding P[6] and P[7] include a trimethylene group, a tetramethylene group, a pentamethylene group and examples of the ring group together with the adjacent S[+] and the divalent hydrocarbon group include a tetramethylenesulfonio group, a pentamethylenesulfonio group and an oxybisethylenesulfonio group.

Examples of the aromatic group in the formula (IXc) include a phenyl group, a tolyl group, a xylyl group and a naphthyl group. Examples of the divalent hydrocarbon group formed by bonding P[8] and P[9] include a methylene group, an ethylene group, a trimethylene group, a tetramethylene group and a pentamethylene group and examples of the 2-oxocycloalkyl group formed by bonding P[8] and P[9] together with the adjacent —CHCO— include a 2-oxocyclopentyl group and a 2-oxocyclohexyl group.

In the formula (IXd), P[10] P[11] P[12] P[13] P[14] P[15] P[16] P[17] P[18] P[19] P[20] and P[21] each independently represents a hydrogen atom, a hydroxyl group, a C1-C12 alkyl group or a C1-C12 alkoxy group, B represents a sulfur or oxygen atom and r represents 0 or 1.

Examples of the C1-C12 alkyl group in the formula (IXd) include the same groups as mentioned in the above formula (IXb) and examples of the C1-C12 alkoxy groups in the formula (IXd) include the same groups as mentioned in the above formula (IXz).

Examples of the cation represented by the formula (IXz) include the followings:

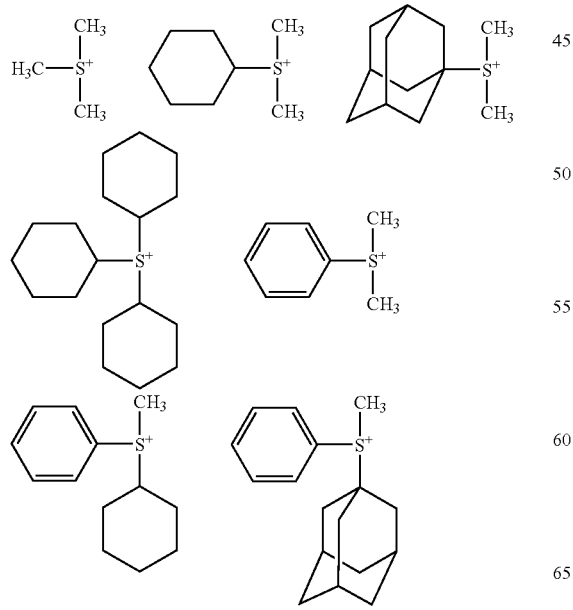

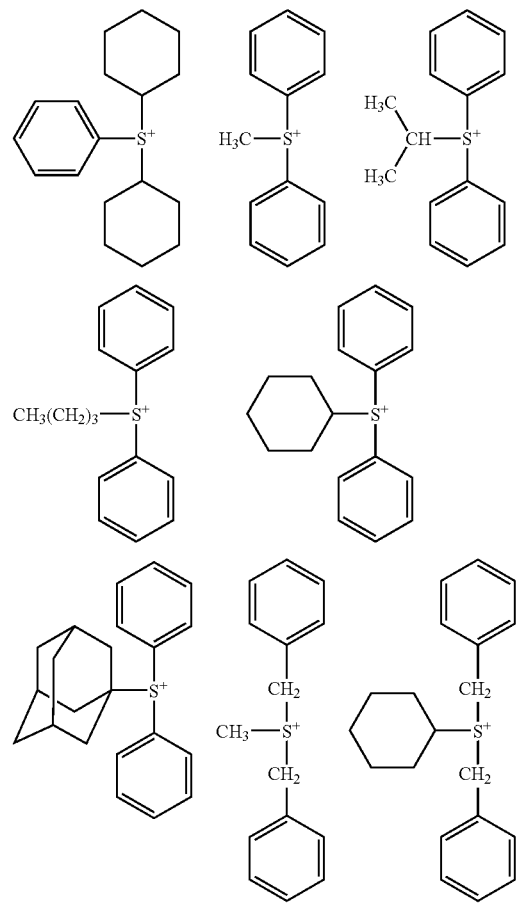

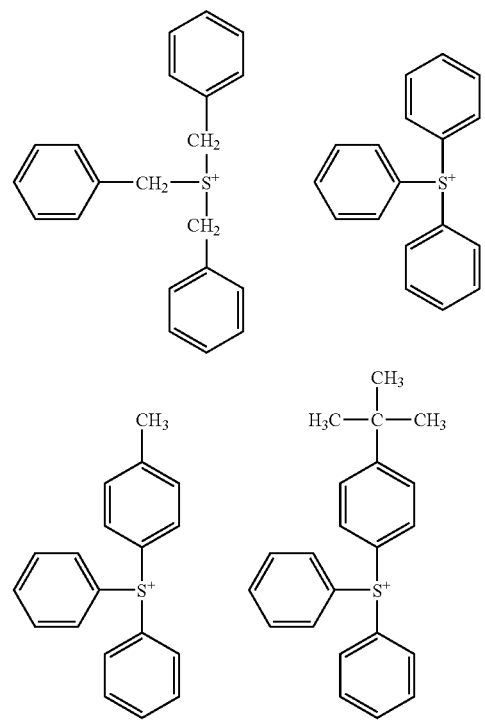

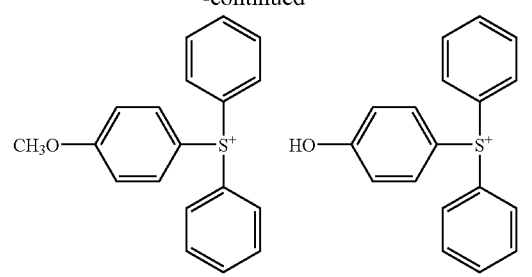
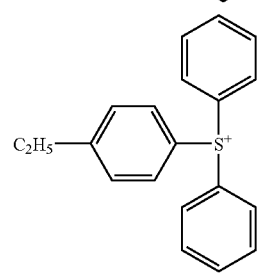
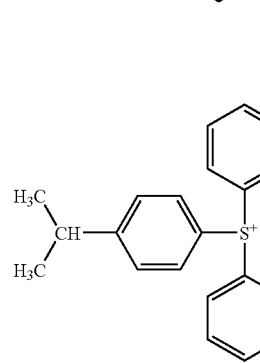
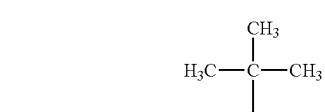
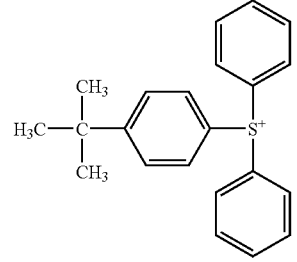
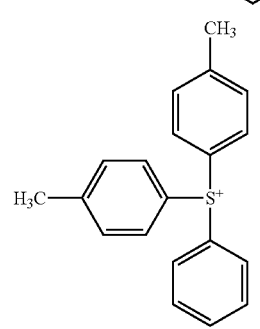
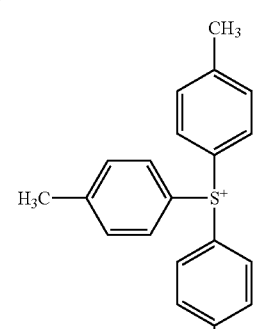
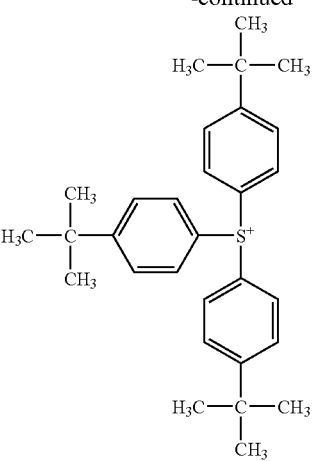
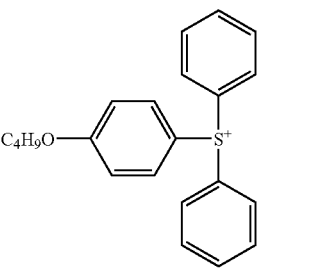
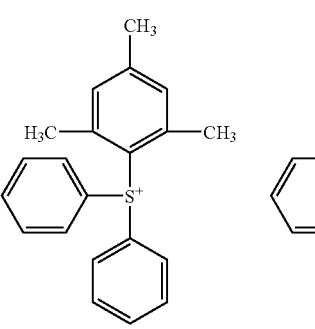
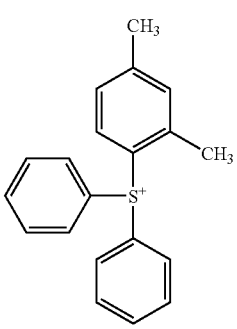
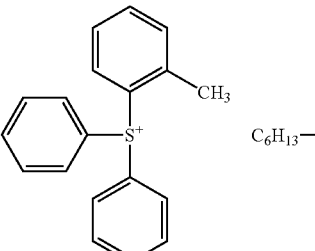
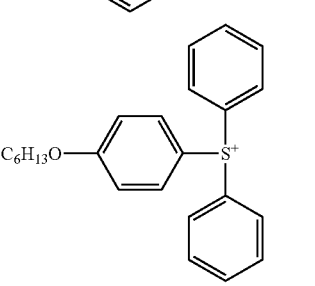

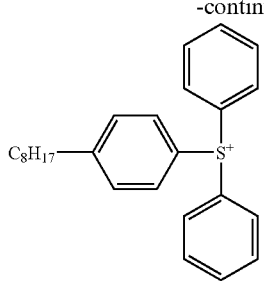

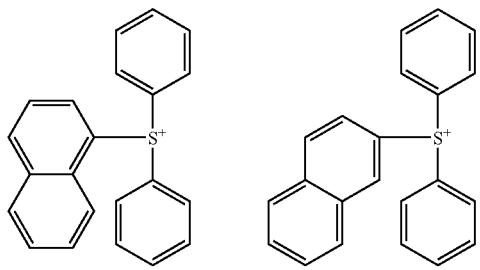

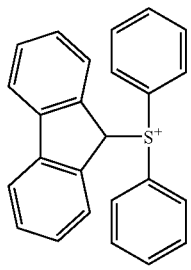

In the organic cation represented by the formula (IXz), a cation represented by the formula (IXa):

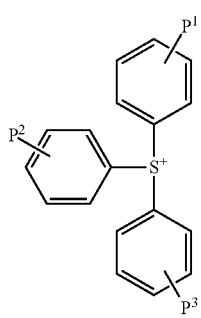

(IXa)

wherein $P^1$, $P^2$ and $P^3$ each independently represents a hydrogen atom, a hydroxyl group, a C1-C12 alkyl group or a C1-C12 alkoxy group, is preferable.

In the cation represented by the formula (IXa), a cation of the formula (IXe):

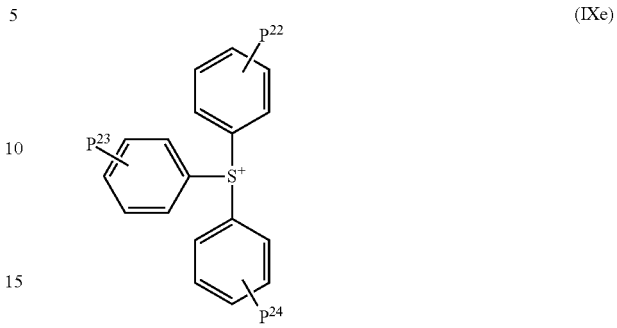

(IXe)

wherein $P^{22}$, $P^{23}$ and $P^{24}$ each independently represents a hydrogen atom or a C1-C4 alkyl group, is preferable.

In the formula (IXa), $P^1$, $P^2$ and $P^3$ each independently represent a hydrogen atom, a hydroxyl group, a C1-C12 alkyl group or a C1-C12 alkoxy group, and examples of the C1-C12 alkyl group include the same groups as mentioned in the above formula (IXb) and examples of the C1-C12 alkoxy group include the same groups as mentioned in the above formula (IXz).

In the formula (IXe), $P^{22}$, $P^{23}$ and $P^{24}$ each independently represents a hydrogen atom or a C1-C4 alkyl group, and examples of the C1-C4 alkyl group include a methyl group, an ethyl group, an n-propyl group, an isopropyl group, an n-butyl group, an isobutyl group, a sec-butyl group and a tert-butyl group.

Examples of the cation represented by the formula (IXb) include the followings:

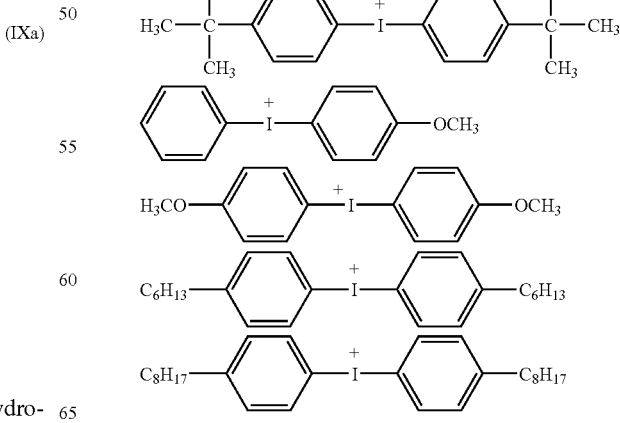

Examples of the cation represented by the formula (IXc) include the followings:
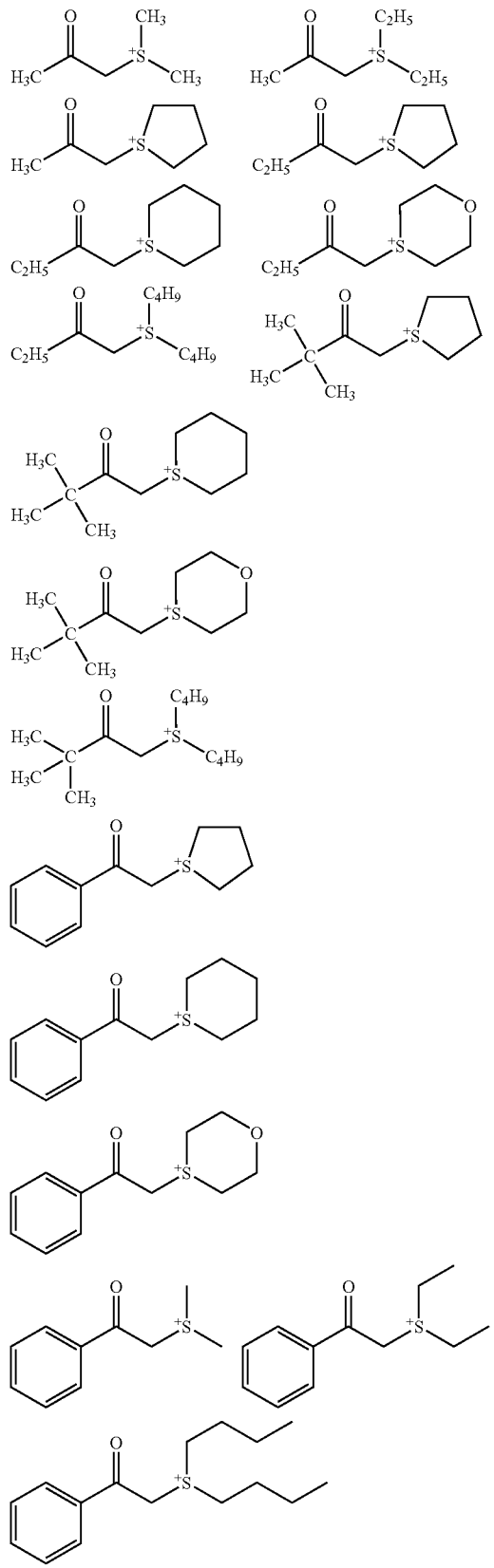
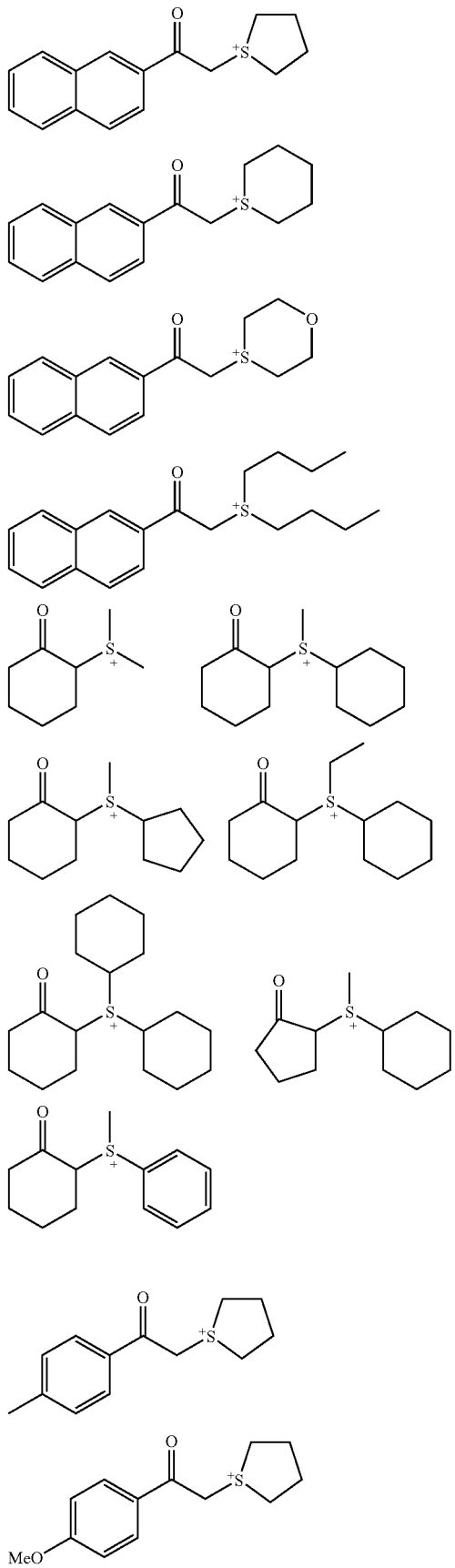

127
-continued
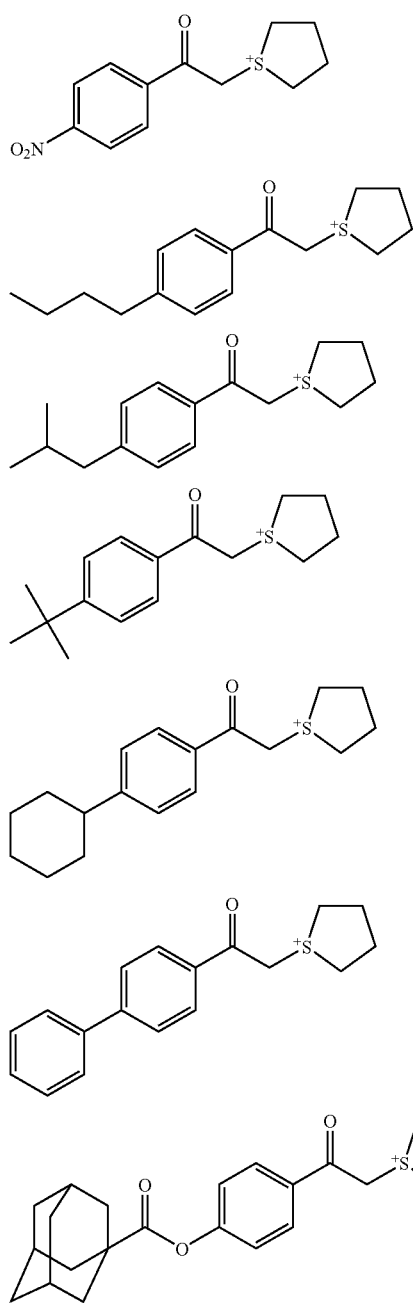
Examples of the cation represented by the formula (IXd) include the followings:
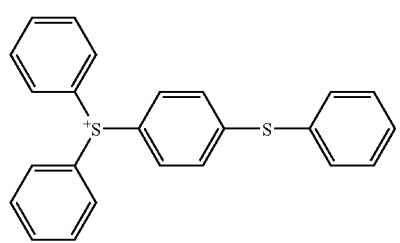
128
-continued
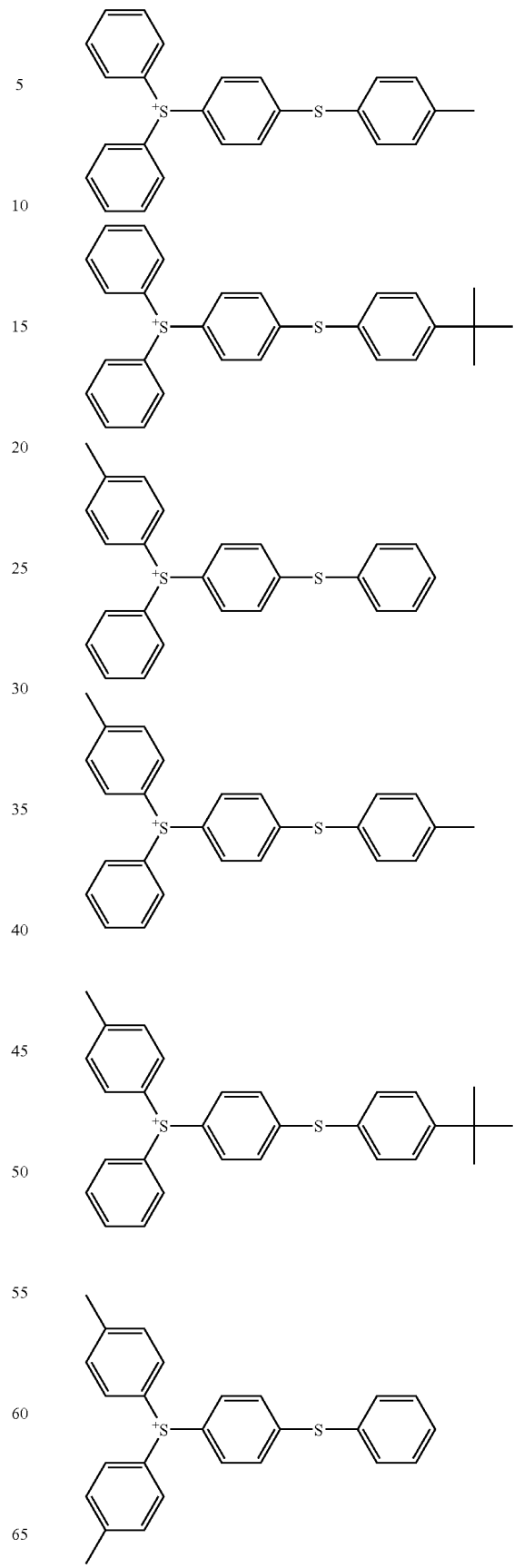

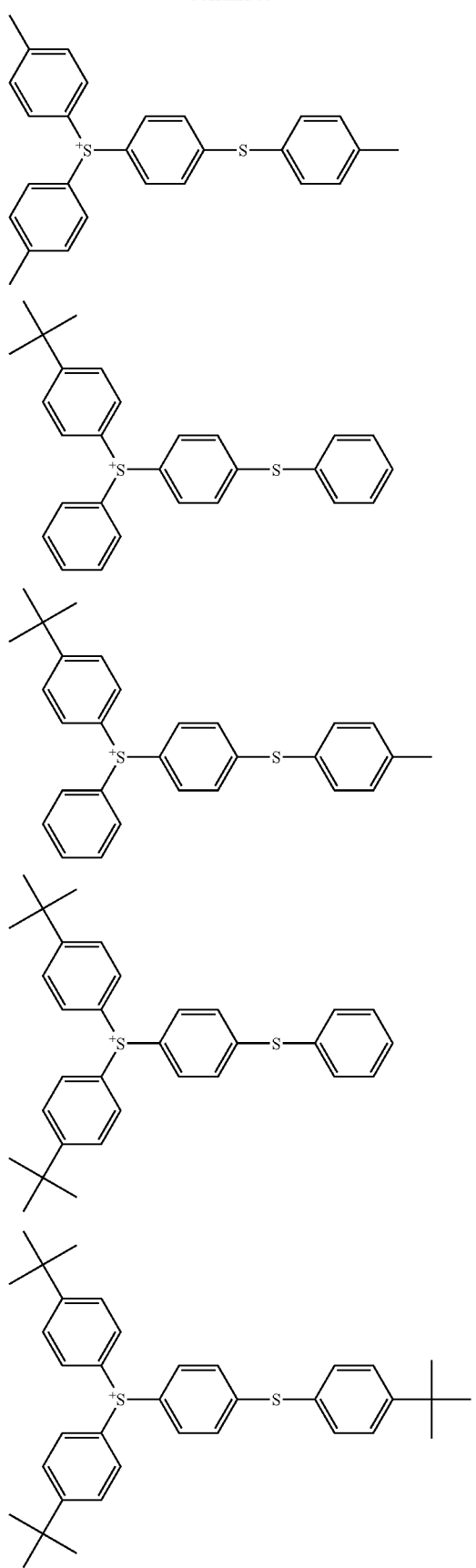
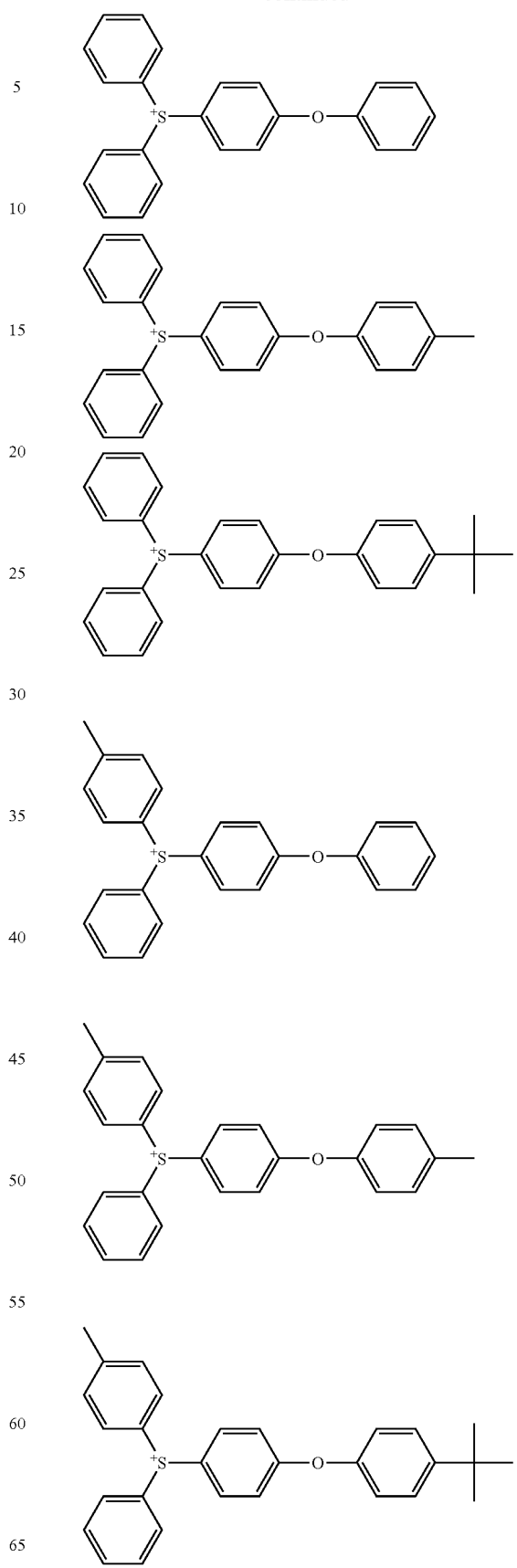

131
-continued
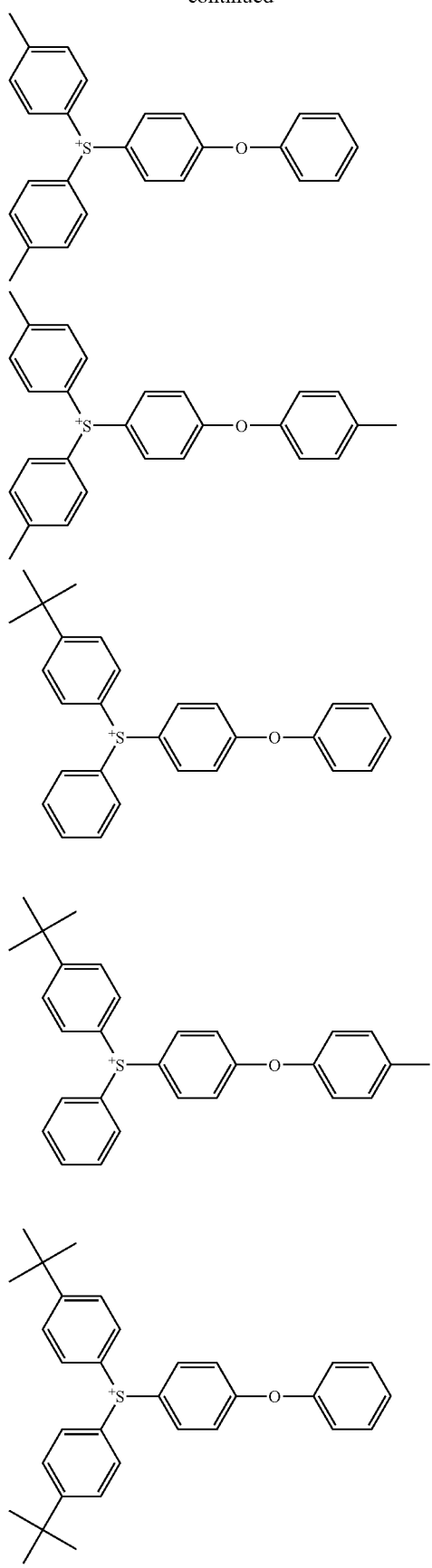
132
-continued
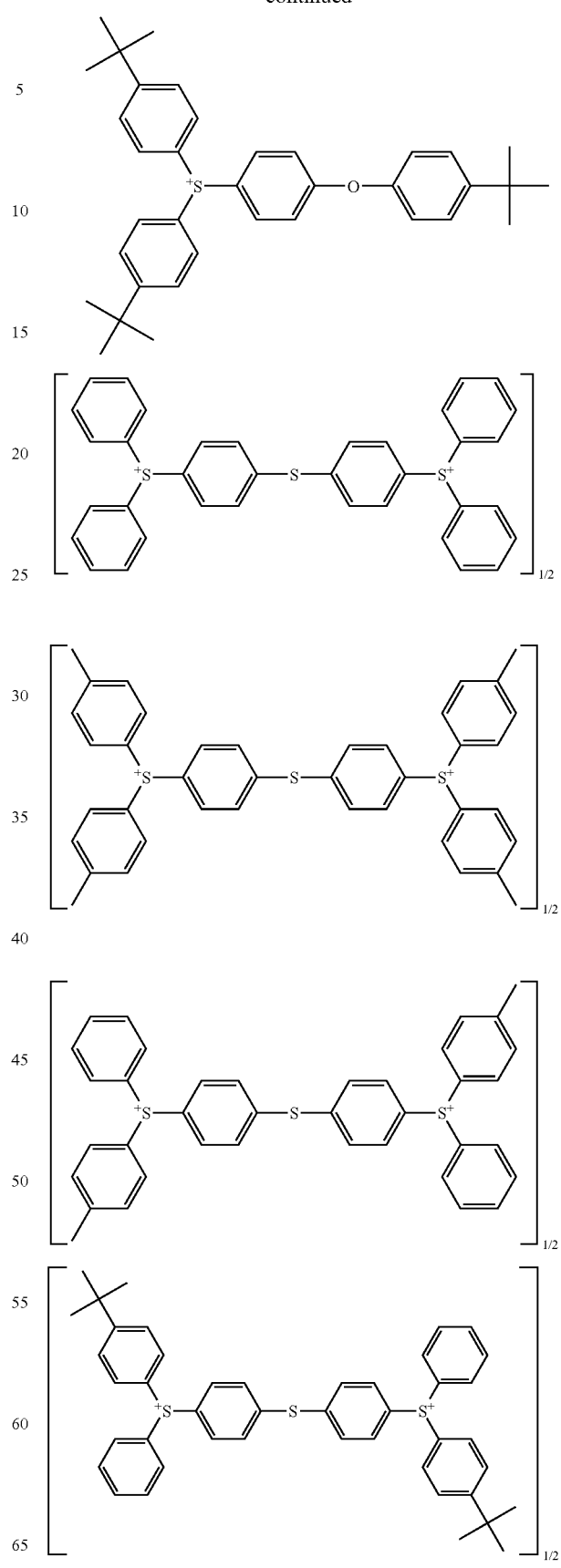

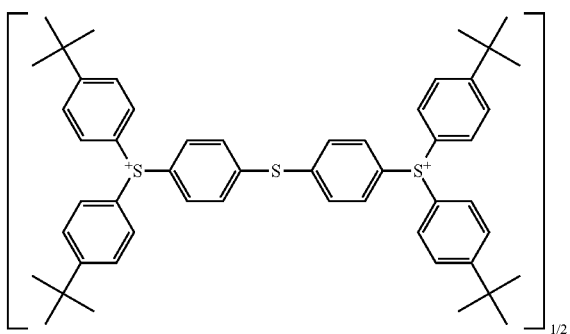

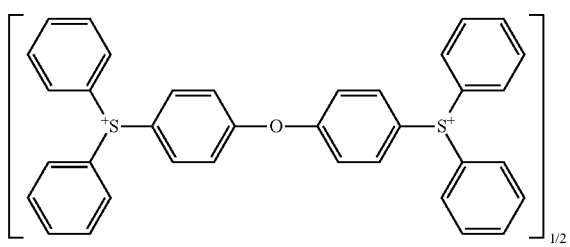

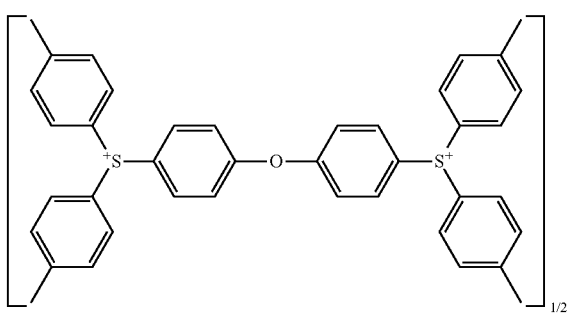

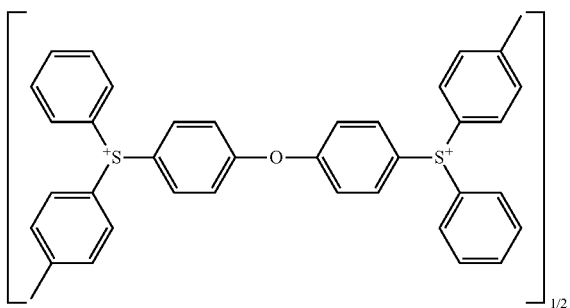

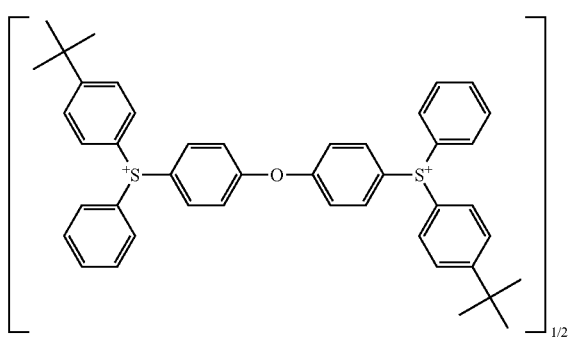

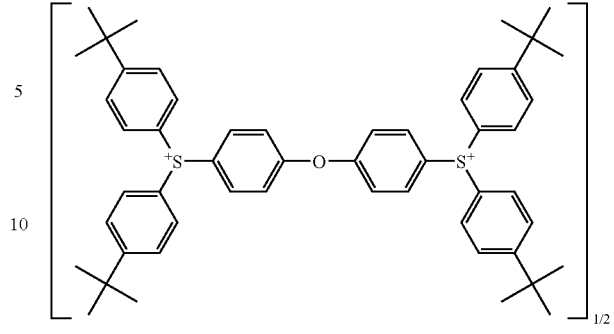

As the organic counter ion, the cation represented by the formula (IXe) is preferable.

The salt may be used alone or a mixture of two or more thereof may be used.

As the acid generator, a salt represented by the formula formula (Xa), (Xb) or (Xc) is preferred for the excellent resolution and pattern profile.

(Xa)

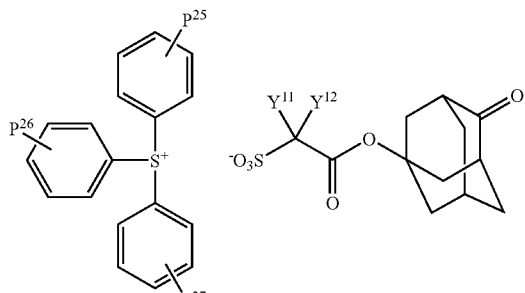

(Xb)

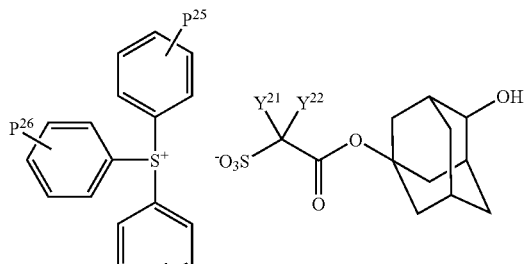

(Xc)

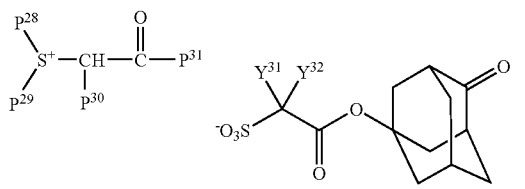

wherein $P^{25}$, $P^{26}$ and $P^{27}$ each independently represents a hydrogen atom or a C1-C4 alkyl group, $P^{28}$ and $P^{29}$ each independently represents a C1-C12 alkyl group or a C3-C12 cycloalkyl group, or $P^{28}$ and $P^{29}$ are bonded to form a C3-C12 divalent hydrocarbon group which forms a ring together with the adjacent $S^+$, $P^{30}$ represents a hydrogen atom, $P^{31}$ represents a C1-C12 alkyl group, a C3-C12 cycloalkyl group or an aromatic group optionally substituted, or $P^{30}$ and $P^{31}$ are bonded to form a C3-C12 divalent hydrocarbon group which forms a 2-oxocycloalkyl group together with the adjacent —CHCO—, and at least one —CH$_2$— in the C3-C12 divalent hydrocarbon group may be replaced with —CO—, —O— or —S—, $Y^{21}$, $Y^{22}$, $Y^{31}$ and $Y^{32}$ each independently represents a fluorine atom or a C1-C6 perfluoroalkyl group.

The acid generator can be produced according to known methods such as JP 2007-249192 A.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

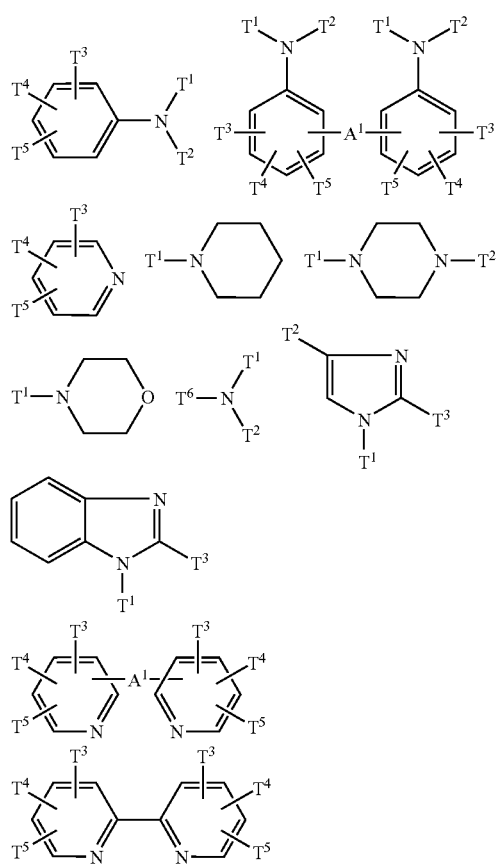

wherein $T^1$ and $T^2$ independently represent a hydrogen atom, an alkyl group, a cycloalkyl group or an aryl group, and the alkyl, cycloalkyl and aryl groups are optionally substituted with at least one group selected from the group consisting of a hydroxyl group, an amino group which is optionally substituted with a C1-C4 alkyl group and a C1-C6 alkoxy group which is optionally substituted with a C1-C6 alkoxy group, $T^3$ and $T^4$ independently represent a hydrogen atom, an alkyl group, a cycloalkyl group, an aryl group or an alkoxy group, and the alkyl, cycloalkyl, aryl and alkoxy groups are optionally substituted with at least one group selected from the group consisting of a hydroxyl group, an amino group which is optionally substituted with a C1-C4 alkyl group and a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and the alkyl, cycloalkyl, aryl and alkoxy groups are optionally substituted with at least one group selected from the group consisting of a hydroxyl group, an amino group which is optionally substituted with a C1-C4 alkyl group and a C1-C6 alkoxy group, $T^6$ represents an alkyl or cycloalkyl group, and the alkyl and cycloalkyl groups are optionally substituted with at least one group selected from the group consisting of a hydroxyl group, an amino group which is optionally substituted with a C1-C4 alkyl group and a C1-C6 alkoxy group, and $A^1$ represents —CO—, —NH—, —S—, —S—S—, an alkylene group of which at least one methylene group is optionally replaced with —O—, or an alkenylene group of which at least one methylene group is optionally replaced with —O—, and a quaternary ammonium hydroxide represented by the following formula:

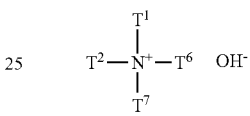

wherein $T^1$, $T^2$ and $T^6$ are the same as defined above, and $T^7$ represents a hydrogen atom, an alkyl group, a cycloalkyl group or an aryl group, and the alkyl and cycloalkyl groups are optionally substituted with at least one group selected from the group consisting of a hydroxyl group, an amino group which is optionally substituted with a C1-C4 alkyl group and a C1-C6 alkoxy group, and the aryl group is optionally substituted with at least one group selected from the group consisting of a hydroxyl group, an amino group which is optionally substituted with a C1-C4 alkyl group, a C1-C6 alkoxy group and a C1-C4 perfluoroalkyl group.

The alkyl group in $T^1$, $T^2$, $T^3$, $T^4$, $T^5$, $T^6$ and $T^7$ preferably has about 1 to 10 carbon atoms, and more preferably has about 1 to 6 carbon atoms.

Examples of the amino group which is optionally substituted with the C1-C4 alkyl group include an amino group, a methylamino group, an ethylamino group, an n-butylamino group, a dimethylamino group and a diethylamino group. Examples of the C1-C6 alkoxy group which is optionally substituted with the C1-C6 alkoxy group include a methoxy group, an ethoxy group, an n-propoxy group, an isopropoxy group, an n-butoxy group, a tert-butoxy group, an n-pentyloxy group, an n-hexyloxy group and a 2-methoxyethoxy group.

Specific examples of the alkyl group which is optionally substituted with at least one group selected from the group consisting of a hydroxyl group, an amino group which is optionally substituted with a C1-C4 alkyl group, and a C1-C6 alkoxy group which is optionally substituted with a C1-C6 alkoxy group include a methyl group, an ethyl group, an n-propyl group, an isopropyl group, an n-butyl group, a tert-butyl group, an n-pentyl group, an n-hexyl group, an n-octyl group, an n-nonyl group, an n-decyl group, a 2-(2-methoxyethoxy)ethyl group, a 2-hydroxyethyl group, a 2-hydroxypropyl group, a 2-aminoethyl group, a 4-aminobutyl group and a 6-aminohexyl group.

The cycloalkyl group in $T^1$, $T^2$, $T^3$, $T^4$, $T^5$, $T^6$ and $T^7$ preferably has about 5 to 10 carbon atoms. Specific examples of the cycloalkyl group which is optionally substituted with at least one group selected from the group consisting of a hydroxyl group, an amino group which is optionally substituted with a C1-C4 alkyl group and a C1-C6 alkoxy group include a cyclopentyl group, a cyclohexyl group, a cycloheptyl group and a cyclooctyl group.

The aryl group in $T^1$, $T^2$, $T^3$, $T^4$ and $T^5$ preferably has about 6 to 10 carbon atoms. Specific examples of the aryl group which is optionally substituted with at least one group selected from the group consisting of a hydroxyl group, an amino group which is optionally substituted with a C1-C4 alkyl group and a C1-C6 alkoxy group include a phenyl group and a naphthyl group.

The aryl group in $T^7$ preferably has about 6 to 10 carbon atoms. Specific examples of the aryl group which is optionally substituted with at least one group selected from the group consisting of a hydroxyl group, an amino group which is optionally substituted with a C1-C4 alkyl group, a C1-C6 alkoxy group and a C1-C4 perfluoroalkyl group include a phenyl group, a naphthyl group and a 3-trifluoromethylphenyl group.

The alkoxy group in $T^3$, $T^4$ and $T^5$ preferably has about 1 to 6 carbon atoms and specific examples thereof include a methoxy group, an ethoxy group, an n-propoxy group, an isopropoxy group, an n-butoxy group, a tert-butoxy group, an n-pentyloxy group, an n-hexyloxy group.

The alkylene and alkenylene groups in $A^1$ preferably have 2 to 6 carbon atoms. Specific examples of the alkylene group include an ethylene group, a trimethylene group, a tetramethylene group, a methylenedioxy group and an ethylene-1,2-dioxy group, and specific examples of the alkenylene group include an ethene-1,2-diyl group, a 1-propene-1,3-diyl group and a 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylendiamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl] amine, triisopuropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher. The present resist composition preferably includes 0.01 to 1% by weight of the quencher based on the total solid content of the present composition. In the present invention, the total solid content means total content exclusive of solvents.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight of any material in the following Examples is a value found by gel permeation chromatography [Column (three columns+guard column): TSKgel Multipore $H_{XZ}$-M manufactured by TOSOH CORPORATION, and Solvent: tetrahydrofuran, Flow rate: 1.0 mm/min., Detector: RI Detector, Column Temperature: 40° C., Injection volume: 100 μl] using polystyrene manufactured by TOSOH CORPORATION as a standard reference material.

Monomers used in Examples are following monomers A to F.

A 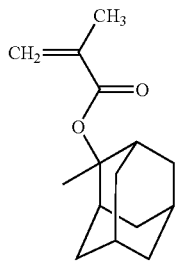

B 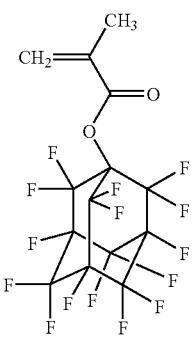

C 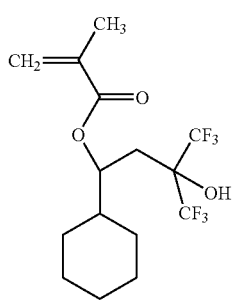

D 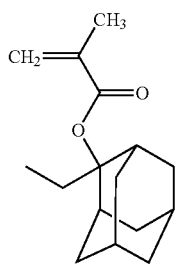

E 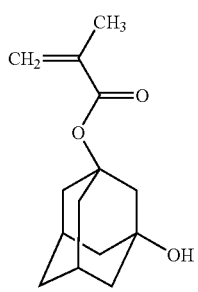

F 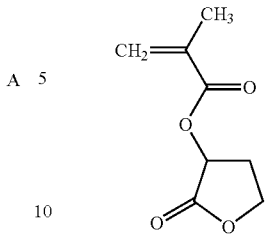

Resin Synthesis Example 1

Synthesis of Resin A1

Into a four-necked flask equipped with a thermometer and a reflux condenser, 70.91 parts of methyl isobutyl ketone was charged and a nitrogen gas was blown into it for 30 minutes. Under a nitrogen gas atmosphere, a mixture obtained by mixing 30 parts of monomer E, 14.27 parts of monomer F, 10.28 parts of monomer G, 0.79 part of 2,2'-azobisisobutyronitrile and 70.19 parts of methyl isobutyl ketone (monomer ratio; monomer E: monomer F: monomer G=50:25:25) was added dropwise thereto over 1 hour at 86° C. The resultant mixture was heated at 86° C. for about 5 hours. The reaction mixture was cooled and poured into 815 parts of n-heptane with stirring. The precipitated resin was isolated by filtration and washed three times with 407 parts of n-heptane. The resin obtained was dried under reduced pressure to obtain 25.4 parts of the resin having a weight-average molecular weight (Mw) of 9,400 in a yield of 55%. The ratio of weight-average molecular weight and number-average molecular weight (Mw/Mn) was 1.52.

This resin had the following structural units. This is called as resin A1.

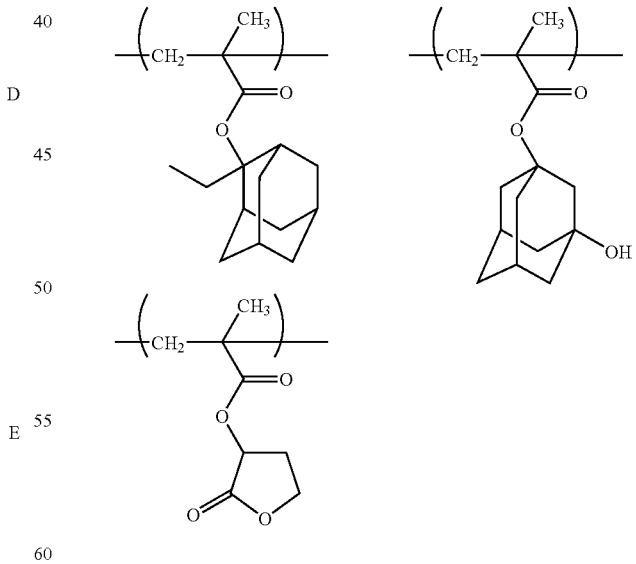

Resin Synthesis Example 2

Synthesis of Resin B1

Into a four-necked flask equipped with a thermometer and a reflux condenser, 23 parts of 1,4-dioxane was charged and a nitrogen gas was blown into it for 30 minutes. Under a nitrogen gas atmosphere, a mixture obtained by mixing 6.2 part of monomer A, 12.97 parts of monomer B, 19.17 parts of monomer C, 0.21 part of 2,2'-azobisisobutyronitrile, 0.97 part of 2,2'-azobis(2,4-dimethylvaleronitrile) and 34.51 parts of 1,4-dioxane (monomer ratio; monomer A: monomer B: monomer C=25:25:50) was added dropwise thereto over 1 hour at 75° C. The resultant mixture was heated at 75° C. for about 5 hours. The reaction mixture was cooled and diluted with 42.18 parts of 1,4-dioxane. The obtained solution was poured into a mixture of 349 parts of methanol and 224 parts of ion-exchange water with stirring. The precipitated resin was isolated by filtration and washed three times with a mixture of 224 parts of methanol and 25 parts of ion-exchange water. The resin obtained was dried under reduced pressure to obtain 23.1 parts of the resin having a weight-average molecular weight (Mw) of 8,530 in a yield of 60%. The ratio of weight-average molecular weight and number-average molecular weight (Mw/Mn) was 1.74.

This resin had the following structural units. This is called as resin B1.

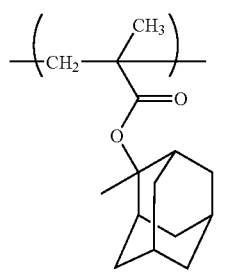
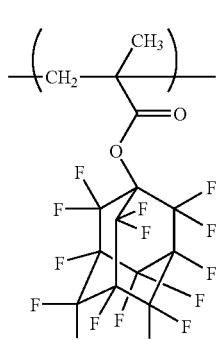
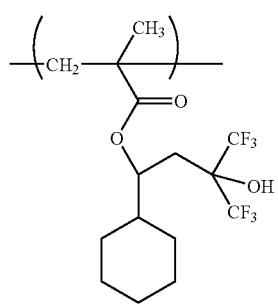

<Acid Generator>

Acid generator P1:

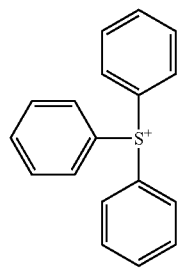
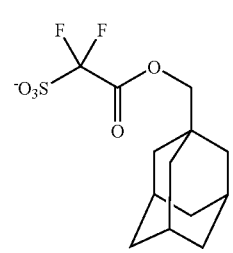

<Quencher>

Quencher Q1: 2,6-diisopropylaniline

<Solvent>

| Solvent S1: | propylene glycol monomethyl ether acetate | 100 parts |
| | propylene glycol monomethyl ether | 20.0 parts |
| | 2-heptanone | 35.0 parts |
| | γ-butyrolactone | 3.5 parts |

Examples 1 to 7, Comparative Examples 1 and Reference Example 1

The following components were mixed to give a solution, and the solution was further filtrated through a fluorine resin filter having a pore diameter of 0.2 μm, to prepare resist liquid.

Resins (kind and amount are described in Table 1)
Acid generator (kind and amount are described in Table 1)
Quencher (kind and amount are described in Table 1)
Solvent (kind are described in Table 1)

The resist liquids prepared in Examples 1 to 7 are respectively called as resists R1 to R7, the resist liquids prepared in Comparative Examples 1 is called as resist C1, and the resist liquids prepared in Reference Examples 1 is called as resists R10.

TABLE 1

| Ex. No. | Resin A (kind/amount (part)) | Resin B (kind/amount (part)) | Acid generator (kind/amount (part)) | Quencher (kind/amount (part)) | Solvent |
|---|---|---|---|---|---|
| Ex. 1 | A1/10 | B1/0.1 | P1/0.4 | Q1/0.015 | S1 |
| Ex. 2 | A1/10 | B1/0.07 | P1/0.4 | Q1/0.015 | S1 |
| Ex. 3 | A1/10 | B1/0.05 | P1/0.4 | Q1/0.015 | S1 |
| Ex. 4 | A1/10 | B1/0.03 | P1/0.4 | Q1/0.015 | S1 |
| Ex. 5 | A1/10 | B1/0.01 | P1/0.4 | Q1/0.015 | S1 |
| Ex. 6 | A1/10 | B1/0.001 | P1/0.4 | Q1/0.015 | S1 |
| Ex. 7 | A1/10 | B1/0.0005 | P1/0.4 | Q1/0.015 | S1 |
| Comp. Ex. 1 | A1/10 | B1/0.5 | P1/0.4 | Q1/0.015 | S1 |
| Ref. Ex. 1 | A1/10 | None | P1/0.4 | Q1/0.015 | S1 |

Each of the resist liquids prepared in Examples 1 to 3, Comparative Example 1 and Reference Example 1 was spin-coated over the anti-reflective coating to give a film thickness after drying of 0.12 μm. After application of each of the resist liquids, the silicon wafers thus coated with the respective resist liquids were each prebaked on a direct hotplate at 100° C. for 60 seconds.

Each contact angle and receding contact angle of the wafer was measured using "Drop Master-700" manufactured by Kyowa Interface Science Co., LTD. The contact angle was measured after 0.1 second after dropping using 1 μl water by droplet method and the receding contact angle was measured using 50 μl water by sliding method with a stepwise decant mode. The results of which are shown in Table 2.

TABLE 2

| Ex. No. | Resist liquid | Receding contact angle (°) | Contact angle (°) |
|---|---|---|---|
| Ex. 1 | R1 | 75 | 89 |
| Ex. 2 | R2 | 71 | 87 |

TABLE 2-continued

| Ex. No. | Resist liquid | Receding contact angle (°) | Contact angle (°) |
|---|---|---|---|
| Ex. 3 | R3 | 66 | 84 |
| Ex. 4 | R4 | 62 | 78 |
| Ex. 5 | R5 | 56 | 73 |
| Ex. 6 | R6 | 56 | 73 |
| Ex. 7 | R7 | 55 | 72 |
| Comp. Ex. 1 | C1 | 92 | 101 |
| Ref. Ex. 1 | R10 | 55 | 72 |

Silicon wafers were each coated with "ARC-95", which is an organic anti-reflective coating composition available from Nissan Chemical Industries, Ltd., and then baked under the conditions: 205° C. and 60 seconds, to form a 780 Å-thick organic anti-reflective coating. Each of the resist liquids prepared in Examples 1 to 3, Comparative Example 1 and Reference Example 1 was spin-coated over the anti-reflective coating to give a film thickness after drying of 0.12 μm. After application of each of the resist liquids, the silicon wafers thus coated with the respective resist liquids were each prebaked on a direct hotplate at 100° C. for 60 seconds. Using an ArF excimer stepper ("FPA5000-AS3" manufactured by CANON INC., NA=0.75), each wafer on which the respective resist film had been thus formed was exposed to a line and space pattern, while changing stepwise the exposure quantity.

After the exposure, each wafer was subjected to post-exposure baking on a hotplate at 110° C. for 60 seconds and then to paddle development with an aqueous solution of 2.38% by weight tetramethylammonium hydroxide.

Each of pattern developed on the organic anti-reflective coating substrate after the development was observed with a scanning electron microscope, and the results of which are shown in Table 3.

Line Width Roughness (LWR): The size of space pattern developed on the organic anti-reflective coating substrate after the development was observed with a scanning electron microscope. when the variability in the size is smaller than that of Comparative Example 1, its evaluation is marked by "○", when the variability in the size is as same as that of Comparative Example 1, its evaluation is marked by "Δ", and when the variability in the size is bigger than that of Comparative Example 1, its evaluation is marked by "X".

TABLE 3

| Ex. No. | LWR |
|---|---|
| Ex. 1 | ○ |
| Ex. 5 | ○ |
| Ex. 6 | ○ |
| Ex. 7 | ○ |
| Comp. Ex. 1 | — |

The present resist composition provides excellent resist pattern in LWR and having good solubility in a developing solution, and it is suitable for optical lithography such as ArF excimer laser lithography. The resist film having higher receding contact angle can be formed on the substrate by using the present resist composition to suppress the formation of defect in liquid immersion lithography process and the present composition is especially suitable for liquid immersion lithography process.

What is claimed is:

1. A chemically amplified positive resist composition comprising:
a resin (A) which contains no fluorine atom and a structural unit (a1) having an acid-labile group in a side chain, a resin (B) which contains a structural unit (b2) having a fluorine-containing group in a side chain and at least one structural unit selected from the group consisting of a structural unit (b1) having an acid-labile group, a structural unit (b3) having a hydroxyl group and a structural unit (b4) having a lactone structure in a side chain, and an acid generator, wherein the amount of the resin (B) is 0.005 part by weight or more and 1 parts by weight or less per 100 parts by weight of the resin (A).

2. The chemically amplified positive resist composition according to claim 1, wherein the amount of the resin (B) is 0.01 part by weight or more and 1 parts by weight or less per 100 parts by weight of the resin (A).

3. The chemically amplified positive resist composition according to claim 1, wherein the resin (A) contains at least one structural unit selected from the group consisting of a structural unit (a3) having a hydroxyl group and a structural unit (a4) having a lactone structure in addition to the structural unit (a1).

4. The chemically amplified positive resist composition according to claim 3, wherein the resin (A) contains the structural unit (a3) and the structural unit (a4) in addition to the structural unit (a1).

5. The chemically amplified positive resist composition according to claim 1, wherein the resin (B) contains the structural unit (b1) in addition to the structural unit (b2).

6. The chemically amplified positive resist composition according to claim 1, wherein the structural units (a1) and (b1) independently represent a structural unit represented by the formula (Ia):

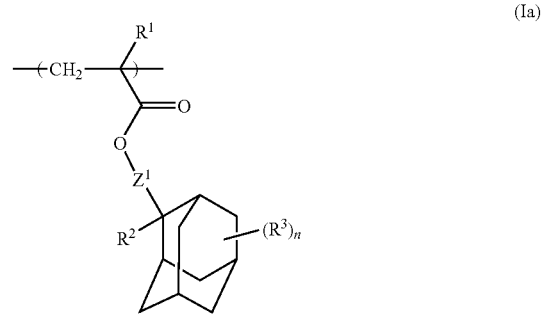

(Ia)

wherein $R^1$ represents a hydrogen atom or a methyl group, $R^2$ represents a C1-C8 alkyl group, $R^3$ represents a methyl group, n represents an integer of 0 to 14, $Z^1$ represents a single bond or a —$(CH_2)_k$—COO— group, and k represents an integer of 1 to 4, or a structural unit represented by the formula (Ib):

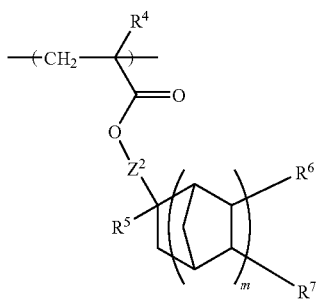

(Ib)

wherein $R^4$ represents a hydrogen atom or a methyl group, $R^5$ represents a C1-C8 alkyl group, $R^6$ and $R^7$ each independently represents a hydrogen atom or a monovalent C1-C8 hydrocarbon group which may contain at least one heteroatom, $R^6$ and $R^7$ may be bonded to each other to form a ring together with the carbon atom to which $R^6$ is bonded and the carbon atom to which $R^7$ is bonded, or $R^6$ and $R^7$ may be bonded to each other to form a double bond between the carbon atom to which $R^6$ is bonded and the carbon atom to which $R^7$ is bonded, m represents an integer of 1 to 3, $Z^2$ represents a single bond or a —$(CH_2)_{k'}$—COO— group, and k' represents an integer of 1 to 4.

7. The chemically amplified positive resist composition according to claim 1, wherein the structural unit (b3) represents a structural unit represented by the formula (IIb):

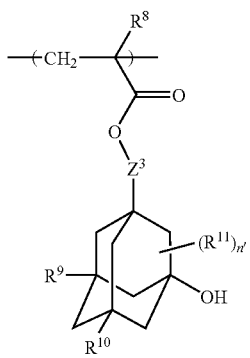

(IIb)

wherein $R^8$ represents a hydrogen atom or a methyl group, $R^9$ and $R^{10}$ each independently represents a hydrogen atom, a methyl group or a hydroxyl group, $R^{11}$ represents a methyl group, n' represents an integer of 0 to 12, $Z^3$ represents a single bond or a —$(CH_2)_q$—COO— group, and q represents an integer of 1 to 4.

8. The chemically amplified positive resist composition according to claim 3, wherein the structural unit (a3) represents a structural unit represented by the formula (IIa):

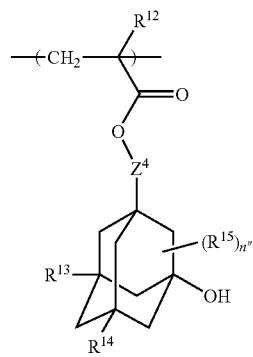

(IIa)

wherein $R^{12}$ represents a hydrogen atom or a methyl group, $R^{13}$ and $R^{14}$ each independently represents a hydrogen atom, a methyl group or a hydroxyl group, $R^{15}$ represents a methyl group, n" represents an integer of 0 to 12, $Z^4$ represents a single bond or a —$(CH_2)_{q'}$—COO— group, and q' represents an integer of 1 to 4.

9. The chemically amplified positive resist composition according to claim 1, wherein the structural unit (b4) represents a structural unit represented by the formula (IIIa), (IIIb), (IIIc), (IIId), (IIIe) or (IIIf):

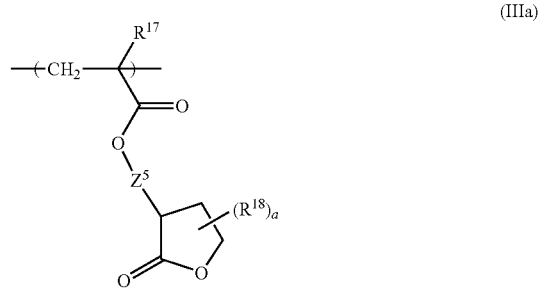

(IIIa)

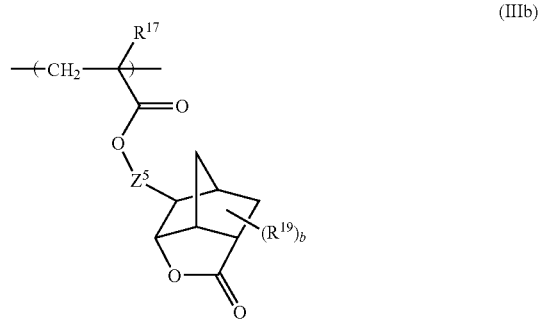

(IIIb)

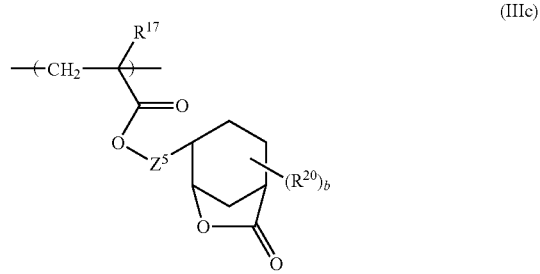

(IIIc)

(IIId)
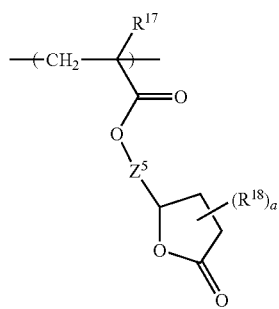

(IIIe)
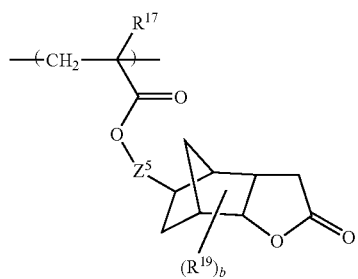

(IIIf)
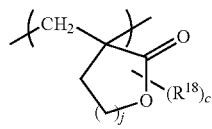

wherein $R^{17}$ represents a hydrogen atom or a methyl group, $R^{18}$ represents a methyl group, $R^{19}$ is independently in each occurrence a carboxyl group, a cyano group or a C1-C4 hydrocarbon group, $R^{20}$ is independently in each occurrence a carboxyl group, a cyano group or a C1-C4 hydrocarbon group, j represents an integer of 0 to 3, a represents an integer of 0 to 5, b represents an integer of 0 to 3, c represents an integer of 0 to (2j+2), $Z^5$ represents a single bond or a —$(CH_2)_{q'}$—COO— group, and q" represents an integer of 1 to 4.

10. The chemically amplified positive resist composition according to claim 3, wherein the structural unit (a4) represents a structural unit represented by the formula (IIIg), (IIIh), (IIIi), (IIIj), (IIIk) or (IIIl):

(IIIg)
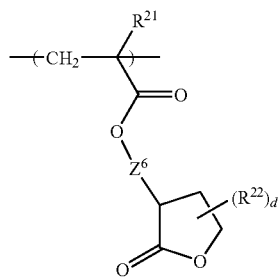

(IIIh)
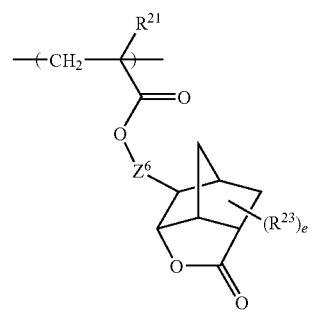

(IIIi)
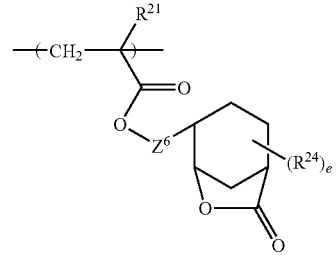

(IIIj)
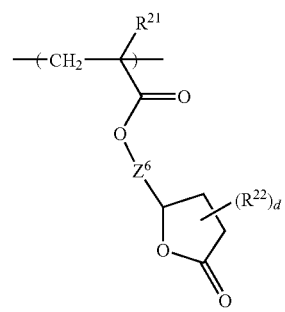

(IIIk)
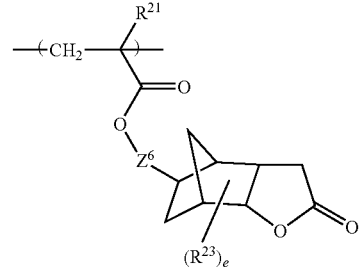

(IIIl)
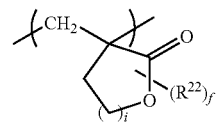

wherein $R^{21}$ represents a hydrogen atom or a methyl group, $R^{22}$ represents a methyl group, $R^{23}$ is independently in each occurrence a carboxyl group, a cyano group or a C1-C4 hydrocarbon group, $R^{24}$ is independently in each occurrence a carboxyl group, a cyano group or a C1-C4 hydrocarbon group, i represents an integer of 0 to 3, d represents an integer of 0 to 5, e represents an integer of 0 to 3, f represents an integer of 0 to (2i+2), $Z^6$ represents a single bond or a —$(CH_2)_{q'''}$—COO— group, and q''' represents an integer of 1 to 4.

11. The chemically amplified positive resist composition according to claim 1, wherein the structural unit (b2) represents a structural unit represented by the formula (IV):

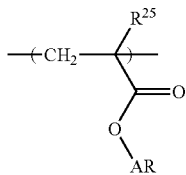

(IV)

wherein $R^{25}$ represents a hydrogen atom or a methyl group, and AR represents a C1-C30 fluorine-containing alkyl group which may contain one to five hydroxyl groups and at least one heteroatom selected from the group consisting of a oxygen atom, a nitrogen atom and a sulfur atom.

12. The chemically amplified positive resist composition according to claim 1, wherein the acid generator is a salt represented by the formula (V):

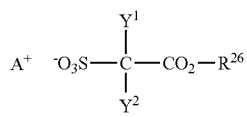

(V)

wherein $R^{26}$ represents a C1-C6 linear or branched chain hydrocarbon group or a C3-C30 monocyclic or bicyclic hydrocarbon group, and at least one hydrogen atom in the monocyclic or bicyclic hydrocarbon group may be replaced with a C1-C6 alkoxy group, a C1-C4 perfluoroalkyl group, a C1-C6 hydroxyalkyl group, a hydroxyl group, a cyano group, a carbonyl group or an ester group, or at least one —$CH_2$— in the monocyclic or bicyclic hydrocarbon group may be replaced with —CO— or —O—; $A^+$ represents an organic counter ion; $Y^1$ and $Y^2$ each independently represents a fluorine atom or a C1-C6 perfluoroalkyl group.

13. The chemically amplified positive resist composition according to claim 12, wherein $R^{26}$ is a C3-C30 monocyclic or polycyclic hydrocarbon group having a hydroxyl group or a carbonyl group, and at least one hydrogen atom in the monocyclic or polycyclic hydrocarbon group may be replaced with a C1-C6 alkyl group, a C1-C6 alkoxy group, a C1-C4 perfluoroalkyl group, a C1-C6 hydroxyalkyl group, a hydroxyl group or a cyano group.

* * * * *